(12) United States Patent  (10) Patent No.: US 9,019,747 B2
Tsuji  (45) Date of Patent: Apr. 28, 2015

(54) NONVOLATILE SEMICONDUCTOR MEMORY DEVICE AND WRITE METHOD FOR THE SAME

(71) Applicant: Panasonic Corporation, Osaka (JP)

(72) Inventor: Kiyotaka Tsuji, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/990,660

(22) PCT Filed: Nov. 19, 2012

(86) PCT No.: PCT/JP2012/007423
§ 371 (c)(1),
(2) Date: May 30, 2013

(87) PCT Pub. No.: WO2013/080483
PCT Pub. Date: Jun. 6, 2013

(65) Prior Publication Data
US 2014/0112056 A1  Apr. 24, 2014

(30) Foreign Application Priority Data
Dec. 1, 2011  (JP) .................. 2011-263838

(51) Int. Cl.
G11C 13/00  (2006.01)
G11C 8/08  (2006.01)

(52) U.S. Cl.
CPC ........ *G11C 13/0002* (2013.01); *G11C 13/0004* (2013.01); *G11C 13/0007* (2013.01); *G11C 13/0069* (2013.01); *G11C 13/0038* (2013.01); *G11C 8/08* (2013.01); *G11C 2213/15* (2013.01); *G11C 2213/77* (2013.01)

(58) Field of Classification Search
None
See application file for complete search history.

(56) References Cited

U.S. PATENT DOCUMENTS

| | | | |
|---|---|---|---|
| 6,343,039 B2 * | 1/2002 | Agawa et al. | 365/203 |
| 6,850,430 B1 | 2/2005 | Perner | |
| 6,885,579 B2 | 4/2005 | Sakimura et al. | |
| 7,209,379 B2 | 4/2007 | Mori et al. | |
| 7,248,494 B2 | 7/2007 | Oh et al. | |
| 2001/0007537 A1 | 7/2001 | Agawa et al. | |
| 2004/0004856 A1 | 1/2004 | Sakimura et al. | |
| 2006/0050548 A1 | 3/2006 | Oh et al. | |
| 2006/0067106 A1 | 3/2006 | Mori et al. | |
| 2010/0321978 A1 | 12/2010 | Inoue | |
| 2011/0228587 A1 | 9/2011 | Ito | |

FOREIGN PATENT DOCUMENTS

| | | |
|---|---|---|
| JP | 2001-195885 | 7/2001 |
| JP | 2004-39150 | 2/2004 |

(Continued)

OTHER PUBLICATIONS

International Search Report issued Jan. 8, 2013 in corresponding International Application No. PCT/JP2012/007423.

*Primary Examiner* — James G Norman
(74) *Attorney, Agent, or Firm* — Wenderoth, Lind & Ponack, L.L.P.

(57) ABSTRACT

A nonvolatile semiconductor memory device includes word lines, bit lines, a cross-point cell array including cells, each of which includes memory cells and at least one offset detection cell, a word line selection circuit, a bit line selection circuit, a write control circuit, a current sensing circuit which detects a current and converts it into an electrical signal, wherein a write control circuit adjusts a write electrical signal for causing a second write current higher than a first write current to flow through the memory cell.

25 Claims, 22 Drawing Sheets

(56) References Cited

FOREIGN PATENT DOCUMENTS

| JP | 2005-166249 | 6/2005 |
| JP | 2006-79812 | 3/2006 |
| JP | 2006-99882 | 4/2006 |
| JP | 2009-140593 | 6/2009 |
| JP | 2011-198407 | 10/2011 |

\* cited by examiner (a)

(b)

(a)

(b)

(c)

(d)

NONVOLATILE SEMICONDUCTOR MEMORY DEVICE AND WRITE METHOD FOR THE SAME

TECHNICAL FIELD

The present invention relates to a cross-point nonvolatile semiconductor memory device including variable resistance memory elements, and particularly relates to a cell array structure which improves reliability of a write operation and to a write method thereof.

BACKGROUND ART

Along with the development of digital technology, recent years have seen a further increase in functionality of electronic devices such as mobile information devices and information home appliances. Accordingly, there is an increasing demand for a nonvolatile memory device with a higher capacity, lower power consumption for writing, a higher speed of write/write time, and a longer product lifespan.

In response to such a demand, for example, research and development of a nonvolatile semiconductor memory device which includes a memory element configured using what is called a variable resistance memory element is under way. The variable resistance memory element indicates an element which has a resistance value changing according to electrical signals, has properties of keeping the resistance value even when the electrical signals are no longer supplied (that is, keeping the resistance value in a nonvolatile manner), and is capable of storing data using a change in this resistance value.

Representative examples of the variable resistance memory element include a magnetic random access memory (MRAM), a phase change random access memory (PRAM), a resistance random access memory (ReRAM; a variable resistance element), and a spin transfer torque random access memory (SPRAM).

As an example of the structures of the nonvolatile memory devices which include these variable resistance memory elements, a cross-point structure is known. In the cross-point structure, the memory cells are arranged in an array (which is hereinafter referred to as a cross-point cell array). More specifically, memory cells are arranged each of which is located at a cross-point between a bit line and a word line that are perpendicular to each other; the memory cell is located between the bit line and the word line.

In the cross-point structure, to change (write) a resistance value of a memory element included in a target memory cell, a voltage is applied to a corresponding set of the bit line and the word line, which not only causes a current corresponding to the voltage applied to the memory cell to flow through the write target memory cell, but also causes a current (sneak current) to flow through the write target memory cell via the other unselected memory cells which are connected in series or in parallel to the selected memory cell that is the target memory cell. Since the sneak current changes a current necessary to change resistance of a memory element included in the write target memory cell, the sneak current impairs a reliable operation of write (resistance change operation) in the nonvolatile semiconductor memory device.

Patent Literature 1 discloses a method for compensating a voltage drop in the memory cell to stabilize a write operation of a cross-point cell array.

CITATION LIST

Patent Literature

[PTL 1]
Patent Literature 1: Japanese Unexamined Patent Application Publication No. 2009-140593

SUMMARY OF INVENTION

Technical Problem

However, since in the semiconductor memory device disclosed in Patent Literature 1, a memory cell is composed of a series connection of a variable resistance element and a unidirectional diode, the direction of a current caused to flow in the memory cell is limited only to a direction in which the diode is biased in a forward direction. Therefore, the technique cannot be applied when a memory cell uses a bipolar-type variable resistance element in which (i) the direction of a current caused to flow through the variable resistance element when the resistance of the variable resistance element is changed from a low resistance state (LR state) to a high resistance state (HR state) and (ii) the direction of a current caused to flow through the variable resistance element when the resistance of the variable resistance element is changed from an HR state to an LR state are different.

Furthermore, in the above described semiconductor memory device, an object is to realize a constant voltage to be applied to a memory cell during a write operation. As described later, when a constant current value to flow during a write operation is desirable for stabilizing variable resistance characteristics, the technique cannot be applied because the current value cannot be constant by making the voltage constant.

In view of the above described problems, the present invention has an object to provide a highly reliable semiconductor memory device, even when it is a cross-point nonvolatile semiconductor memory device and there is a sneak current, by reducing an influence of the sneak current on the write operation and by stabilizing a resistance change operation in a memory element included in a memory cell, as well as to provide a write method for the cross-point nonvolatile semiconductor memory device.

Solution to Problem

In order to achieve the above mentioned goal, a nonvolatile semiconductor memory device according to an aspect of the present invention comprises: word lines formed in parallel in a first plane; bit lines formed in parallel in a second plane and three-dimensionally crossing the word lines, the second plane being parallel to the first plane; a cross-point cell array including cells each provided at a corresponding one of three-dimensional cross-points of the word lines and the bit lines; a word line selection circuit that selects a particular one of the word lines; a bit line selection circuit that selects a particular one of the bit lines; a write control circuit that is connected to the word lines via the word line selection circuit or to the bit lines via the bit line selection circuit and outputs a write electrical signal to the word line selected by the word line selection circuit or to the bit line selected by the bit line selection circuit; and a current sensing circuit that is connected to the bit lines via the bit line selection circuit or to the word lines via the word line selection circuit, the current sensing circuit detecting a current flowing through the bit line selected by the bit line selection circuit or the word line selected by the word line selection circuit and converting the current into an electrical signal that corresponds to a magnitude of the current, wherein the cells include: a memory cell including a memory element that operates as a memory by reversibly changing in resistance value between at least two states based on an electrical signal applied between a corresponding one of the word lines and a corresponding one of the bit lines; and an offset current detection cell having a resistance value that is, irrespective of the electrical signal applied between the corresponding one of the word lines and the corresponding one of the bit lines, higher than the resistance value of the memory element in a high resistance state in which the memory element operates as the memory, and wherein when (i) a current flowing when writing predetermined data into the memory cell by applying a first voltage having a predetermined polarity and a predetermined amplitude between the word line and the bit line connected to the memory cell is a first write current and (ii) a current flowing when the first voltage is applied between the word line and the bit line that are connected to the offset current detection cell is a sneak current, the write control circuit adjusts the write electrical signal for causing a second write current higher than the first write current to flow through the memory cell.

Moreover, a write method for a nonvolatile semiconductor memory device according to an aspect of the present invention comprises: a process A of selecting a word line connected to the offset current detection cell and a bit line connected to the offset current detection cell; a process B of applying a constant voltage between the selected word line and the selected bit line, detecting a sneak current flowing out from the bit line or the word line by a current sensing circuit, and converting the detected sneak current into an offset electrical signal that is an electrical signal that corresponds to a magnitude of the sneak current by a write control circuit; a process C of storing the offset electrical signal in an offset current value holding circuit; a process D of outputting, to the write control circuit, a write electrical signal generated according to the offset electrical signal; and a process E of adjusting the write electrical signal according to the offset electrical signal for allowing a first write current to flow through the memory cell when the sneak current is a first current, and for allowing a second write current higher than the first write current to flow through the memory cell when the sneak current is a second current higher than the first current.

A write method for a nonvolatile semiconductor memory device according to an aspect of the present invention comprises: a process F of selecting a first word line connected to a write target memory cell, and a first bit line connected to a first offset current detection cell provided at the first word line; a process G of applying a constant voltage between the selected first word line and the selected first bit line, detecting a first sneak current flowing out from the selected first word line or the selected first bit line by a current sensing circuit A, and converting, by a write control circuit A, the detected first sneak current into a first offset electrical signal that is an electrical signal that corresponds to a magnitude of the first sneak current; a process H of storing the first offset electrical signal in a first offset current value holding circuit; a process I of selecting a second bit line connected to the write target memory cell, and a second word line connected to a second offset current detection cell provided at the second bit line; a process 3 of applying, between the selected second word line and the selected second bit line, a voltage same as the voltage applied between the first word line and the first bit line selected in the process G, detecting, by a current sensing circuit A, a second sneak current flowing out from the second word line or the second bit line, and converting, by a write control circuit B, the detected second sneak current into a second offset electrical signal that is an electrical signal that corresponds to a magnitude of the second sneak current; a process K of storing the second offset electrical signal in a second offset current value holding circuit; a process L of generating, by referring to the first offset electrical signal and the second offset electrical signal, an average offset electrical signal that corresponds to an average of the first offset electrical signal stored in the first offset current value holding circuit and the second offset electrical signal stored in the second offset current value holding circuit; and a process M of adjusting the first write electrical signal according to the average offset electrical signal.

Advantageous Effects of Invention

The cross-point nonvolatile semiconductor memory device including the variable resistance memory element according to the present invention is capable of reducing the problem for the cross-point circuit that a current flowing through a memory cell during a write operation is not constant due to an influence of sneak current and therefore the write operation becomes unstable. With this, an effect of improving the stability of write operation can be obtained.

Figure 2:
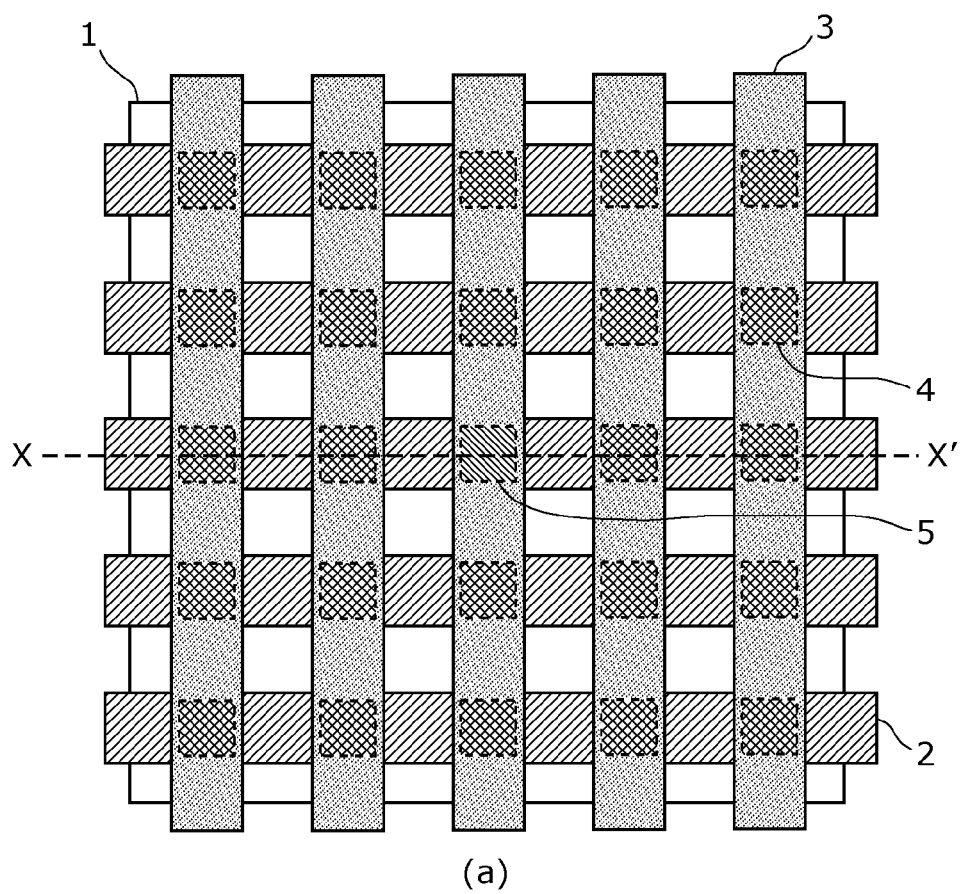
Figure 2:
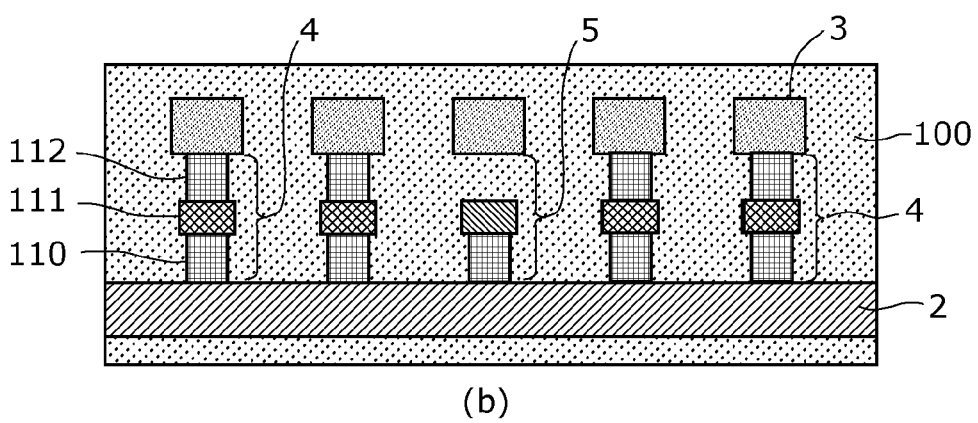

(a) in FIG. 2 is a plan view showing details of structures of a cross-point cell array, word lines, and bit lines, of the nonvolatile semiconductor memory device according to Embodiment 1 of the present invention, and (b) in FIG. 2 is a cross-sectional view showing a structure of a cross-section taken along X-X' of (a) in FIG. 2.

Figure 3:
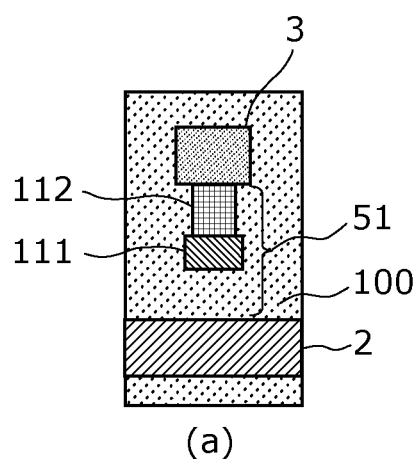
Figure 3:
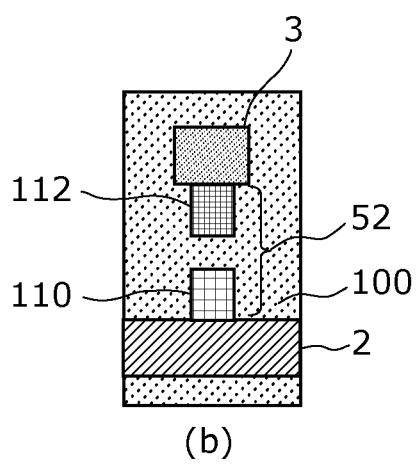
Figure 3:
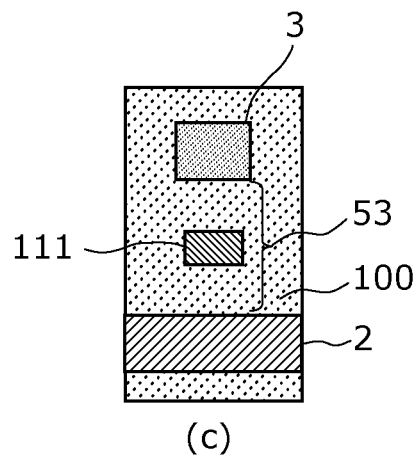
Figure 3:
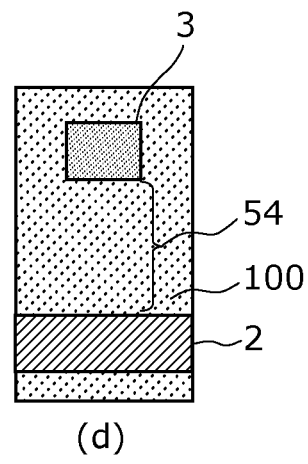

FIG. 3 is a cross-sectional view for explaining other configuring methods for an offset current detection cell in an implementation of the present invention.

Figure 4:
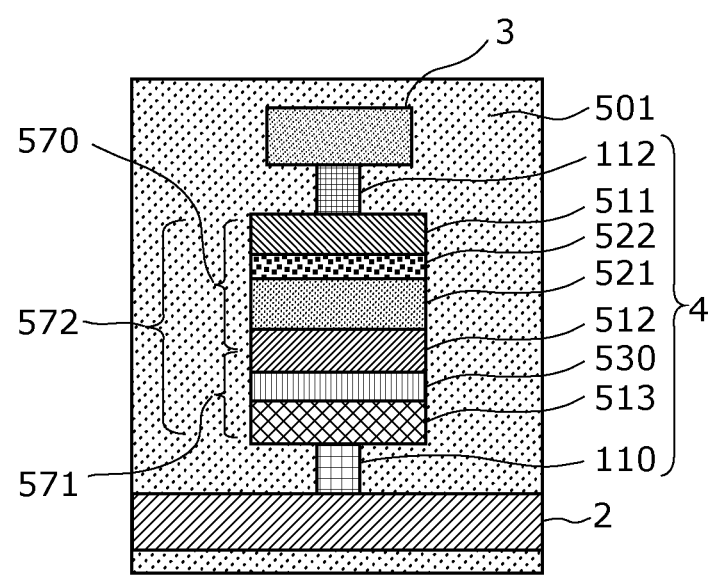

FIG. 4 is a cross-sectional view of a memory cell in an implementation of the present invention which is composed of ReRAM and an MSM diode.

Figure 5:
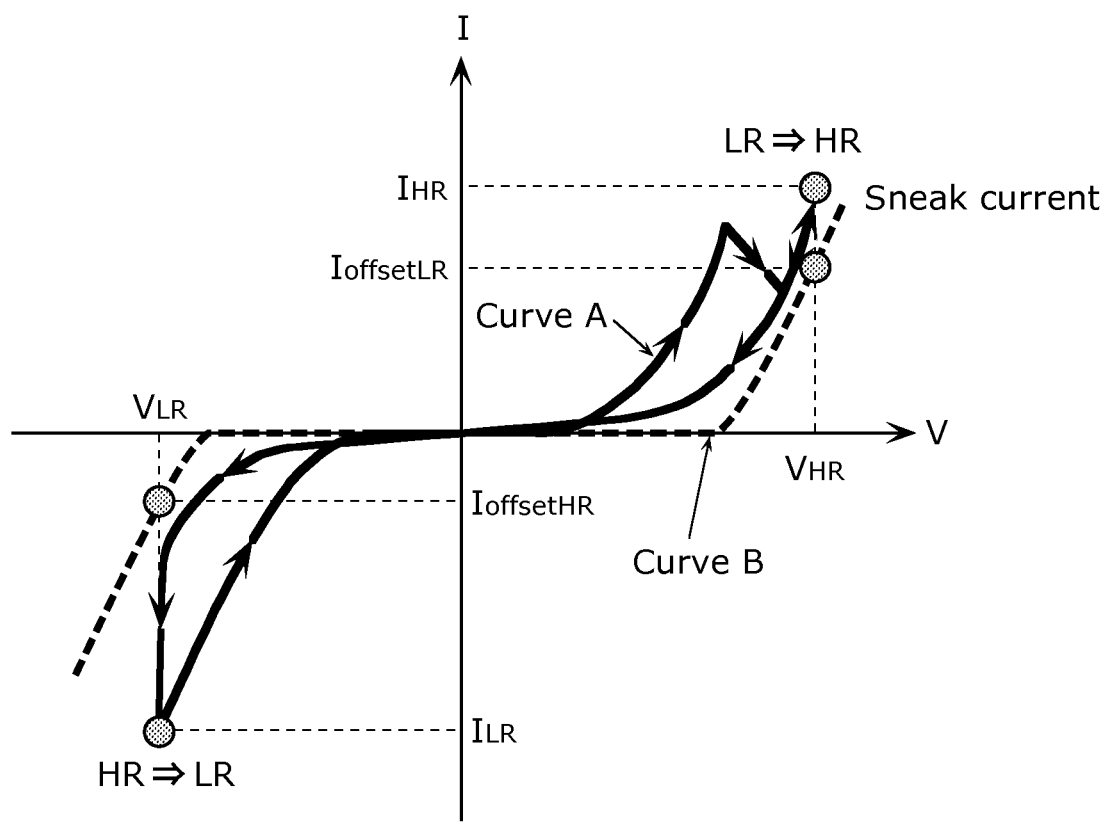

FIG. 5 is a diagram showing a voltage-current property of a memory cell according to the present invention.

Figure 6:
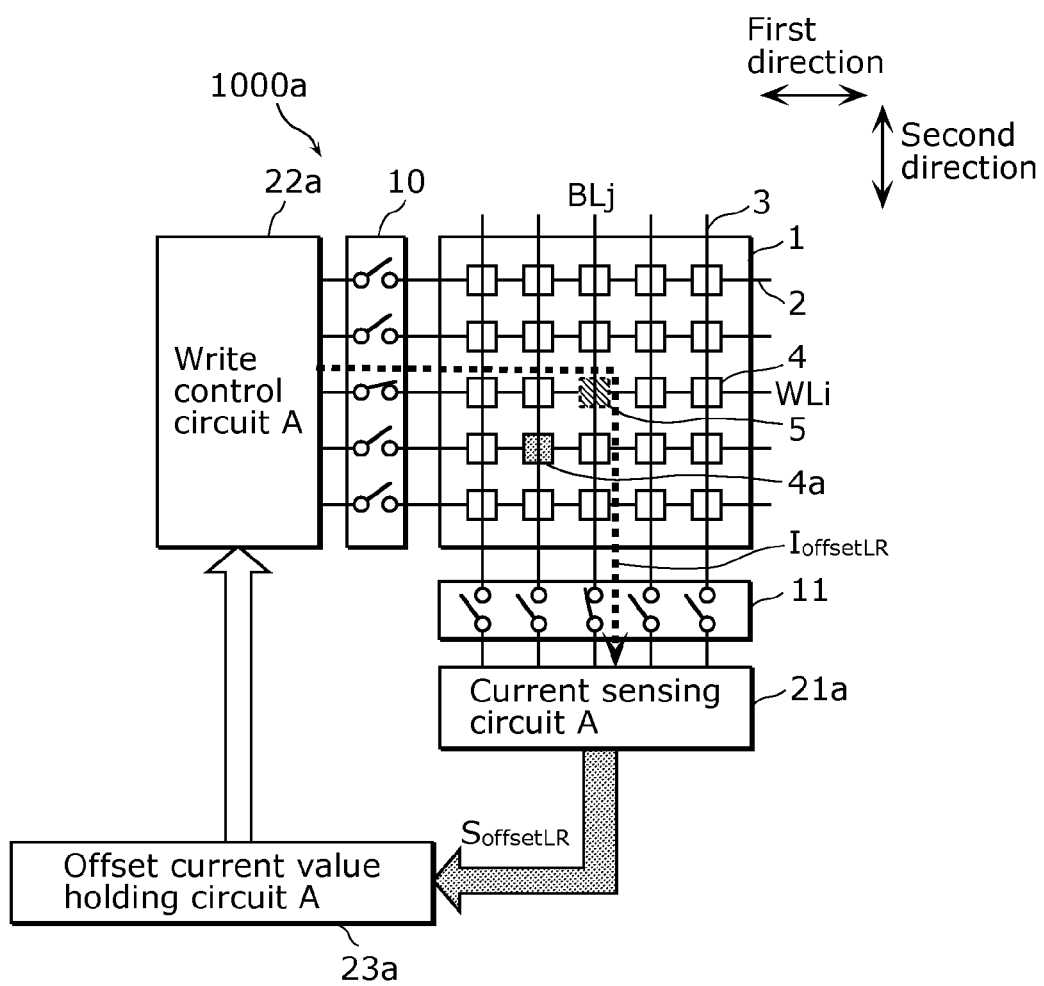

FIG. 6 is a diagram for explaining the write method for writing a low resistance state into the nonvolatile semiconductor memory device according to Embodiment 1 of the present invention.

Figure 7:
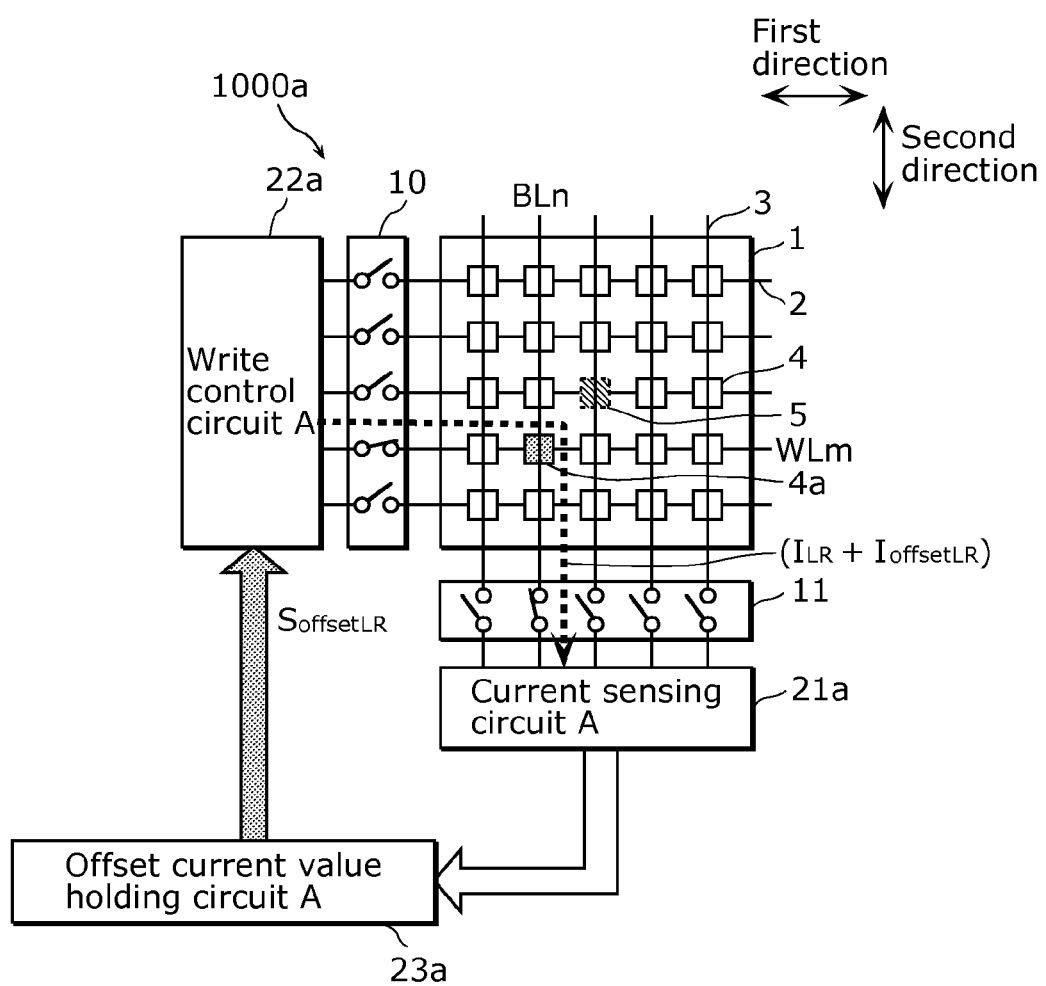

FIG. 7 is a diagram for explaining the write method (sequel) for writing a low resistance state into the nonvolatile semiconductor memory device according to Embodiment 1 of the present invention.

Figure 8:
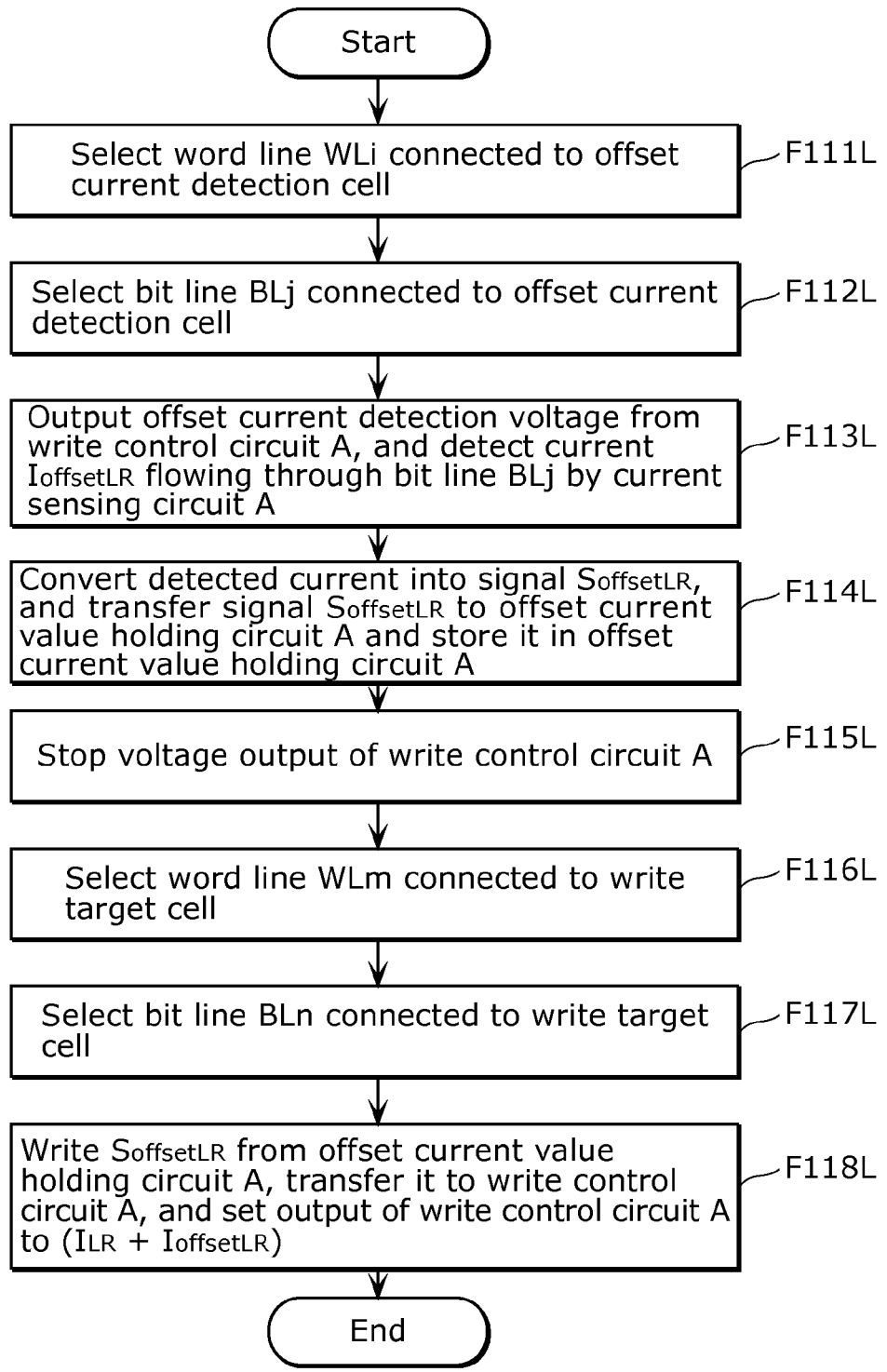

FIG. 8 is a write flowchart for writing a low resistance state into the nonvolatile semiconductor memory device according to Embodiment 1 of the present invention.

Figure 9:
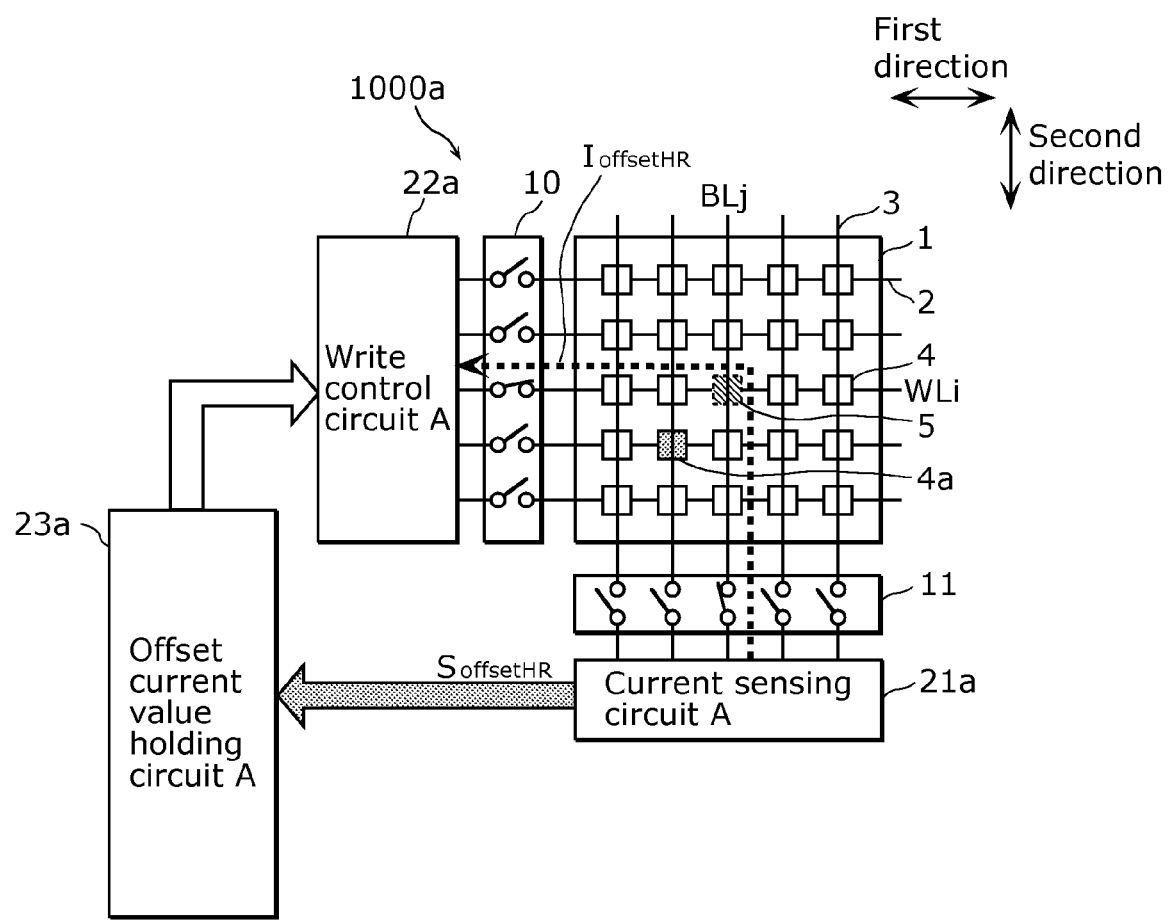

FIG. 9 is a diagram for explaining the write method for writing a high resistance state into the nonvolatile semiconductor memory device according to Embodiment 1 of the present invention.

Figure 10:
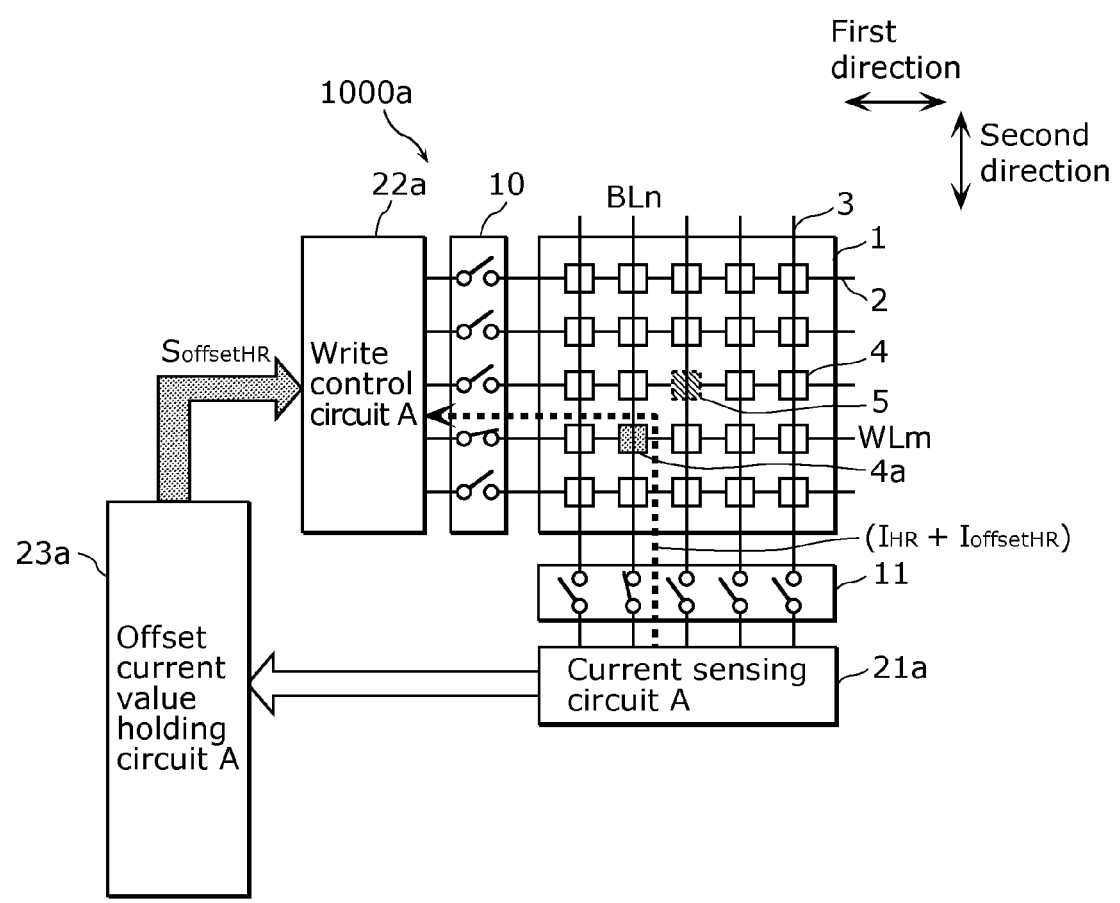

FIG. 10 is a diagram for explaining the write method (sequel) for writing a high resistance state into the nonvolatile semiconductor memory device according to Embodiment 1 of the present invention.

Figure 11:
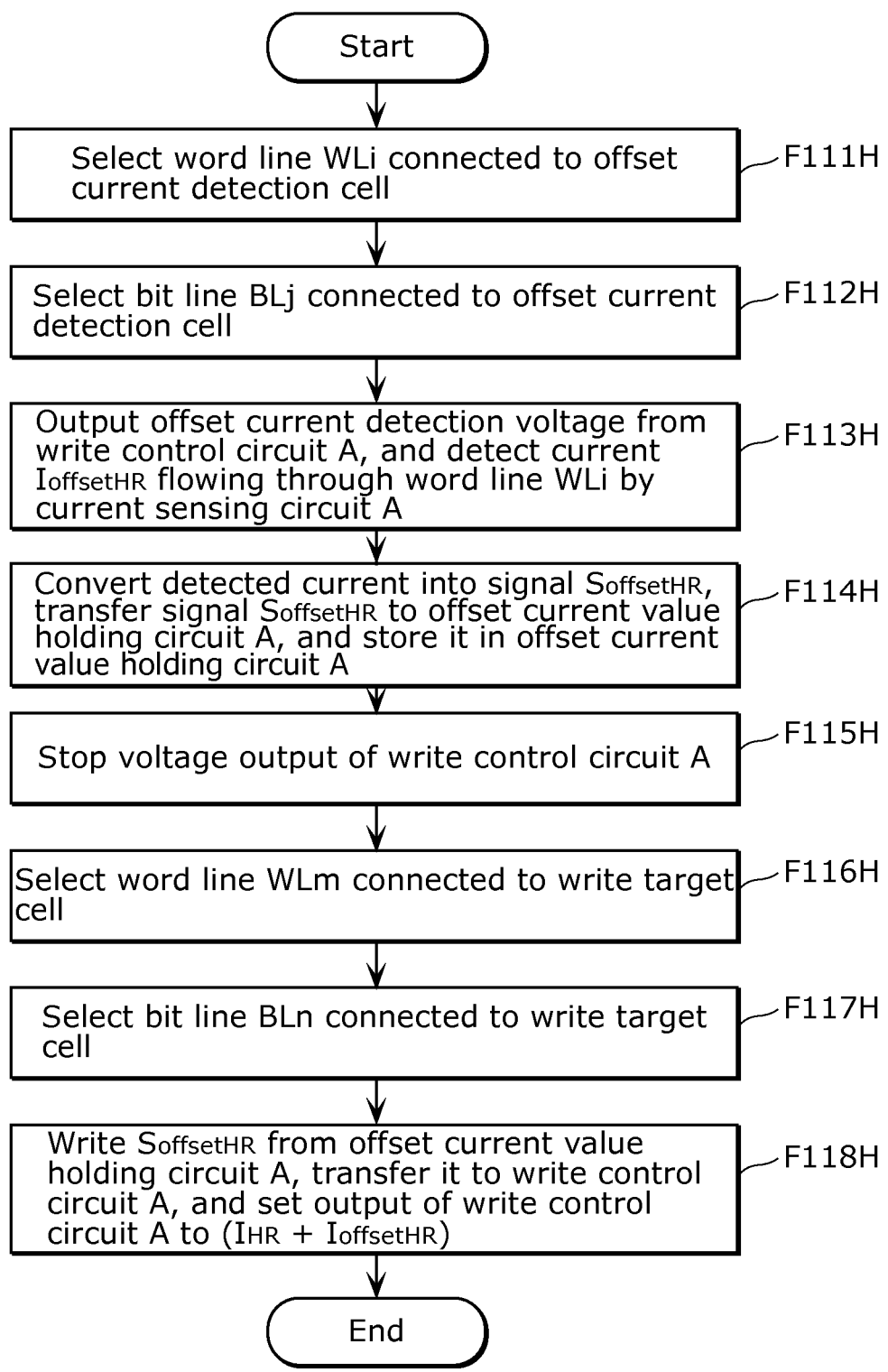

FIG. 11 is a write flowchart for writing a high resistance state into the nonvolatile semiconductor memory device according to Embodiment 1 of the present invention.

Figure 12:
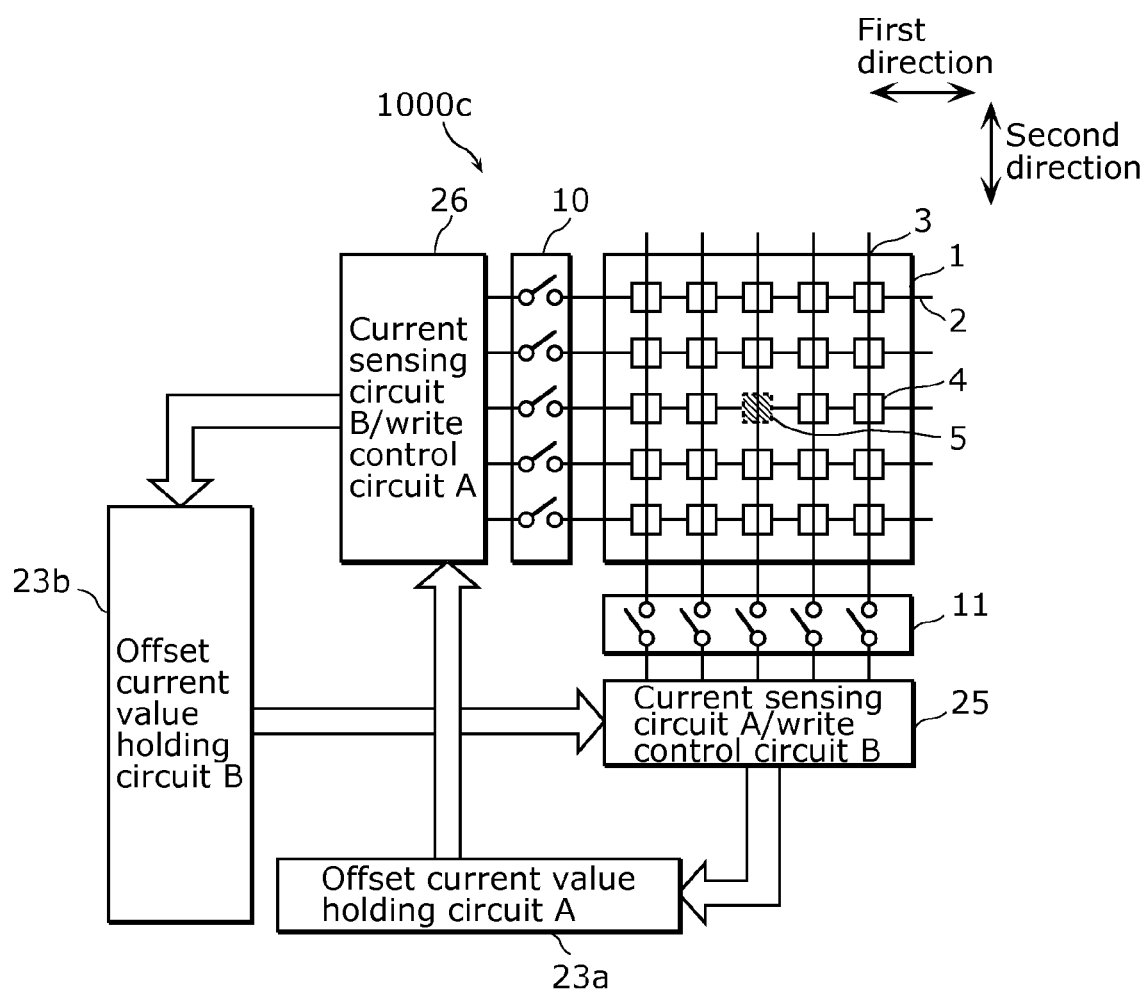

FIG. 12 is a schematic view showing another structure of the nonvolatile semiconductor memory device according to Embodiment 1 of the present invention.

Figure 13:
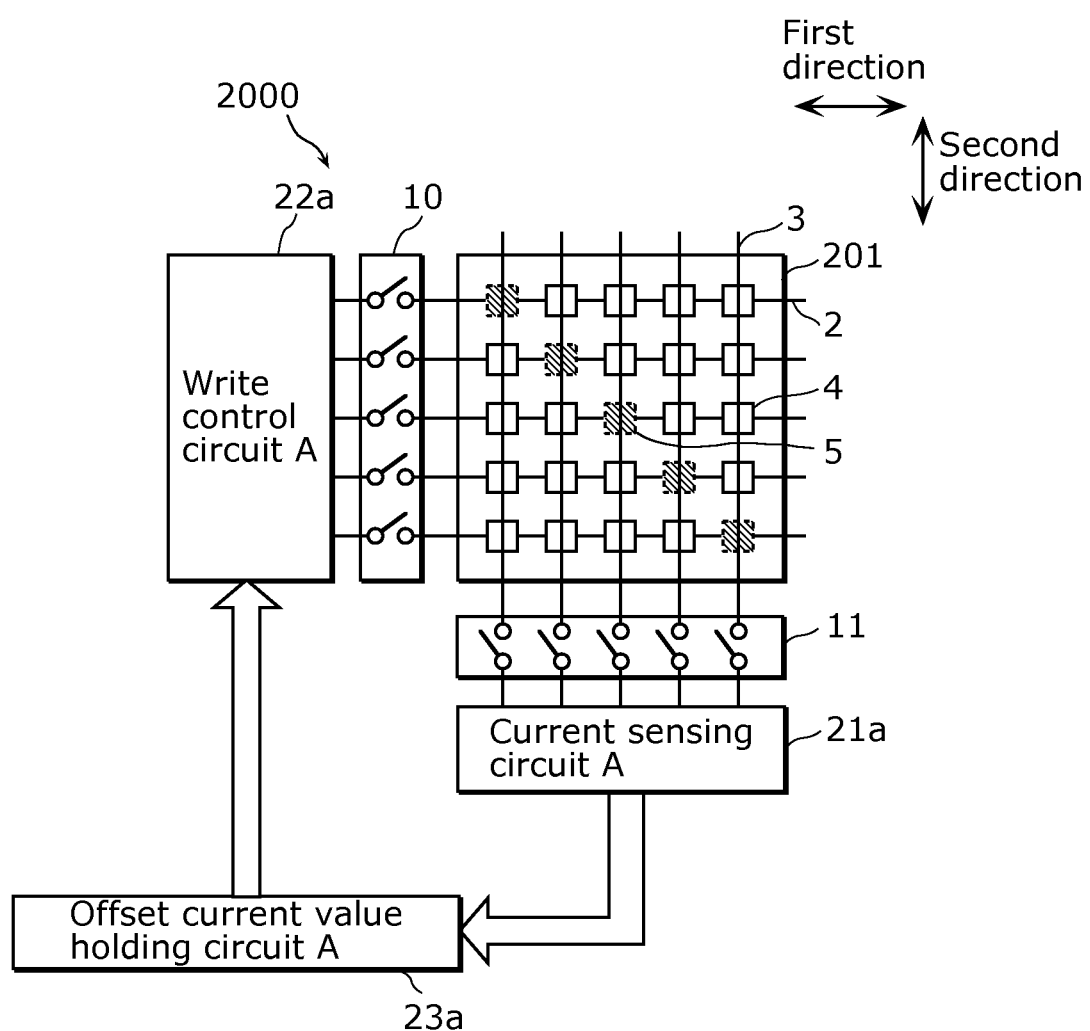

FIG. 13 is a schematic view showing the structure of a nonvolatile semiconductor memory device according to Embodiment 2 of the present invention.

Figure 14:
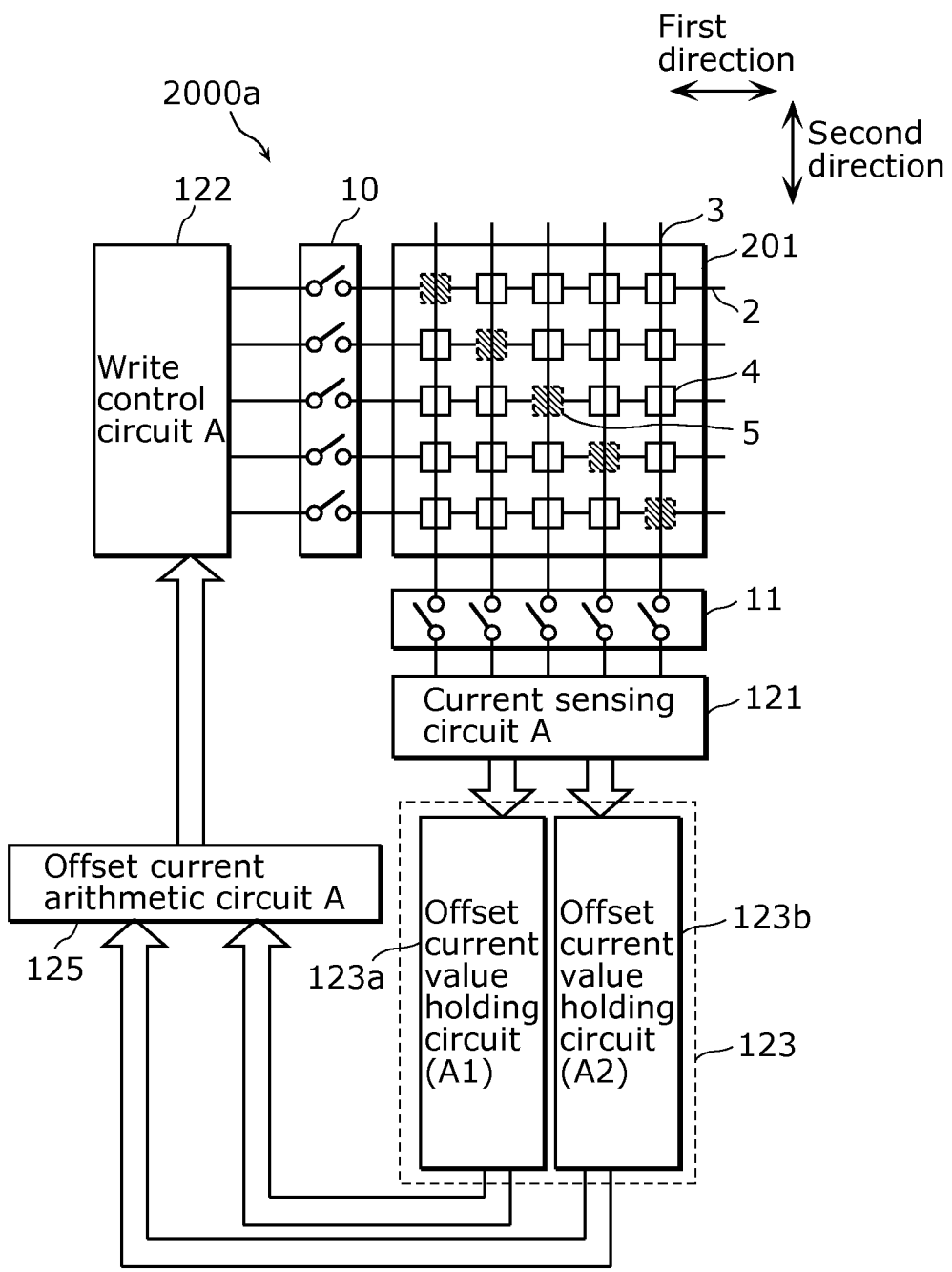

FIG. 14 is a schematic view showing the structure of a nonvolatile semiconductor memory device according to Variation of Embodiment 2 of the present invention.

Figure 15:
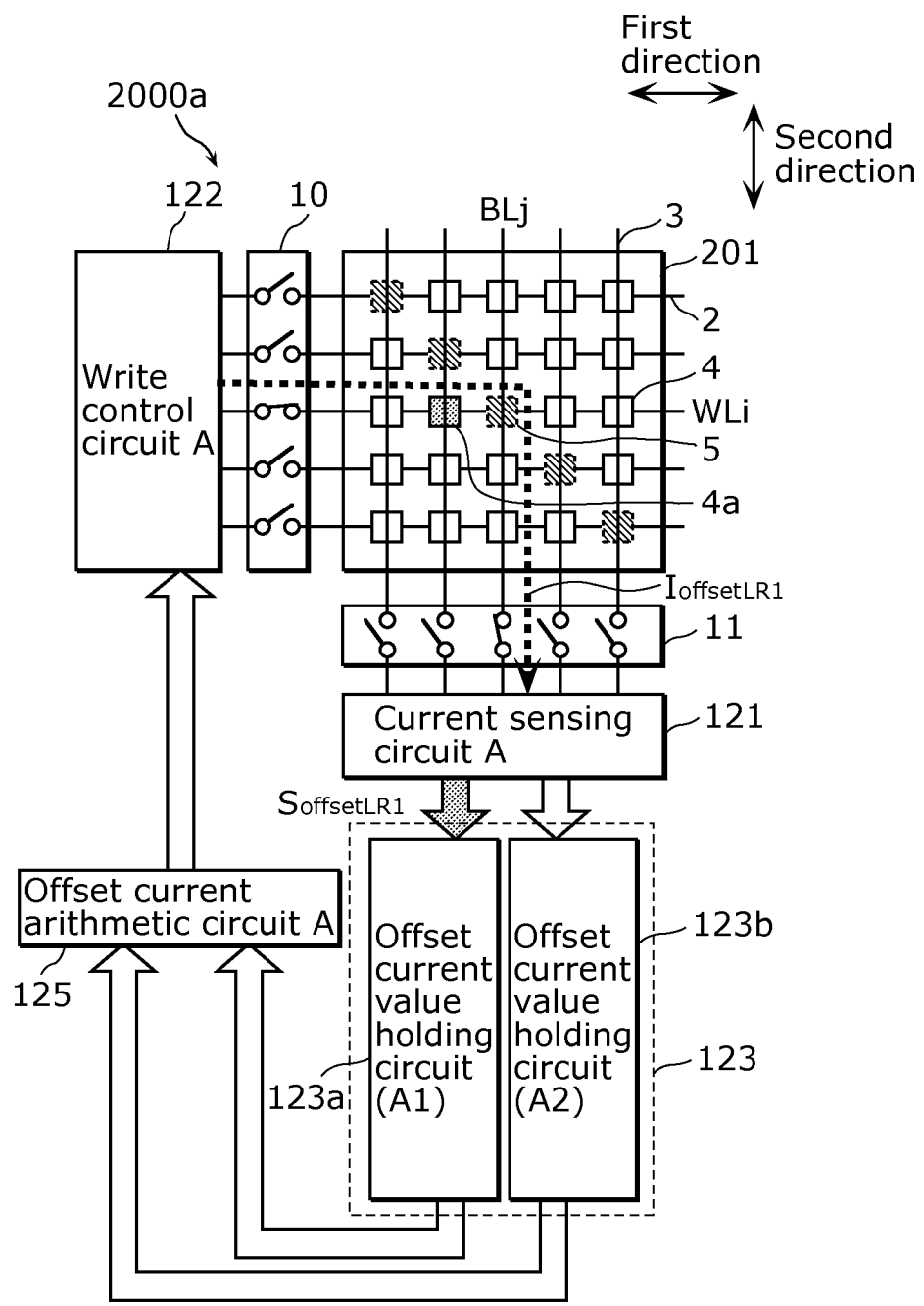

FIG. 15 is a diagram for explaining a write method for the nonvolatile semiconductor memory device according to Variation of Embodiment 2 of the present invention.

Figure 16:
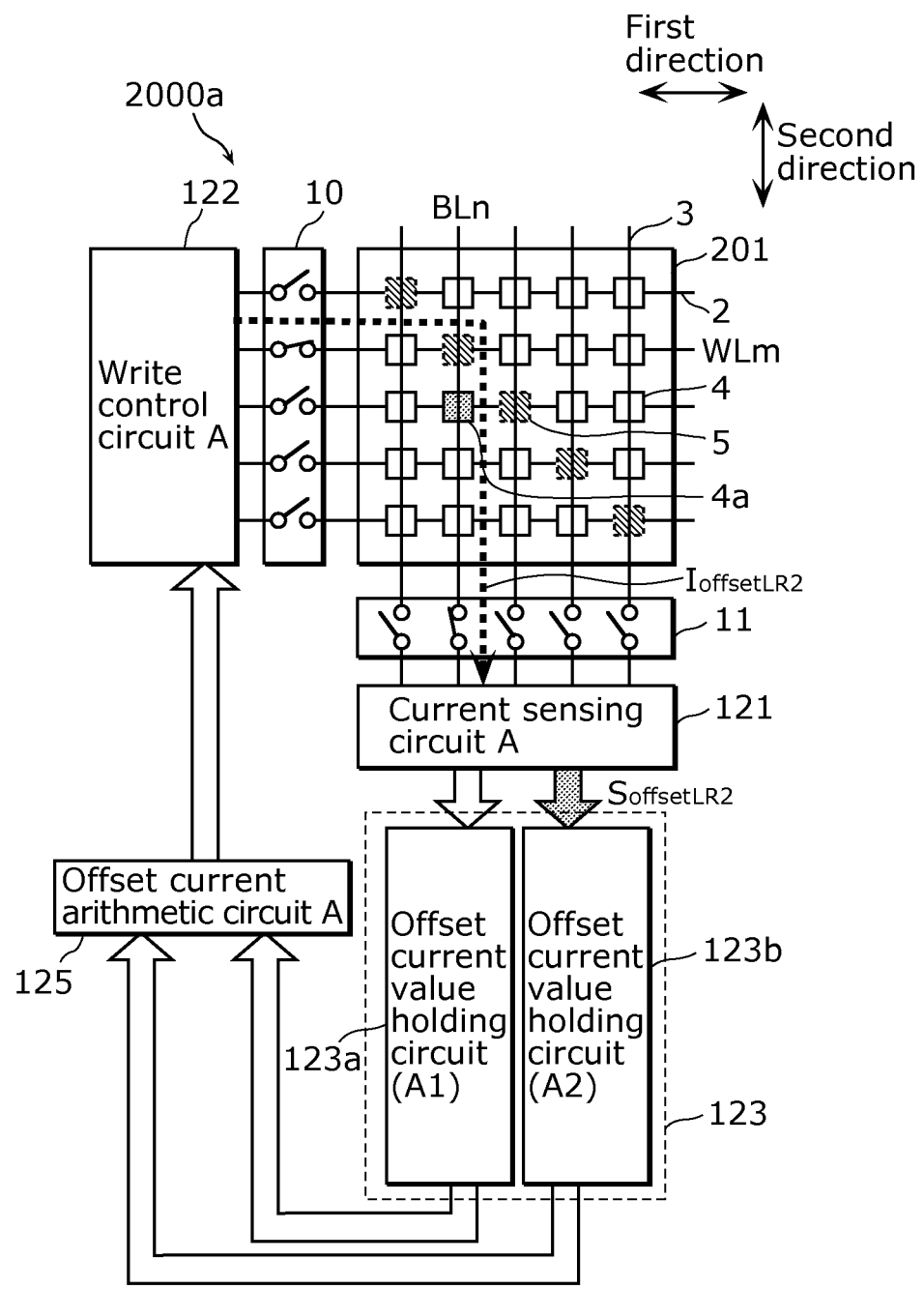

FIG. 16 is a diagram for explaining a write method (sequel) for the nonvolatile semiconductor memory device according to Variation of Embodiment 2 of the present invention.

Figure 17:
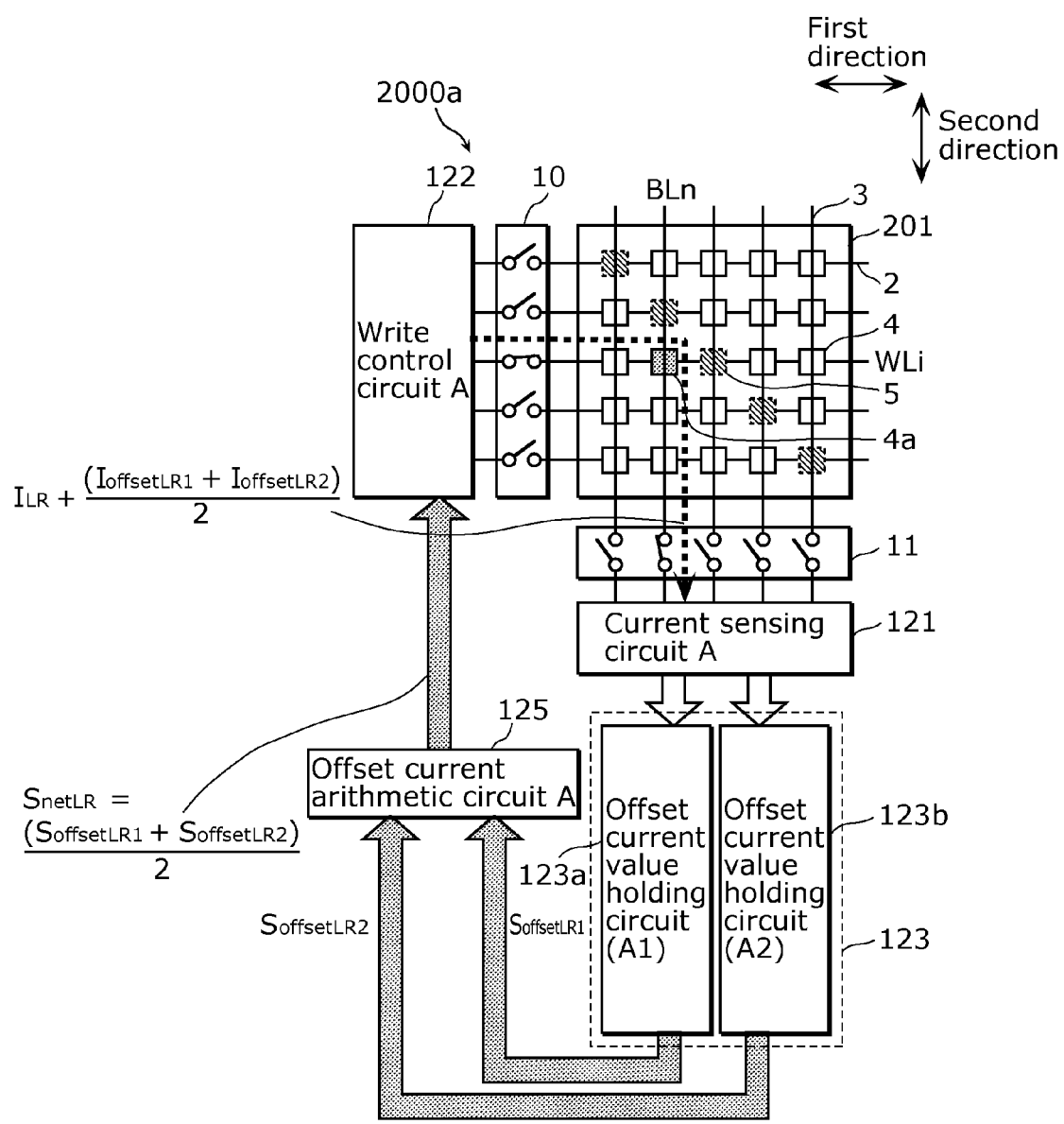

FIG. 17 is a diagram for explaining a write method (sequel) for the nonvolatile semiconductor memory device according to Variation of Embodiment 2 of the present invention.

Figure 18:
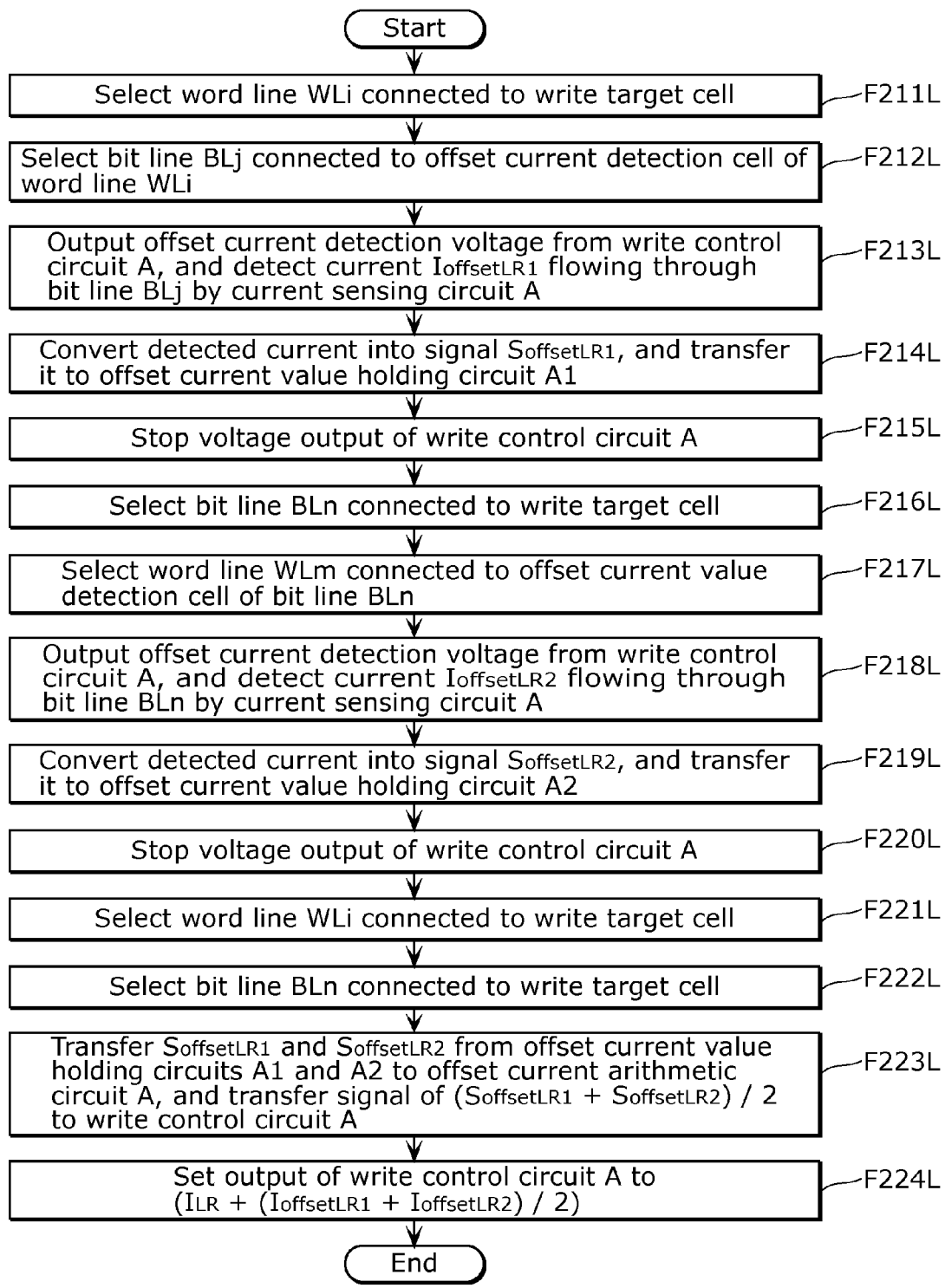

FIG. 18 is a write flowchart for the nonvolatile semiconductor memory device according to Embodiment 2 of the present invention.

Figure 19:
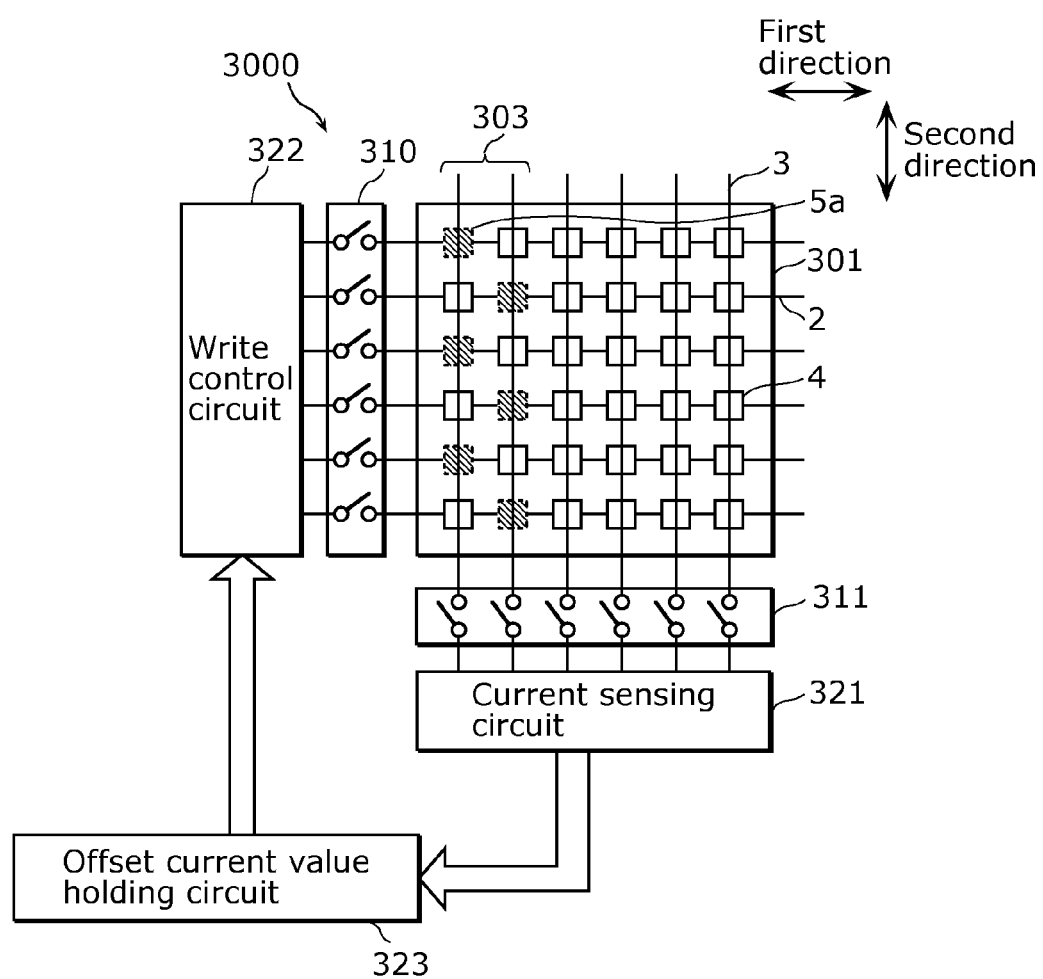

FIG. 19 is a schematic view showing the structure of a nonvolatile semiconductor memory device according to Embodiment 3 of the present invention.

Figure 20:
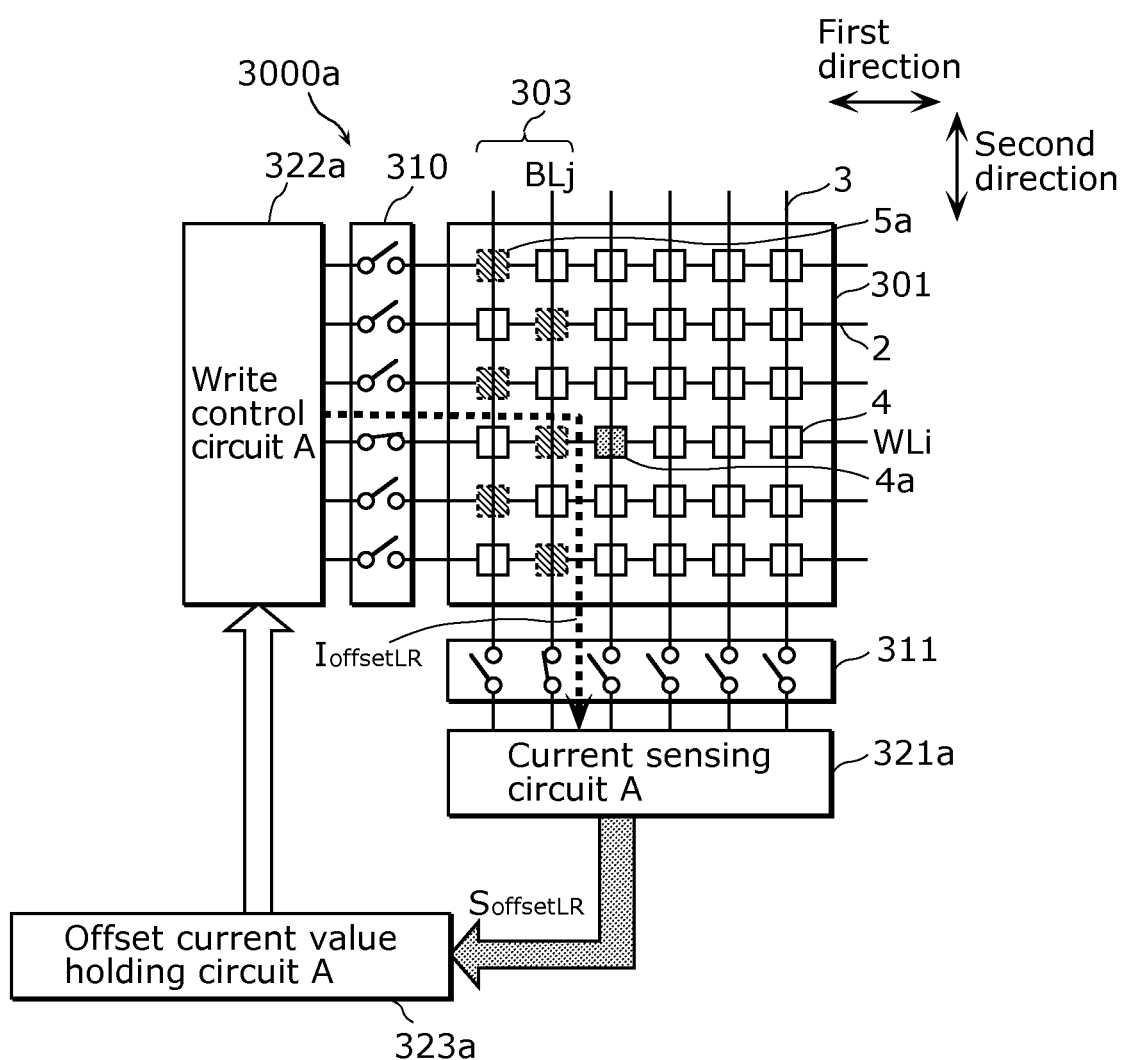

FIG. 20 is a diagram for explaining the write method for writing a low resistance state into the nonvolatile semiconductor memory device according to Embodiment 3 of the present invention.

Figure 21:
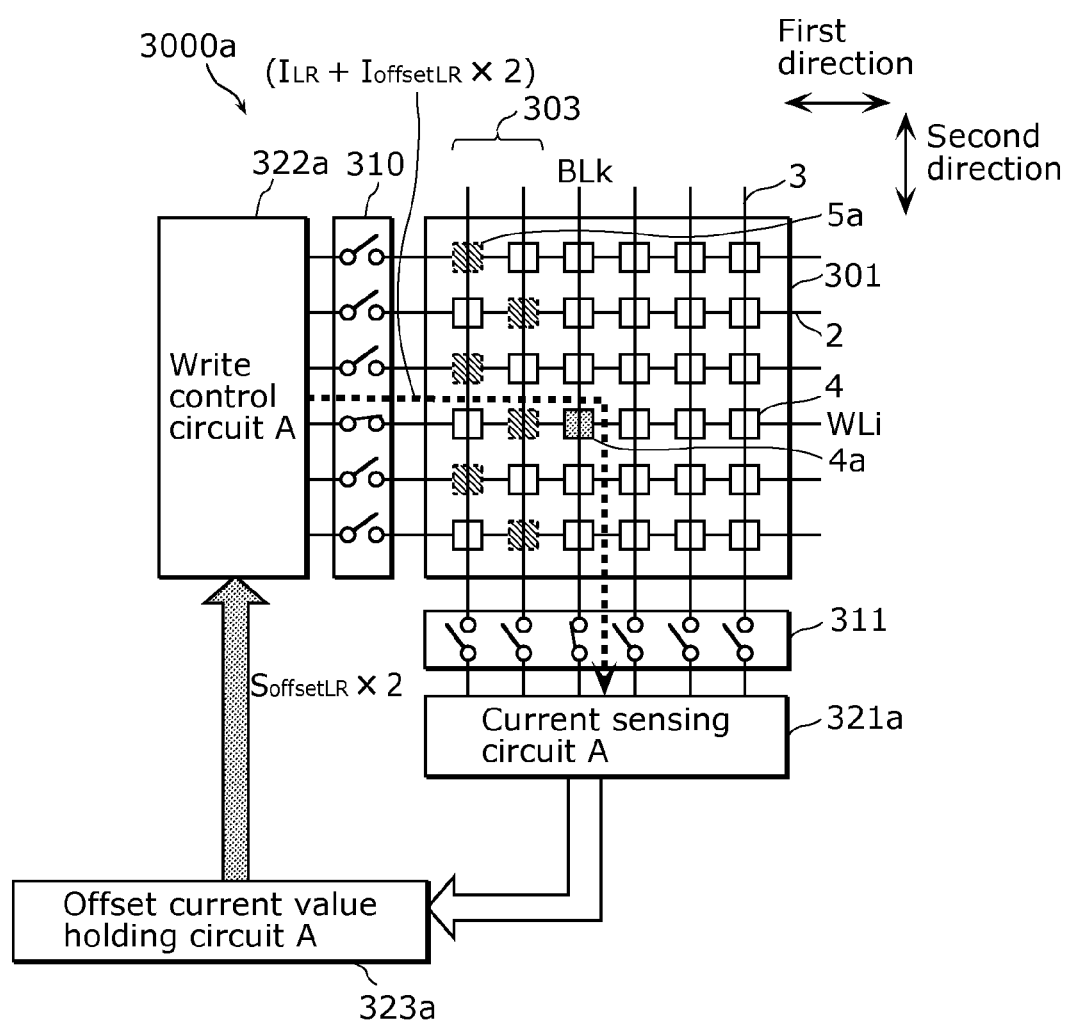

FIG. 21 is a diagram for explaining the write method (sequel) for writing a low resistance state into the nonvolatile semiconductor memory device according to Embodiment 3 of the present invention.

Figure 22:
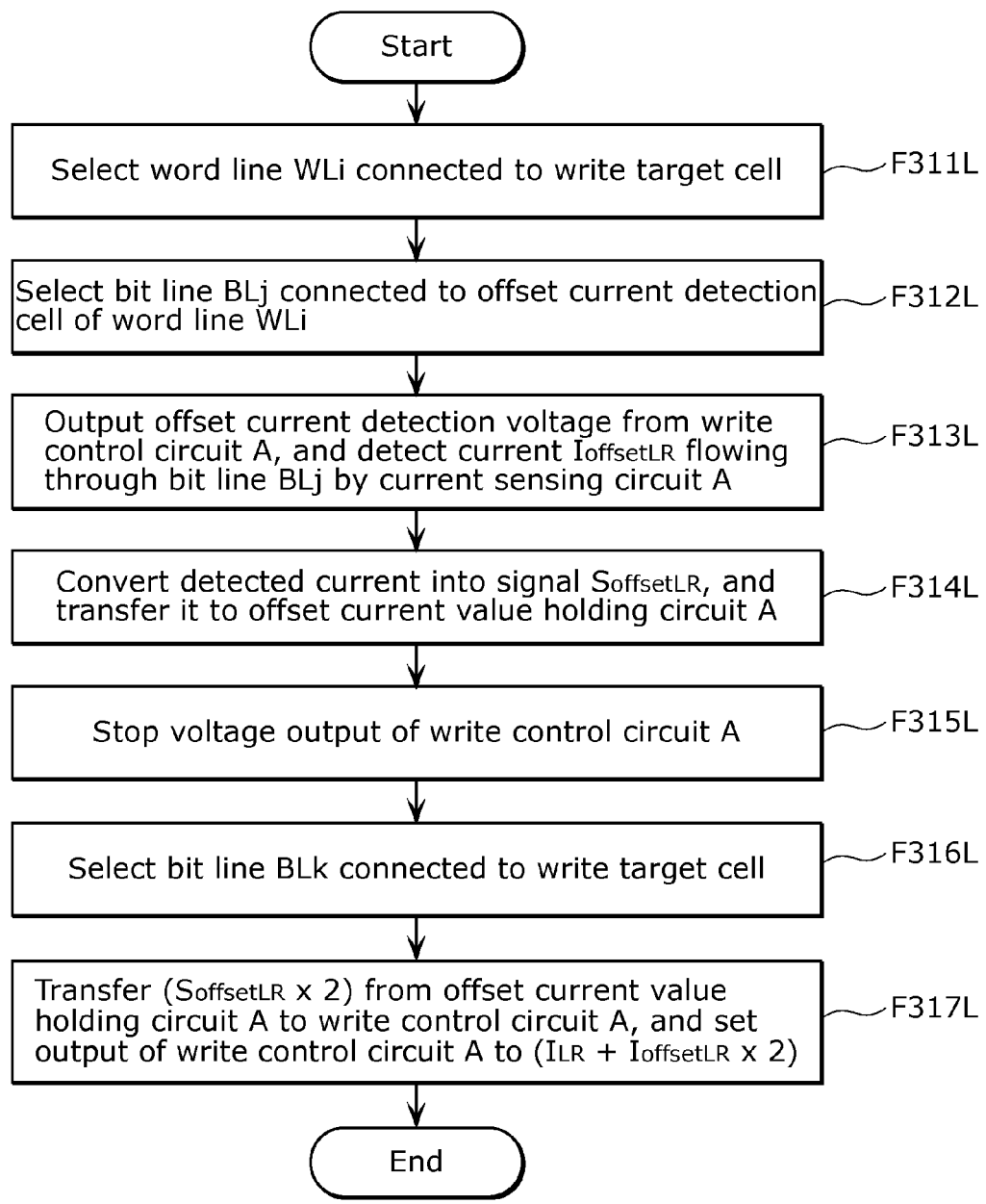

FIG. 22 is a write flowchart for the nonvolatile semiconductor memory device according to Embodiment 3 of the present invention.

DESCRIPTION OF EMBODIMENTS (Underlying Knowledge Forming Basis of the Present Invention)

As described above, in the cross-point structure, memory cells are arranged each of which is located at a cross-point between a bit line and a word line that are perpendicular to each other; the memory cell is located between the bit line and the word line. The memory cell is configured as a variable resistance memory element or a series-connected combination of a variable resistance memory element and a switching element. One of the terminals of the memory cell is connected to a word line and the other of the terminals of the memory cell is connected to a bit line. The cross-point structure is characterized by being suitable for large-scale integration as compared to what is called the 1T1R structure in which each variable resistance memory element is connected to a bit line via an access transistor.

In the cross-point structure, the memory cells are arranged in an array (which is hereinafter referred to as a cross-point cell array). In the cross-point structure, a voltage is applied to a corresponding one of the bit lines and a corresponding one of the word lines for changing (writing) the resistance value of a memory element included in the target memory cell. At this time, a current corresponding to a voltage applied to the memory cell flows through the write target memory cell, along with a current via a plurality of other unselected memory cells connected in series or in parallel to the selected memory cell which is designated as a write target by the upper bit lines and lower word lines. In the description, the sum of current flowing via memory cell others than the memory cell that is a write target is referred to as sneak current.

The sneak current changes depending on the condition of the data stored in the cross-point cell array (the resistance value and its distribution of the memory elements included in all the memory cells within the cross-point cell array to which the write target memory cell belongs). The current flowing through the write target memory cell during a write operation on the write target memory cell changes depending on the influence of sneak current of which a value is not always constant. In other words, since the sneak current changes a current necessary to change resistance of a memory element included in the write target memory cell, the sneak current impairs a reliable write operation (resistance change operation) in the nonvolatile semiconductor memory device.

By configuring the memory element in which the switching element and the variable resistance memory element are connected in series, this sneak current can be reduced to some extent. However, the sneak current increases according to the magnitude of the cross-point cell array, which means that the sneak current is an impediment to the enlargement of the cross-point cell array.

For ensuring a stable write operation of the cross-point cell array, for example, a semiconductor memory device is known for causing a voltage drop in a wiring portion with a current during a write operation on a memory cell and for effectively compensating a drop in the voltage to be applied to the memory cell using an auxiliary circuit.

In the above described semiconductor memory device, a memory cell comprises a variable resistance element and a unidirectional diode that are connected in series, as a way to reduce a sneak current. With this, the sneak current is almost suppressed. However, the direction of a current caused to flow through the memory cell is also limited only to a direction in which the diode is biased in a forward direction. Therefore, the technique cannot be applied when a memory cell uses a variable resistance element having a difference between (i) the direction of a current caused to flow through the variable resistance element when the resistance of the variable resistance element is changed from a low resistance state (LR state) to a high resistance state (HR state) and (ii) the direction of a current caused to flow through the variable resistance element when the resistance of the variable resistance element is changed from an HR state to an LR state (hereafter referred to as a bipolar-type variable resistance element).

Furthermore, in the above described semiconductor memory device, an object is to realize a constant voltage to be applied to a memory cell during a write operation. However, when a constant current value to flow during a write operation is desirable for stabilizing variable resistance characteristics, the technique cannot be applied because the current value cannot be constant by making the voltage constant.

In view of the above described problems, the following will describe a highly reliable semiconductor memory device which reduces an influence of the sneak current on the write operation and stabilizes a resistance change operation in a memory element included in a memory cell, even when it is a cross-point nonvolatile semiconductor memory device and there is a sneak current, as well as to provide a write method for the cross-point nonvolatile semiconductor memory device.

In order to achieve the above goal, a nonvolatile semiconductor memory device according to an aspect of the present invention comprises: word lines formed in parallel in a first plane; bit lines formed in parallel in a second plane and three-dimensionally crossing the word lines, the second plane being parallel to the first plane; a cross-point cell array including cells each provided at a corresponding one of three-dimensional cross-points of the word lines and the bit lines; a word line selection circuit that selects a particular one of the word lines; a bit line selection circuit that selects a particular one of the bit lines; a write control circuit that is connected to the word lines via the word line selection circuit or to the bit lines via the bit line selection circuit and outputs a write electrical signal to the word line selected by the word line selection circuit or to the bit line selected by the bit line selection circuit; and a current sensing circuit that is connected to the bit lines via the bit line selection circuit or to the word lines via the word line selection circuit, the current sensing circuit detecting a current flowing through the bit line selected by the bit line selection circuit or the word line selected by the word line selection circuit and converting the current into an electrical signal that corresponds to a magnitude of the current. Moreover, the current sensing circuit converts the sneak current into an offset electrical signal, and the nonvolatile semiconductor memory device further comprises an offset current value holding circuit for storing the offset electrical signal resulting from the conversion by the current sensing circuit.

The cells include: a memory cell which includes a memory element operates as a memory by reversing changing in current value between two or more states, based on an electrical signal to be applied between a corresponding word line and a corresponding bit line; and an offset current detection cell which holds a resistance value which is higher than the resistance value in the highest resistance state when the memory element operates as a memory, independently of the electrical signal to be applied between the corresponding word line and the corresponding bit line.

The write control circuit has a function of adjusting the write electrical signal for causing a second write current higher than the first write current to flow through the memory cell. The write control circuit may includes: a write control circuit A for outputting a first write electrical signal as the write electrical signal to the word line selected by the word line selection circuit; and a write control circuit B for outputting a second write electrical signal as the write electrical signal to the bit line selected by the bit line selection circuit.

The second write current may be a sum of the first write current and the sneak current.

The current sensing circuit may include: a current sensing circuit A that detects a sneak current flowing out from the bit line selected by the bit line selection circuit, and converts the detected sneak current, as the offset electrical signal, into a first offset electrical signal that is an electrical signal that corresponds to a magnitude of the sneak current; and a current sensing circuit B that detects a sneak current flowing out from the word line selected by the word line selection circuit, and converts the detected sneak current, as the offset electrical signal, into a second offset electrical signal that is an electrical signal that corresponds to a magnitude of the sneak current.

The offset current value holding circuit includes: an offset current value holding circuit A for storing the first offset electrical signal resulting from the conversion by the current sensing circuit A; and an offset current value holding circuit B for storing the second offset electrical signal resulting from the conversion by the current sensing circuit B.

Here, an electrical signal may be a current or a voltage. Moreover, the electrical signal may be a signal in which an analog signal of a current or a voltage is converted into a digital signal of the current or the voltage, or a signal in which a digital signal of a current or a voltage is converted into an analog signal of the current or the voltage. Moreover, the electrical signal may be a signal on which pulse modulation is performed depending on a current or a voltage.

With this structure, by selecting the offset current detection cell, it is possible to detect the rough magnitude of sneak current flowing when a write operation is performed on the write target memory cell. The write control circuit A (the write control circuit B) adjusts the electrical signal for write and outputs it to a word line (bit line) such that the current outputted from the write control circuit A (the write control circuit B) is a current obtained by adding sneak current to current $I_{LR}$ ($I_{HR}$) flowing through the memory cell for performing writing operation on the write target memory cell. With this, without an influence of the data stored in a cross-point cell array, the current almost equal to current $I_{LR}$ ($I_{HR}$) flowing through the memory cell for performing writing operation on the write target memory cell can flow through the write target memory cell and it is possible to perform stable write operation (Embodiment 1).

The nonvolatile semiconductor memory device according to the present invention, wherein the offset current detection cell includes offset current detection cells arranged in the cross-point cell array in a one-to-one correspondence with the word lines and in a one-to-one correspondence with the bit lines, and the offset current detection cell selected for detecting the current is the offset current detection cell provided at the word line or the bit line that is connected to a write target memory cell selected from the cross-point cell array.

With this structure, since the write target memory cell and the offset current detection cell share one of the word line or the bit line, the current detected by the offset current detection cell is a value closer to the value of the sneak current flowing during a write operation on the write target memory cell. With this, the current flowing through the write target memory cell can be maintained at a constant value with higher accuracy (Embodiment 2).

Furthermore, in the nonvolatile semiconductor memory device according to the present invention which includes a structure in which offset current detection cells are located within a cross-point cell array such that a single offset current detection cell is provided for each of the word lines and a single offset current detection cell is provided for each of the bit lines, the offset current value holding circuit A may include the first offset current value holding circuit and the second offset current value holding circuit for holding the first offset electrical signal and the second offset electrical signal, respectively, that are the results of conversion by the current sensing circuit A, and the offset current holding circuit B may include the first offset current value holding circuit and the second offset current value holding circuit for holding the first offset electrical signal and the second offset electrical signal, respectively, that are the results of conversion by the current sensing circuit B.

Moreover, the nonvolatile semiconductor memory device may further include an offset current arithmetic circuit A that generates, by referring to the first offset electrical signal and the second offset electrical signal, an average offset electrical signal that corresponds to an average of the first offset electrical signal and the second offset electrical signal, the first offset electrical signal being stored in the first offset current value holding circuit, the second offset electrical signal being stored in the second offset current value holding circuit, the first offset current value holding circuit and the second offset current value holding circuit being of the offset current value holding circuit A; and an offset current arithmetic circuit B that generates, by referring to the first offset electrical signal and the second offset electrical signal, an average offset electrical signal that corresponds to an average of the first offset electrical signal and the second offset electrical signal, the first offset electrical signal being stored in the first offset current value holding circuit, the second offset electrical signal being stored in the second offset current value holding circuit, the first offset current value holding circuit and the second offset current value holding circuit being of the offset current value holding circuit B.

Furthermore, the write control circuit A and the write control circuit B also operate as a constant current source when current is caused to flow in a memory cell for changing the resistance value of the memory element included in the memory cell, and has a function of adjusting the value of current outputted at that time by using the first word line connected to the write target memory cell selected from a cross-point cell array, the first offset electrical signal generated from the sneak current detected through selecting the first bit line connected to the first offset current detection cell provided on the first word line, the second bit line connected to the write target memory cell selected from the cross-point cell array, and the second offset electrical signal generated from the current detected through selecting the second word line connected to the second offset current detection cell provided at the second bit line.

With this structure, since the average of (i) the sneak current detected by the first offset current detection cell having the word line which includes the write target memory cell and (ii) the sneak current detected by the second offset current detection cell having the bit line which includes the write target memory cell is a value closer to the value of the sneak current flowing during a write operation on the write target memory cell, the current flowing through the memory element included in the write target memory cell can be maintained at a constant value with higher accuracy (Variation of Embodiment 2).

The nonvolatile semiconductor memory device according to the present invention may be a structure in which the device is located within a cross-point cell array such that a plurality of bit lines may include a plurality of bit lines connected only to the memory cells and a plurality of offset current detection bit lines connected to both the memory cells and the one or more offset current detection cell, and the offset current detection cell is a structure in which the total number of offset current detection cells provided for each of all the offset current detection bit lines is the same and a single offset current detection cell is provided for each of the word lines.

In this case, the offset current detection cell selected for detecting the offset current is an offset current detection cell provided for a word line connected to the write target memory cell selected from the cross-point cell array.

As similarly to the structure in which the offset current detection cell is located to be provided only at a particular offset current detection bit line, the nonvolatile semiconductor memory device according to the present invention may be a structure in which the device is located within a cross-point cell array such that a plurality of word lines may include: a plurality of word lines connected only to the memory cells; and a plurality of offset current detection word lines provided with both the memory cells and the one or more offset current detection cells, wherein the offset current detection cell is a structure in which the total number of offset current detection cells provided for each of all the offset current detection word lines is the same and a single offset current detection cell is provided for each of the bit lines.

In this case, the offset current detection cell selected for detecting the current is an offset current detection cell provided for the bit line connected to the write target memory cell selected from the cross-point cell array.

With this structure, since a bit line (word line) which is a selection target of the bit line selection circuit (or the word line selection circuit) can be limited only to an offset current detection bit line (or an offset current detection word line) when the offset current detection cell is selected, an effect can be obtained in which a design of a circuit for selecting a switch of the bit line selection circuit (or the word line selection circuit) is easier (Embodiment 3).

It is to be noted that the nonvolatile semiconductor memory device according to the present invention does not necessarily have to include the word line selection circuit and the bit line selection circuit, as long as at least a cross-point cell array characterized as described above is included. The cross-point cell array includes: a memory cell including a memory element that operates as a memory by reversibly changing in resistance value between at least two states based on an electrical signal applied between a corresponding one of the word lines and a corresponding one of the bit lines; and an offset current detection cell having a resistance value that is, irrespective of an electrical signal applied between a corresponding one of the word lines and a corresponding one of the bit lines, higher than the resistance value of the memory element in a high resistance state which the memory element operates as a memory. Therefore, it has a structure that can detect the sneak current with high accuracy unlike a conventional cross-point cell array which includes a memory cell and a dummy cell that are not different in structure and can keep the current flowing through the write target memory cell at a constant value at higher accuracy.

The following will describe the embodiments according to the present invention with reference to the drawings. It is to be noted that the same elements are denoted by the same numerals and may not be repeatedly described.

In the present invention, the shapes of the memory elements, the lines, and so on described herein are schematic. Furthermore, the number and the like of these elements and so on are set to those which facilitate illustration.

It is to be noted that although only a single-layered cross-point cell array is described herein with reference to the drawing, the present invention is not limited to the single-layered cross-point cell array, and a cross-point cell array with two or more layers can also produce the same effects when the structure of the present invention is applied to each of the layers of the cross-point cell array.

Furthermore, the description explains, as an example, the case of causing the resistance of the memory element to be in a high resistance state by causing a current to flow from the bit line to the word line and the case of causing the resistance of the memory cell to be in a low resistance state by causing current to flow from the word line to the bit line. However, the present invention is not limited only to this. If the direction in which current is caused to flow when detecting current by selecting the offset current detection cell is the same as the direction in which current is caused to flow for writing the memory cell, the same effect can be obtained, Embodiment 1

Device Structure

Figure 1:
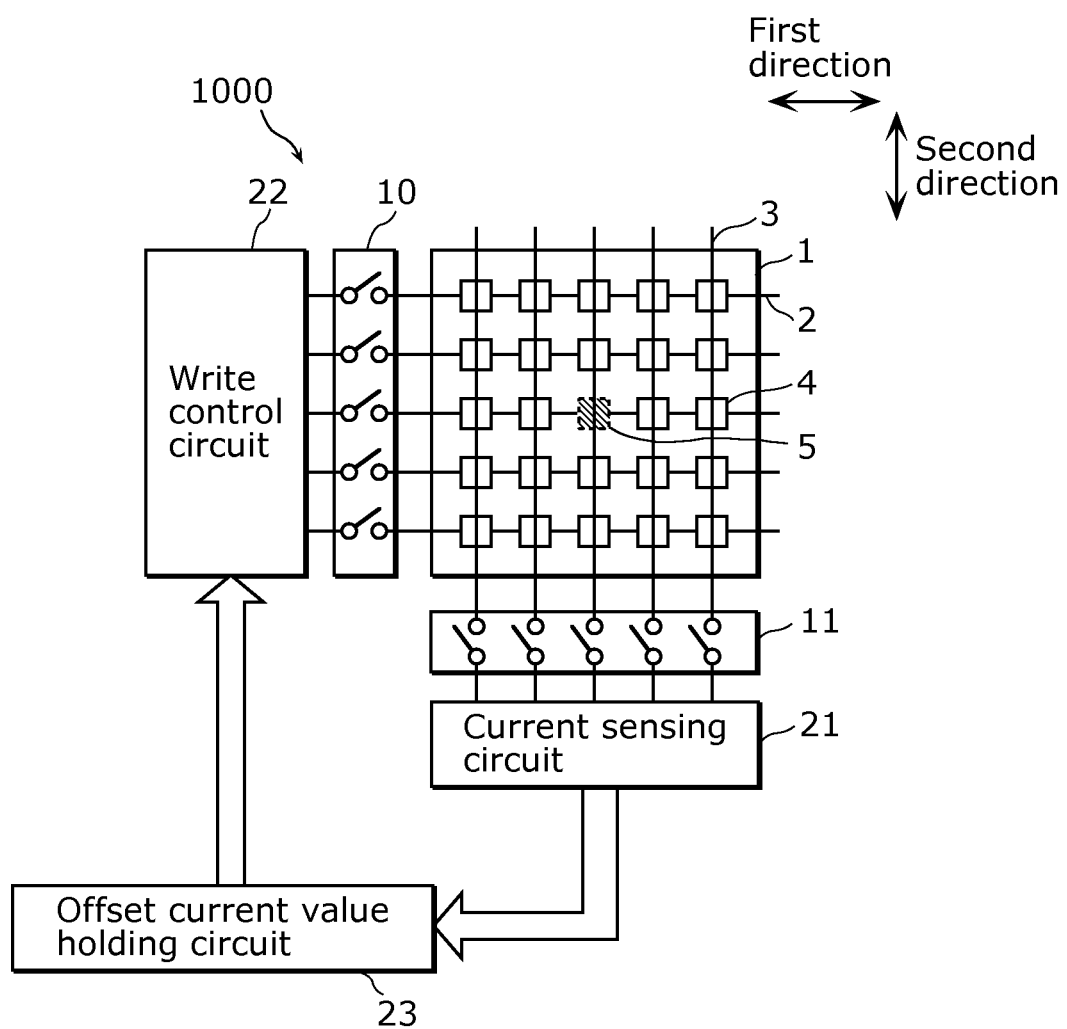
FIG. 1 is a schematic view showing the structure of a nonvolatile semiconductor memory device according to Embodiment 1 of the present invention.

A nonvolatile semiconductor memory device 1000 according to Embodiment 1 of the present invention includes, as shown in FIG. 1: word lines 2 formed in parallel in a first plane; bit lines 3 formed in parallel in a second plane parallel to the first plane, and three-dimensionally crossing the word lines 2; a cross-point cell array 1 including cells (including memory cells 4 and an offset current detection cell 5) each provided at a corresponding one of three-dimensional cross-points of the word lines 2 and the bit lines 3; a word line selection circuit 10 that selects a particular word line 2 from the word lines 2; a bit line selection circuit 11 that selects a particular bit line 3 from the bit lines 3; a write control circuit 22 that is connected to the word lines 2 via the word line selection circuit 10 and outputs a write electrical signal to the word line 2 selected by the word line selection circuit 10; a current sensing circuit 21 that is connected to the selected bit line 3 via the bit line selection circuit 11 and detects the sneak current flowing through the bit line 3 selected by the bit line selection circuit 11, and converts the detected sneak current into an offset electrical signal that is an electrical signal corresponding to the magnitude of the sneak current, wherein the cells include: a plurality of the memory cells 4 each including a variable resistance element (memory element), which operate as a memory, that reversibly changes in resistance value between at least two states (i.e., operating as a memory) based on an electrical signal applied between the selected word line 2 and the selected bit line 3; and at least one offset current detection cell 5 which has a predetermined high resistance value that is, independently of an electrical signal applied between a corresponding one of the word lines 2 and a corresponding one of the bit lines 3, wherein the current sensing circuit 21 and the write control circuit 22 temporarily select the offset current detection cell 5, measures a sneak current and stores the sneak current, and then controls the write control circuit 22 for causing, to flow through the selected memory cell 4, the second write current obtained by adding the sneak current to the predetermined first write current of the selected memory cell 4. The following will describe the structural elements in detail.

This nonvolatile semiconductor memory device 1000 includes, as described above: the word lines 2 formed in parallel to the first direction and in stripe shape; the bit lines 3 formed in stripe shape in the direction (the second direction) in which the bit lines 3 cross the word lines 2; and the cross-point cell array 1 formed at the cross-points, in a planar view, of the word lines 2 and the bit lines 3 and between the word lines 2 and the bit lines 3. Furthermore, the cross-point cell array 1 includes the plurality of memory cells 4 and one or more offset current detection cells 5.

It is to be noted that although the offset current detection cell 5 is located at the center in the cross-point cell array 1 shown in FIG. 1, the offset current detection cell 5 is not necessarily located at the center and may be located at any position within the cross-point cell array 1. Furthermore, the number of offset current detection cells 5 within the cross-point cell array 1 is not limited to one, and two or more offset current detection cells 5 may be provided within the single cross-point cell array 1.

Moreover, the above described FIG. 1 shows a structure in which the write control circuit 22 is connected to the word lines 2 and the current sensing circuit 21 is connected to the bit lines 3. However, a structure is acceptable in which the current sensing circuit 21 is connected to the word lines 2 and the write control circuit 22 is connected to the bit lines 3. Moreover, a structure is acceptable in which by connecting a circuit having the function of the current sensing circuit and the function of the write control circuit to each of the word line 2 and the bit line 3, one of them is used as the current sensing circuit and the other is used as the write control circuit.

FIG. 2 shows, in more detail, the structures of the cross-point cell array 1, the word lines 2, and the bit lines 3 that are shown in FIG. 1. (a) in FIG. 2 is a plan view, and (b) in FIG. 2 shows a structure of a cross-section taken along X-X' of (a) in FIG. 2. As shown in (a) and (b) in FIG. 2, the memory cell 4 in the present embodiment includes: a memory element 111; a first via 110 for electrically connecting the memory element 111 with the word line 2; and a second via 112 for electrically connecting the memory element 111 with the bit line 3.

The memory element 111 comprises a variable resistance memory element, or comprises a series-connected combination of a variable resistance memory element and a switching element. The variable resistance memory element used herein indicates an element in which a value of resistance between two terminals changes according to electrical signals and which has properties of keeping the resistance value even when the electrical signals are no longer supplied (that is, keeping the resistance value in a nonvolatile manner), and is capable of storing data by this change in resistance value. Usable examples of the memory element 111 have a bipolar or unipolar-type write characteristic, and they specifically include a magnetic random access memory (MRAM), a phase change random access memory (PRAM), a resistance random access memory (ReRAM), a spin transfer torque random access memory (SPRAM). The variable resistance memory element in the memory element 111 associates one of the high resistance state (HR state) and the low resistance state (LR state) with "1" and the other with "0", which allows the memory element 111 to store one-bit data. Moreover, current is used as an electrical signal for a write operation for at least one of the writes in the HR state and LR state, and the write of the HR state or LR state is performed by adjusting the current. In this case, setting current flowing during a write operation to a constant value corresponding to the HR state or LR state is desirable for stabilizing variable resistance characteristics.

Moreover, usable examples of the switching element herein include elements having non-linear I-V properties (hereinafter referred to as bipolar-type diode) independently of a bias direction, such as a rectifier like a p-n junction diode, a metal-semiconductor-metal (MSM) diode which has a three-layer structure: a semiconductor layer and metal electrode layers (i.e., a first metal electrode and a second metal electrode) between which the semiconductor layer is located, and a metal-insulator-metal (MIM) diode which has a three-layer structure: an insulator layer and metal electrode layers between which the insulator layer is located.

The offset current detection cell 5 has, as an example, a structure obtained by removing the second via 112 from the memory cell 4. A role of the offset current detection cell 5, which will be described in detail later, is to measure an approximate value of sneak current in the cross-point cell array 1. Here, the sneak current is a sum of current flowing through the memory cells excluding the offset current detection cell 5. It is to be noted that the offset current detection cell 5 has a structure in which a current flowing across the offset current detection cell 5 when an almost equal potential difference for writing is applied between the word line 2 and the bit line 3 which are located above and below the offset current detection cell 5 has a value smaller than a value of a current flowing across the memory cell 4 when a potential difference for writing is applied between the word line 2 and the bit line 3 which are located above and below the memory cell 4 while the variable resistance memory element included in the memory element 111 is in a high resistance state. In other words, the offset current detection cell 5 is configured to have a resistance value that is, irrespective of an electrical signal applied between a corresponding one of the word lines 2 and a corresponding one of the bit lines 3, higher than the resistance value of the memory element 111 that is included in the memory cell 4 and is in a high resistance state which is a state of the memory element when operating as a memory.

The offset current detection cell 5 shown in (b) in FIG. 2 is configured without the second via 112 as compared to the structure of the memory cell 4 such that almost no current flows across the offset current detection cell 5 when a potential difference for write is applied between the word line 2 and the bit line 3 which are located above and below the offset current detection cell 5. In this case, until the memory element 111 and an interlayer dielectric 100 thereon are armed, there is no difference in manufacture between the memory cell 4 and the offset current detection cell 5, which makes it possible to eliminate the influence of variations in magnitude and properties of resultant memory elements due to differences in layout between (i) the memory cell 4 to which only the memory cells 4 are adjacent and (ii) the memory cell 4 to which the offset current detection cell 5 is adjacent.

FIG. 3 shows, in (a) to (d), other examples of the structure of the offset current detection cell 5. As compared to the structure of the memory cell 4, an offset current detection cell 51 in (a) in FIG. 3 has a structure without a via for electrically connecting the memory element 111 with the word line 2. An offset current detection cell 52 in (b) in FIG. 3 has a structure without the memory element 111. An offset current detection cell 53 in (c) in FIG. 3 has a structure without via for electrically connecting the memory element 111 with the word line 2 and the bit line 3 which are located above and below the offset current detection cell 53. Furthermore, an offset current detection cell 5 in (d) in FIG. 3 has a structure without the memory cell, the upper via, nor the lower via. In all the structures, since the current hardly flows across the offset current detection cell 5 even when a potential difference for write is applied between the word line 2 and the bit line 3 which are located above and below the offset current detection cell 5, the same or like effects as those in the offset current detection cell 5 shown in (b) in FIG. 2 can be obtained.

The structures of the offset current detection cells 51 to 53 in (a), (b), and (c) in FIG. 3 produce effects of reducing the possibility that the offset current detection cells 51 to 53 are each short-circuited even when a line groove which is to be the bit line 3 is overetched upon forming the bit line 3 in a damascene pattern using copper (Cu), as compared to the structure of the offset current detection cell 5 shown in (b) in FIG. 2.

Furthermore, in the structure in (b) in FIG. 3, even in the case where the first via 110 is formed of a tungsten (W) via and a Cu via, the dishing amount of the offset current detection cell 52 can be the same as that of the memory cell 4, which produces an effect of reducing local variations in focus margin in the lithography step for the memory element 111. Furthermore, in the structure in (c) in FIG. 3, since no via is formed either above or below the memory element 111, the offset current detection cell 53 will not be short-circuited even when overetching occurs at the time of via etching. Furthermore, in (d) in FIG. 3, short-circuiting of the offset current detection cell 54 due to variations in the manufacturing process can be prevented at the highest rate.

The nonvolatile semiconductor memory device 1000 in FIG. 1 further includes the word line selection circuit 10 and the bit line selection circuit 11. The word line selection circuit 10 is connected to the word lines 2 and selects one of the word lines 2 to connect only the selected one of the word lines (that is, a selected word line) to the write control circuit 22 while leaving the other word lines in the disconnected state, for example. The bit line selection circuit 11 is connected to the bit lines 3 and selects one of the bit lines 3 to connect only the selected one of the bit lines (that is, a selected bit line) to a current sensing circuit 21 while leaving the other bit lines in the disconnected state, for example. A voltage which turns off the switching element may be applied to the unselected word lines 2 and the unselected bit lines 3.

The write control circuit 22 operates as a variable voltage source which causes a constant potential to generate in a direction in which current flows from the word line 2 to the bit line 3 as necessary (described later), and as a variable pulse current source for causing a pulse current in which a peak current is constant to flow from the word line 2 to the bit line 3.

The current sensing circuit 21 converts the sneak current flowing into from the bit line 3 into an electrical signal that corresponds to the magnitude of the sneak current flowing into from the bit line 3, and outputs the converted electrical signal (offset electrical signal) to the offset current value holding circuit 23. Here, an electrical signal may be a current or a voltage. Moreover, the electrical signal may be a signal in which an analog signal of a current or a voltage is converted into a digital signal of the current or the voltage, or a signal in which a digital signal of a current or a voltage is converted into an analog signal of the current or the voltage. Moreover, the electrical signal may be a signal on which pulse modulation is performed depending on a current or a voltage. The outputted offset electrical signal is stored in the offset current value holding circuit 23. The offset current value holding circuit 23 has a function of outputting, as necessary, the offset electrical signal to the write control circuit 22.

[Example Using ReRAM]

FIG. 4 shows, as an example, a structure of the memory cell 4 which uses a variable resistance element (ReRAM) as a variable resistance memory element of the memory element 111 and uses an MSM diode as a switching element.

As shown in FIG. 4, a variable resistance element 570 has a layered structure which includes a first electrode 511, a low density oxide layer 521, a high density oxide layer 522, and a second electrode 512. Moreover, a diode 571 has a layered structure which includes a second electrode 512, a semiconductor layer 530, and a third electrode 513. Although the second electrode 512 is shared by the variable resistance element 570 and the diode 571 in the memory element 572 shown in FIG. 4, the second electrode 512 may have a two or more-layer structure of different materials when the variable resistance element 570 and the diode 571 need to have different materials.

As the material of each of the first electrode 511 and the second electrode 512, tantalum nitride (TaN), titanium nitride (TiN), tungsten (W), or the like can be used, among which a 50 nm-thick TaN layer is used herein.

As the material of the third electrode 513, any one of platinum (Pt), iridium (Ir), and palladium (Pd), or an alloy thereof can be used, among which a 50-nm thick Ir layer is used herein.

The low density oxide layer 521 and the high density oxide layer 522 form the variable resistance layer of the variable resistance element 570. A change in the resistance of this variable resistance layer causes a change in the resistance of the variable resistance element 570.

The low density oxide layer 521 comprises a first metal oxide, and the high density oxide layer 522 comprises a second metal oxide, it is to be noted that the oxygen deficiency of the second metal oxide is lower than the oxygen deficiency of the first metal oxide. In the high density oxide layer 522 of the variable resistance element 570, a miniscule local area is formed in which the oxygen deficiency changes reversibly in response to the application of an electrical pulse. The local area is thought to include filament composed of an oxygen deficiency site.

For the low density oxide layer 521, an oxygen-deficient film is used which comprises an oxide of which oxygen content is low in atom ratio as compared to an oxide having a stoichiometric composition; the case using a tantalum oxide is explained herein. The layer is formed as follows. The low density oxide layer 521 comprises TaOx (0≤x≤2.5) as a favorable range and is preferably 30 nm or more and 100 nm or less in thickness.

The high density oxide layer 522 comprises TaOy (x<y) as a favorable range and is preferably 1 nm or more and 10 nm or less in thickness. It is possible to adjust the value x of TaOx in the chemical formula by adjusting the flow rate of oxygen gas relative to the flow rate of argon gas in the sputtering.

To explain according to specific steps in the sputtering, first, a substrate is placed in a sputtering device which is then vacuumed to approximately $7 \times 10^{-4}$ Pa. Subsequently, using tantalum as a target, sputtering is performed with power of 250 W, a combination of argon gas and oxygen gas at a total gas pressure of 3.3 Pa, and with the substrate at set temperature of 30 degrees Celsius. As the oxygen partial pressure changes from 1% to 7% in the ratio, the oxygen content atomic percentage in the tantalum oxide layer (i.e., the composition ratio of oxygen atoms to the total atoms (O/(Ta+O))) changes from approximately 40% ($TaO_{0.66}$) to approximately 70% ($TaO_{2.3}$). The composition of the tantalum oxide layer can be measured using the Rutherford Backscattering Spectrometry. Furthermore, the oxide having its stoichiometric composition refers herein to $Ta_2O_5$, which is an insulator, in the case of the tantalum oxide. When becoming oxygen-deficient, a metal oxide becomes electrically conductive. In this embodiment, a 6 nm-thick $Ta_2O_5$ film is deposited as the high density oxide layer 522, and 50 nm-thick $TaO_{0.66}$ is deposited as the low density oxide layer 521.

Furthermore, as the high density oxide layer 522 and the low density oxide layer 521, a variable resistance layer which has the same or like layered structure can be formed using, other than the oxygen-deficient tantalum oxide film, an oxide film which includes iron that is also oxygen-deficient, or other transition metal oxides which include hafnium (Hf), zirconium (Zr), titanium (Ti), niobium (Nb), tungsten (W), or nickel (Ni). Moreover, it is possible to form a variable resistance film having the same layered structure even using aluminum oxide. Methods of forming these films include a sputtering method and a chemical vapor deposition (CVD) method.

In the present embodiment, the oxygen deficiency of the high density oxide layer 522 is lower than the oxygen deficiency of the low density oxide layer 521. Here, the oxygen deficiency refers to a ratio of deficient oxygen in a metal relative to the amount of oxygen included in the oxide having its stoichiometric composition (the stoichiometric composition having the highest resistance value when there are a plurality of stoichiometric compositions). A metal oxide of the stoichiometric composition has a more stable and higher resistance value than the other metal oxides having other stoichiometric compositions.

For example, when the transition metal is tantalum (Ta), the stoichiometric composition of the oxide is $Ta_2O_5$, which can be expressed as $TaO_{2.5}$. The oxygen deficiency of $TaO_{2.5}$ is 0%. Furthermore, for example, the oxygen deficiency of an oxygen-deficient tantalum oxide having a composition $TaO_{1.5}$ is determined by the expression; the oxygen deficiency=(2.5−1.5)/2.5=40%. Moreover, an oxygen-excessive metal oxide has a negative value of oxygen deficiency. It is to be noted that unless otherwise noted, the oxygen deficiency includes a positive value, zero, and a negative value.

The above described metal has a plurality of states of oxidation, and is therefore allowed to provide different resistance states by oxidation-reduction reactions. For example, in the case using the hafnium oxide, it has been verified that the resistance value of the variable resistance layer can stably change at high speed when x in the composition $HfO_x$ of the low density oxide layer 521 is 0.9 or more and 1.6 or less and y in the composition $HfO_y$ of the high density oxide layer 522 is larger than x. In this case, the thickness of the high density oxide layer 522 is preferably 3 nm or more and 4 nm or less in thickness. Alternatively, in the case using the zirconium oxide, it has been verified that the resistance value of the variable resistance layer can stably change at high speed when x in the composition $ZrO_x$ of the low density oxide layer 521 is 0.9 or more and 1.4 or less and y in the composition $ZrO_y$ of the high density oxide layer 522 is larger than x. In this case, the thickness of the high density oxide layer 522 is preferably 1 nm or more and 5 nm or less. By forming the variable resistance layer as above which has a layered structure: the high density oxide layer 522 that has high resistance and a small thickness; and the low density oxide layer 521 that has low resistance, the voltage applied to the variable resistance element is distributed more to the high density oxide layer 522 that has high resistance, which allows the oxidation-reduction in the high density oxide layer 522 to be more likely to occur.

Furthermore, a first metal included in the low density oxide layer 521 and a second transition metal included in the high density oxide layer 522 may include different materials. In this case, the high density oxide layer 522 may have a lower degree of oxygen deficiency, that is, a higher degree of resistance, than the low density oxide layer 521. With this structure, the voltage applied to the variable resistance layer at the time of a change in resistance is distributed more to the high density oxide layer 522, which allows the oxidation-reduction reaction in the high density oxide layer 522 to be more likely to occur.

When the first metal and the second metal include different materials, the standard electrode potential of the second metal may be smaller than the standard electrode potential of the first metal. A resistance change phenomenon presumably occurs by a change in a filament (a conductive path) caused by an oxidation-reduction reaction in a miniscule local area formed in the high density oxide layer 522 having high resistance, which reaction changes the value of resistance (degree of oxygen deficiency).

For example, when the low density oxide layer 521 includes an oxygen-deficient tantalum oxide and the high density oxide layer 522 includes a titanium oxide ($TiO_2$), stable resistance change operation is achieved. Titanium (with the standard electrode potential=−1.63 eV) is a material having a lower standard electrode potential than tantalum (with the standard electrode potential=−0.6 eV). The standard electrode potential having a larger value represents a property of being more difficult to oxidize. Providing, as the high density oxide layer 522, an oxide of a metal having a lower standard electrode potential than the standard electrode potential of the low density oxide layer 521 makes an oxidation-reduction reaction more likely to occur in the high density oxide layer 522. It is to be noted that as another combination, an aluminum oxide ($Al_2O_3$) can be used for the high density oxide layer 522 that is a high resistance layer. For example, the low density oxide layer 521 may include an oxygen-deficient tantalum oxide ($TaO_x$) and the high density oxide layer 522 may include an aluminum oxide ($Al_2O_3$).

As a material of the semiconductor layer 530 forming an MSM diode, nitrogen-deficient silicon nitride ($SiN_x$) is used. Such an $SiN_x$ film having such a semiconductor property can be formed by reactive sputtering which uses an Si target in a nitrogen gas atmosphere, for example. For example, under a production condition at room temperature, the pressure of the chamber is set to 0.1 Pa to 1 Pa, and the flow rate $Ar/N_2$ is set to 18 sccm/2 sccm.

In the case where 16 nm-thick $SiN_x$ having a semiconductor property was fabricated under the above condition, the application of voltage 1.6 V resulted in current density $2.5\times 10^3$ $A/cm^2$ while the application of voltage 0.8 V resulted in current density $5\times 10^2$ $A/cm^2$. Thus, it has been verified that, in the case where the above voltage is used as a reference, the ON/OFF ratio of current is 5, which means that the resultant is sufficiently usable as the diode element in the nonvolatile semiconductor memory device 1000.

As a material of each of the first via 110 and the second via 112, W is used.

Examples of an interlayer dielectric 501 include a TEOS—SiO film, a silicon nitride (SiN) film, a low dielectric constant material, such as a silicon carbonitride (SiCN) film or a silicon oxycarbide (SiOC) film, or a fluorinated silicon oxide (SiOF) film. Furthermore, a layered structure in which these materials are stacked may be used. Herein, the TEOS—SiO film is used.

As the word lines 2 and the bit lines 3, copper (Cu) lines, aluminum-copper alloy (Al—Cu) lines, and the like which are used in typical semiconductors can be used. Herein, the Al—Cu lines are used.

The resistance value of the variable resistance element 570 with the above structure right after manufacture (the initial resistance value) is higher than a resistance value thereof in a high resistance state (HR state) at the time of normal resistance change operation. In order for the unoperated element after manufacture (in the state where no memory operation has been performed yet) to be placed in a state where the resistance change operation (the memory operation) is possible, there is a need for initial breakdown (that is operation to apply voltage higher than a voltage which is applied in the normal resistance change operation, to thereby place the element in a state where the memory operation is possible (generally to lower the resistance)).

Since the variable resistance element 570 which is used as a memory cell 4 for storing data needs to be subjected to the initial breakdown. However, if a certain resistance variable element is not subjected to the initial breakdown intentionally, the resistance value of the memory cell 4 including the resistance variable element 570 is higher than a resistance value thereof in a high resistance state (HR state) when a normal resistance change operation is performed. Therefore, the variable resistance element 570 can be used as the offset current detection cell 5. Thus, in the case where the variable resistance element 570 in FIG. 4 is used, it is possible to manufacture the memory cell 4 and the offset current detection cell 5 by selecting whether to perform the initial breakdown. In other words, it may be that the memory cell 4 is a cell on which the initial breakdown for causing the memory element to operate as a memory has been performed after manufacture, while the offset current detection cell 5 is a cell which has the same structure as the memory cell 4 and on which no initial breakdown has been performed after manufacture. Thus, there is an advantage of widening the variety of choices for circuit design because which cell is to be used as the offset current detection cell 5 can be selected after manufacture. Furthermore, there is no difference in the manufacturing process between the memory call 4 and the offset current detection cell 5, with the result that the influence of a layout difference between the memory cell 4 and the offset current detection cell 5 on the size of the finished product can be eliminated.

It is to be noted that the effects obtained in the case where the variable resistance element 570 in FIG. 4 is used are not limited to this embodiment only and are seen in the later-described Embodiments 2 and 3.

FIG. 5 shows the voltage-current property (curve A) in the resistance change operation after the initial breakdown is completed in the memory cell 4 shown in FIG. 4. The voltage in a horizontal axis shows a positive voltage when the potential of the bit line 3 is higher than the potential of the word line 2, and a negative voltage when the potential of the bit line 3 is lower than the potential of the word line 2. The resistance of the variable resistance element 570 changes from the LR state to the HR state by the application of voltage in a positive direction, and changes from the HR state to the LR state by the application of voltage in a negative direction. At this time, for a stable performance of the resistance change operation, it is necessary to control such that (i) the maximum current $I_{HR}$ for changing the resistance from the LR state to the HR state and (ii) the minimum current $I_{LR}$ for changing the resistance from the HR state to the LR state are always constant.

Hereafter, the change of the resistance value of the variable resistance element included in the memory cell 4 from the HR state to the LR state by the application of a voltage to between the word line 2 and the bit line 3 of the memory cell 4 is described as writing the LR state into the memory cell 4, and the change of the resistance value of the variable resistance element included in the memory cell 4 from the LR state to the HR state is described as writing the HR state into the memory cell 4.

FIG. 5 also shows the current flowing when the voltage is applied between the bit line 3 and the word line 2 for writing the HR state and the LR state into the memory cell 4 (curve A) and sneak current flowing at that time (curve B) when the cross-point cell array 1 is formed with the memory cell 4 shown in FIG. 4.

The sneak current in FIG. 5 is an example, and the voltage-current property of the memory element 111 changes depending on the state of data stored in the cross-point cell array 1 (the resistance value of the memory element 111 included in all the memory cells 4 within the cross-point cell array 1 to which the memory cell 4 that is a write target belongs, and the distribution of the value). Therefore, since the sneak current changes even when the output of the circuit generating a write signal for writing the HR state and the LR state into the memory cell 4 is controlled to a constant current, the current actually flowing through the memory cell 4 also changes and it is impossible to perform a stable write operation.

In order to solve the problem, the output of the circuit generating a write signal needs to be controlled such that by detecting sneak current ($I_{offsetHR}$ and $I_{offsetLR}$) in advance, the current is obtained by adding, to the sneak current, the current flowing through the write target memory cell 4 ($I_{HR}$ and $I_{LR}$).

[LR Write Method]

Next, with reference to FIGS. 6 and 7, a method for writing the LR state into the memory cell 4 in the nonvolatile semiconductor memory device 1000a according to the present embodiment will be described.

FIGS. 6 and 7 are each a diagram for explaining the write method for writing a low resistance state into the nonvolatile semiconductor memory device 1000a according to the present embodiment.

First, an example of the structure of the nonvolatile semiconductor memory device 1000a for use in the LR write will be described. The structure of the nonvolatile semiconductor memory device 1000*a* is the same as the structure of the nonvolatile semiconductor memory device 1000 shown in FIG. 1.

In other words, as shown in FIG. 6, the nonvolatile semiconductor memory device 1000*a*, as similarly to the nonvolatile semiconductor memory device 1000 shown in FIG. 1, includes the cross-point cell array 1, the word lines 2, the bit lines 3, the word line selection circuit 10, and the bit line selection circuit H.

Moreover, the nonvolatile semiconductor memory device 1000*a* includes: a write control circuit A 22*a* which is connected to the selected word line 2 via the word line selection circuit 10 and outputs a write electrical signal to the word line 2 selected by the word line selection circuit 10; a current sensing circuit A 21*a* which is connected to the bit lines 3 via the bit line selection circuit 11, detects sneak current flowing through the bit line 3 selected by the bit line selection circuit 11, and converts it into an offset electrical signal that is an electrical signal corresponding to the magnitude of the sneak current; and an offset current value holding circuit A 23*a* which stores an offset electrical signal.

The current sensing circuit A 21*a* measures and temporarily stores sneak current by selecting the offset current detection cell 5, and controls the write control circuit A 22*a* for causing, to flow through the selected memory cell 4, a second write current obtained by adding the sneak current to a predetermined first write current of the selected memory cell 4.

In other words, the write control circuit A 22*a* operates as a variable voltage source which generates a constant potential in a direction in which current flows from the word line 2 to the bit line 3 as necessary (described later), and as a variable pulse current source for causing a constant pulse current in which a peak current is constant to flow from the word line 2 to the bit line 3.

The current sensing circuit A 21*a* converts the sneak current flowing into from the bit line 3 into an electrical signal that corresponds to the magnitude of the sneak current flowing into from the bit line 3, and outputs the converted electrical signal (offset electrical signal) to the offset current value holding circuit A 23*a*. The outputted offset electrical signal is stored in the offset current value holding circuit A 23*a*. The offset current value holding circuit A 23*a* has a function of outputting, as necessary, the offset electrical signal to the write control circuit A 22*a*.

The following cites, as an example, an operation of writing the LR state into the write target cell (the memory cell to be written) 4*a*, and describes a sequence thereof.

First, as shown in FIG. 6, the word line selection circuit 10, by selecting the word line WLi connected to the offset current detection cell 5 from among the word lines 2, connects the offset current detection cell 5 to the write control circuit A 22*a*, while leaving the other word lines in the disconnected state. Next, the bit line selection circuit 11, by selecting the bit line BLj connected to the offset current detection cell 5 from among the bit lines 3, connects the offset current detection cell 5 to the current sensing circuit A 21*a* while leaving the other bit lines 3 in the disconnected state.

Next, by outputting a voltage from the write control circuit A 22*a*, a current is caused to flow from the word line WLi in a direction of the bit line BLj via the offset current detection cell 5, and the current sensing circuit A 21*a* detects the current in the bit line BLj at that time. At this time, the difference between the voltage outputted from the write control circuit A 22*a* and the voltage of the bit line BLj (the voltage of an input portion of the current sensing circuit A 21*a* that is different depending on the circuit standard for the current sensing circuit A 21*a*) is the first voltage to be applied to the offset current detection cell 5. With this, the potential of the word line connected to the offset current detection cell 5 is higher than the potential of the bit line connected to the offset current detection cell 5. If the first voltage, in the curve A in FIG. 5, is the same as the voltage $V_{LR}$ that is the voltage necessary to change the state of the memory cell 4 from the HR state to the LR state, the current detected by the current sensing circuit A 21*a* matches the sneak current actually flowing when writing the LR state into the memory cell 4. When the first voltage is smaller than $V_{LR}$, the current detected by the current sensing circuit A 21*a* is smaller than the sneak current actually flowing when actually writing the LR state into the memory cell 4. Since the trend of the magnitude of the current detected by the current sensing circuit A 21*a* reflects the trend of the actual sneak current, it is possible to stabilize the sneak current by adjusting the output current of the write control circuit A 22*a* with the current detected by the current sensing circuit A 21*a*. Moreover, if the voltage-current property of the memory cell 4 is obtained in advance, the value of $V_{LR}$ can be detected from the property. The $V_{LR}$ may be set on a memory cell array-by-memory cell array basis, and does not have to be changed for each of the memory cells.

The sneak current is hardly influenced by the data stored in the write target cell 4*a*, and changes depending on the data stored in all the memory cells 4 excluding the write target memory cell 4*a* included in the cross-point cell array 1. Moreover, the sneak current is the largest when all the other memory cells 4 excluding the write memory target cell 4*a* are in the LR state, and is the smallest when all the memory cells 4 excluding the write target memory cell 4*a* are in the HR state. Moreover, when the size of the cross-point cell array 1 is larger, the sneak current component ($I_{SNEAK}$) increases. In other words, the sneak current not only changes depending on the size of the cross-point cell array 1 but also dynamically changes depending on the data stored in the cross-point cell array 1.

When the voltage of $V_{LR}$ is applied to between the bit line BLj and the word line WLi connected to the offset current detection cell 5, the current ($I_{offsetLR}$) flowing into from the current sensing circuit A 21*a* from the bit line BLj is (the current flowing through the offset current detection cell 5+sneak current). However, when the offset current detection cell 5 has a structure like the structure shown in FIGS. 2 and 3, the current flowing through the offset current detection cell 5 is nearly zero. Therefore, $I_{offsetLR}$ is only the sneak current. Although the sneak current detected by the offset current detection cell 5 do not completely match the sneak current flowing when writing the LR state into the write target memory cell 4*a*, the difference is smaller when the size of the cross-point cell array 1 is larger. In other words, $I_{offsetLR}$ is almost equal to the sneak current generated when the LR state is written into the write target memory cell 4*a* in the cross-point cell array 1 that dynamically changes. Therefore, using the offset current detection cell 5, it is possible to sequentially detect the dynamically changing sneak current.

Next, the current sensing circuit A 21*a* outputs the offset electrical signal $S_{offsetLR}$ that corresponds to the magnitude of the current $I_{offsetLR}$, and the offset electrical signal $S_{offsetLR}$ is stored in the offset current value holding circuit A 23*a*. The offset electrical signal $S_{offsetLR}$ outputted from the current sensing circuit A 21*a* may be an electrical signal that changes corresponding to the magnitude of current inputted into the current sensing circuit A 21*a*, and may be selected freely depending on which type of circuit is used for the offset current value holding circuit A 23*a*. For example, the amplitude of current or voltage, or the pulse width or pulse density of the pulsed current or voltage may be used.

Next, the voltage output of the write control circuit A 22a is stopped. Next, as shown in FIG. 7, the word line selection circuit 10, by selecting the word line WLm connected to the write target cell 4a from among the word lines 2, connects the write target cell 4a to the write control circuit A 22a while leaving the other word lines 2 in the disconnected state, for example. Next, the bit line selection circuit 11, by selecting the bit line BLn connected to the write target cell 4a from among the bit lines 3, connects the write target cell 4a to the current sensing circuit A 21a while leaving the other bit lines 3 in the disconnected state, for example. A voltage which turns off the switching element may be applied to the unselected word lines 2 and the unselected bit lines 3.

Next, the offset electrical signal $S_{\textit{offsetLR}}$ stored in the offset current value holding circuit A 23a is outputted from the offset current value holding circuit A 23a to the write control circuit A 22a. The write control circuit A 22a adjusts the write electrical signal and outputs it to the word line WLm such that the current outputted from the write control circuit A 22a is a current ($I_{LR}+I_{\textit{offsetLR}}$) equal to the sum of (i) the current $I_{LR}$ necessary to write the LR state into the write target cell 4a and (ii) the sneak current $I_{\textit{offsetLR}}$ calculated from the offset electrical signal $S_{\textit{offsetLR}}$. At this time, the write control circuit A 22a operates as a constant current source.

More specifically, when the magnitude of the sneak current detected by the current sensing circuit A 21a is small, for example, when the magnitude of the detected sneak current is less than one-tenth of the current $I_{LR}$ (first current) necessary to write the LR state into the write target cell 4a, the sneak current can be neglected and the write current $I_{LR}$ is outputted to the word line WLm. Moreover, when the magnitude of the sneak current detected by the current sensing circuit A 21a is large, for example, when the magnitude of the detected sneak current is greater than or equal to one-tenth of the current (second current) necessary to write the LR state into the write target cell 4a, the current ($I_{LR}$ $I_{\textit{offsetLR}}$) (second write current) equal to the sum of (i) the current $I_{LR}$ necessary to write the LR state into the write target cell 4a and (ii) the sneak current $I_{\textit{offsetLR}}$ calculated from the offset electrical signal $S_{\textit{offsetLR}}$ is outputted to the word line WLm. Moreover, for offsetting the error between the sneak current actually flowing when writing into the memory cells and the sneak current detected by the offset current detection cell, it is possible to multiply $I_{\textit{offsetLR}}$ by the predetermined constant factor (for example 0.9 to 1.1) and then the product may be added to $I_{LR}$.

As shown in the present embodiment, by controlling the output current of the write control circuit A 22a to ($I_{LR}+I_{\textit{offsetLR}}$), the current almost equal to $I_{LR}$ flows in the write target cell 4a without the influence of the data stored in the cross-point cell array 1 and it is possible to perform a stable write operation.

[Flowchart of Operation of Writing into LR State]

FIG. 8 is a flowchart showing a sequence of writing the LR state into the write target cell 4a in the nonvolatile semiconductor memory device 1000a according to Embodiment 1 of the present invention.

As described above, in order to write the LR state into the write target cell 4a, it is necessary to select the offset current detection cell 5 and detect the sneak current in advance, and then store the offset electrical signal $S_{\textit{offsetLR}}$ in the offset current value holding circuit A 23a. It is desirable that since the offset electrical signal $S_{\textit{offsetLR}}$ dynamically changes depending on the data stored in the cross-point cell array 1, the offset electrical signal $S_{\textit{offsetLR}}$ is detected for each of the write operations. However, when the size of the cross-point cell array 1 is sufficiently large and the change in sneak current by one write operation is negligibly small, the step of detecting the offset electrical signal $S_{\textit{offsetLR}}$ may be omitted by using the same offset electrical signal $S_{\textit{offsetLR}}$ in a plurality of writing operations of the LR state.

First, when the write operation of the LR state into the memory cell (write target cell) 4a is requested, the word line selection circuit 10 selects the word line WLi connected to the offset current detection cell 5 for detecting the offset electrical signal $S_{\textit{offsetLR}}$ (F111L: Process A).

Next, the bit line selection circuit 11 selects the bit line BLj connected to the offset current detection cell 5 (F112L: Process A). Here, the order of F111 and F112L may be reversed. Next, the voltage higher than the voltage (offset current detection voltage) of the bit line BLj by the voltage $V_{LR}$ is outputted from the write control circuit A 22a to the word line WLi, the magnitude of the current flowing through the bit line BLj is detected by the current sensing circuit A 21a (F113L: the first half of Process B).

Next, the current sensing circuit A 21a converts the detected magnitude of current into the offset electrical signal $S_{\textit{OffsetLR}}$ (F114L: the second half of Process B), and it is stored in the offset current value holding circuit A 23a (F114L: Process C). Furthermore, after the voltage output of the write control circuit A 22a is turned off (F115L), the word line selection circuit 10 selects the word line WLm connected to the write target cell 4a (F116L). Next, the bit line selection circuit 11 selects the bit line BLn (F117L). Here, the order of F116L and F117L may be reversed.

Next, the offset electrical signal $S_{\textit{offsetLR}}$ is transferred from the offset current value holding circuit A 23a to the write control circuit A 22a (F118L: Process D). The write control circuit A 22a adjusts the write electrical signal and outputs it to the word line WLm such that the current outputted from the write control circuit A 22a is a current ($I_{LR}+I_{\textit{offsetLR}}$) equal to the sum of (i) the current $I_{LR}$ necessary to write the LR state into the write target cell 4a and (ii) the sneak current $I_{\textit{offsetLR}}$ calculated from the offset electrical signal $S_{\textit{offsetLR}}$ (F118L: Process E).

The write operation of the LR state is completed.

[HR Write Method]

Next, with reference to FIGS. 9 and 10, a method for writing the HR state into the memory cell 4 in the nonvolatile semiconductor memory device 1000a according to the present embodiment will be described.

FIGS. 9 and 10 are each a diagram for explaining the write method for writing a high resistance state into the nonvolatile semiconductor memory device 1000a according to the present embodiment.

First, an example of the structure of the nonvolatile semiconductor memory device 1000a for use in the HR write will be described.

As shown in FIG. 9, the nonvolatile semiconductor memory device 1000a, as similarly to the nonvolatile semiconductor memory device 1000 shown in FIG. 1, includes the cross-point cell array 1, the word lines 2, the bit lines 3, the word line selection circuit 10, and the bit line selection circuit 11.

Moreover, the nonvolatile semiconductor memory device 1000a includes: a write control circuit A 22a which is connected to the word lines 2 via the word line selection circuit 10 and outputs a write electrical signal to the word line 2 selected by the word line selection circuit 10; a current sensing circuit A 21a which is connected to the selected bit line 3 via the bit line selection circuit 11, detects the sneak current flowing through the bit line 3 selected by the bit line selection circuit 11, and converts it into an offset electrical signal that is an electrical signal corresponding to the magnitude of the sneak current; and an offset current value holding circuit A 23a which stores the offset electrical signal.

The current sensing circuit A 21a measures and temporarily stores a sneak current by selecting the offset current detection cell 5, and controls the write control circuit A 22a for causing, to flow through the selected memory cell 4, a second write current obtained by adding the sneak current to a predetermined first write current of the selected memory cell 4.

In other words, the write control circuit A 22a operates as a variable voltage source which generates a constant potential in a direction in which current is caused to flow from the bit line 3 (described later) to the word line 2 as necessary, or as a variable pulse current source for causing a pulse current in which a peak current is constant to flow from the bit line 3 to the word line 2.

The current sensing circuit A 21a converts sneak current flowing out to the word line 2 into an electrical signal that corresponds to the magnitude of the sneak current flowing out to the word line 2, and outputs the converted electrical signal (offset electrical signal) to the offset current value holding circuit A 23a. The outputted offset electrical signal is stored in the offset current value holding circuit A 23a. The offset current value holding circuit A 23a has a function of outputting, as necessary, the offset electrical signal to the write control circuit A 22a.

The following will cite, as an example, an operation of writing the HR state into the write target cell (the memory cell to be written) 4a, and describe a sequence thereof.

First, as shown in FIG. 9, the word line selection circuit 10, by selecting the word line WLi connected to the offset current detection cell 5 from among the word lines 2, connects the offset current detection cell 5 to the write control circuit A 22a, while leaving the other word lines in the disconnected state, for example. Next, the bit line selection circuit 11, by selecting the bit line BLj connected to the offset current detection cell 5 from among the bit lines 3, connects the offset current detection cell 5 to the current sensing circuit A 21a while leaving the other bit lines 3 in the disconnected state, for example. A voltage which turns off the switching element may be applied to the unselected word lines 2 and the unselected bit lines 3.

Next, by outputting a voltage from the write control circuit A 22a, a current is caused to flow from the bit line BLj in a direction of the word line WLi via the offset current detection cell 5 and the current sensing circuit A 21a detects the current in the word line WLi at that time. At this time, the difference between the voltage outputted from the write control circuit A 22a and the voltage of the word line WLi (the voltage of an input portion of the current sensing circuit A 21a that is different depending on the circuit standard for the current sensing circuit A 21a) is the second voltage to be applied to the offset current detection cell 5. With this, the potential of the bit line connected to the offset current detection cell 5 is higher than the potential of the word line connected to the offset current detection cell 5.

If the second voltage, in the curve A in FIG. 5, is the same as the voltage $V_{HR}$ that is the voltage necessary to change the state of the memory cell 4 from the LR state to the HR state, the current detected by the current sensing circuit A 21a almost matches the sneak current actually flowing when writing the HR state into the memory cell 4. When the second voltage is lower than $V_{HR}$, the current detected by the current sensing circuit A 21a is smaller than the sneak current flowing when actually writing the HR state into the memory cell 4. Since the trend of the magnitude of the current detected by the current sensing circuit A 21a reflects the trend of the actual sneak current, it is possible to stabilize the write current by adjusting the output current of the write control circuit A 22a with the current detected by the current sensing circuit A 21a. Moreover, if the voltage-current property of the memory cell 4 is obtained in advance, the value of $V_{HR}$ can be detected from the property. The $V_{LR}$ may be set on a memory cell array-by-memory cell array basis, and does not have to be changed for each of the memory cells.

When the voltage of $V_{HR}$ is applied between the bit line $BL_j$ and the word line WLi connected to the offset current detection cell 5, the current ($I_{offsetHR}$) flowing into the current sensing circuit A 21a from the word line WLi is almost equal to the sneak current when the HR state is written.

Next, the current sensing circuit A 21a outputs the offset electrical signal $S_{offsetHR}$ that corresponds to the magnitude of the current $I_{offsetHR}$, and the offset electrical signal $S_{offsetHR}$ is stored in the offset current value holding circuit A 23a. The offset electrical signal $S_{offsetHR}$ outputted from the current sensing circuit A 21a may be an electrical signal that changes corresponding to the magnitude of current inputted into the current sensing circuit A 21a, and may be selected freely depending on which type of circuit is used for the offset current value holding circuit A 23a. For example, the amplitude of current or voltage, or the pulse width or pulse density of the pulsed current or voltage may be used.

Next, the voltage output of the write control circuit A 22a is stopped. Next, as shown in FIG. 10, the word line selection circuit 10, by selecting the word line WLm connected to the write target cell 4a from among the word lines 2, connects the write target cell 4a to the write control circuit A 22a while leaving other unselected word lines in the disconnected state, for example. Next, the bit line selection circuit 11, by selecting the bit line BLn connected to the write target cell 4a from among the bit lines 3, connects the write target cell 4a to the current sensing circuit A 21a while leaving the other unselected bit lines 3 in the disconnected state, for example. A voltage which turns off the switching element may be applied to the unselected word lines 2 and the unselected bit lines 3.

Next, the offset electrical signal $S_{offsetHR}$ stored in the offset current value holding circuit A 23a is outputted from the offset current value holding circuit A 23a to the write control circuit A 22a. The write control circuit A 22a adjusts the write electrical signal and outputs it to the bit line BLn such that the current outputted from the write control circuit A 22a is a current ($I_{HR}+I_{offsetHR}$) equal to the sum of (i) the current $I_{HR}$ necessary to write the HR state into the write target cell 4a and (ii) the sneak current $I_{offsetHR}$ calculated from the offset electrical signal $S_{offsetHR}$. At this time, the write control circuit A 22a operates as a constant current source.

More specifically, when the magnitude of the sneak current detected by the current sensing circuit A 21a is small, for example, when the magnitude of the detected sneak current is less than one-tenth of the current $I_{HR}$ (first current) necessary to write the HR state into the write target cell 4a, the sneak current can be neglected and the write current $I_{HR}$ (first write current) is outputted to the bit line BLn. Moreover, when the magnitude of the sneak current detected by the current sensing A 21a is large, for example, when the magnitude of the detected sneak current is more than or equal to one-tenth of the current $I_{HR}$ necessary to write the HR state into the write target cell 4a (second current), the current which is a current ($I_{HR}+I_{offsetHR}$) (second write current) equal to the sum of (i) the current $I_{HR}$ necessary to write the HR state into the write target cell 4a and (ii) the sneak current $I_{offsetHR}$ calculated from the offset electrical signal $S_{offsetHR}$ is outputted to the bit line BLn.

As shown in the present embodiment, by controlling the output current of the write control circuit A 22a to ($I_{HR}$ $I_{offsetHR}$), the current almost equal to $I_{HR}$ flows in the write target cell 4a without the influence of the data stored in the cross-point cell array 1 and it is possible to perform a stable write operation.

[Flowchart of Write Operation of HR State]

FIG. 11 is a flowchart showing a sequence of writing the HR state into the write target cell 4a in the nonvolatile semiconductor memory device 1000a according to the present embodiment.

As described above, in order to write the HR state into the write target cell 4a, it is necessary to select the offset current detection cell 5 and detect the sneak current in advance, and then store the offset electrical signal $S_{offsetHR}$ in the offset current value holding circuit A 23a. It is desirable that since the offset electrical signal $S_{offsetHR}$ dynamically changes depending on the data stored in the cross-point cell array 1, the offset electrical signal $S_{offsetHR}$ is detected for each of the write operations. However, when the size of the cross-point cell array 1 is sufficiently large and the change in sneak current by one write operation is negligibly small, the step of detecting the offset electrical signal $S_{offsetHR}$ may be omitted by using the same offset electrical signal $S_{offsetHR}$ in a plurality of writing operations of the HR state.

First, when the write operation of the HR state into the memory cell (write target cell) 4a is requested, the word line selection circuit 10 selects the word line WLi connected to the offset current detection cell 5 for detecting the offset electrical signal $S_{offsetHR}$ (F111H: Process A).

Next, the bit line selection circuit 11 selects the bit line BLn connected to the offset current detection cell 5 (F112H: Process A). Here, the order of F111H and F112H may be reversed.

Next, the voltage lower than the voltage (offset current detection voltage) of the bit line BLj by the voltage $V_{HR}$ is outputted from the write control circuit A 22a to the word line WLi, the magnitude of the current flowing through the bit line BLj is detected by the current sensing circuit A 21a (F113H: the first half of Process B).

Next, the current sensing circuit A 21a converts the detected magnitude of current into the offset electrical signal $S_{offsetHR}$ (F114H: the second half of Process B), and it is stored in the offset current value holding circuit A 23a (F114H: Process C). Furthermore, after the voltage output of the write control circuit A 22a is turned off (F115H), the word line selection circuit 10 selects the word line WLm connected to the write target cell 4a (F116H).

Next, the bit line selection circuit 11 selects the bit line BLn (F117H). Here, the order of F116H and F117H may be reversed. Next, the offset electrical signal $S_{offsetHR}$ is transferred from the offset current value holding circuit A 23a to the write control circuit A 22a (F118H: Process D). The write control circuit A 22a adjusts the write electrical signal and outputs it to the word line WLm such that the current outputted from the write control circuit A 22a is a current ($I_{HP}$+ $I_{offsetHR}$) equal to the sum of (0 the current $I_{HR}$ necessary to write the HR state into the write target cell 4a and (ii) the sneak current $I_{offsetHR}$ calculated from the offset electrical signal $S_{offsetHR}$ (F118H: Process E).

As described above, the write operation of the HR state is completed.

In the present embodiment, since the sneak current generated in the cross-point cell array during a write operation is detected and then the write operation is performed on the memory cell by compensating the electrical signal by the amount of the sneak current, the current almost equal to the current flowing through the memory element for writing into the write target cell 4a without the influence of the data stored in the cross-point cell array flows through the write target memory cell 4a, and it is possible to perform a stable write operation.

FIG. 12 is a schematic view showing another structure of the nonvolatile semiconductor memory device according to the present embodiment. For example, as shown in FIG. 12, a nonvolatile semiconductor memory device 1000c may be a structure in which a current sensing circuit A/write control circuit B 25 having the function of the current sensing circuit and the write control circuit is connected to the bit line 3, a current sensing circuit B/write control circuit A 26 having the function of the current sensing circuit and the function of the write control circuit to the word line 2, and in which when one of the current sensing circuit A/write control circuit B 25 and the current sensing circuit B/write control circuit A 26 is used as a current sensing circuit, the other is used as a write control circuit.

The current sensing circuit A/write control circuit B 25 converts the sneak current flowing out to the word line 2 into an electrical signal that corresponds to the magnitude of the sneak current flowing out to the word line 2, and outputs the converted electrical signal (offset electrical signal) to the offset current value holding circuit A 23a. The outputted offset electrical signal is stored in the offset current value holding circuit A 23a. The offset current value holding circuit A 23a has a function of outputting, as necessary, the offset electrical signal to the current sensing circuit B/write control circuit A 26.

Similarly, the current sensing circuit B/write control circuit A 26 converts the sneak current flowing out to the bit line 3 into an electrical signal that corresponds to the magnitude of the sneak current flowing out to the bit line 3, and outputs the converted electrical signal (offset electrical signal) to the offset current value holding circuit B 23b. The outputted offset electrical signal is stored in the offset current value holding circuit B 23b. The offset current value holding circuit B 23b has a function of outputting, as necessary, the offset electrical signal to the current sensing circuit A/write control circuit B 25.

The above is described a write method for writing into the memory cell 4 in the case where the total number of the offset current detection cells 5 included in the cross-point cell array 1 is one. However, the present invention is not limited to the case where the total number of the offset current detection cells 5 is one. When (i) the size of the cross-point cell array 1 is substantially large and (ii) the influence, on the sneak current, of the distribution of potentials at the word line 2 and the bit line 3 generated by the voltage drop at the wiring resistance of the word line 2 or the bit line 3 is not negligible, the cross-point cell array 1 is further divided into sub-regions, one offset current detection cell 5 is provided for each of the sub-regions, the offset electrical signal is detected for each of the sub-regions, and it can be used as adjustment of the current value outputted from the write control circuit, Embodiment 2

Device Structure

FIG. 13 is a schematic view showing an example of the structure of a nonvolatile semiconductor memory device 2000 according to Embodiment 2 of the present invention.

The difference of the nonvolatile semiconductor memory device 2000 according to the present embodiment from the nonvolatile semiconductor memory device 1000 according to Embodiment 1 is that the offset current detection cells 5 are provided within a cross-point cell array 201 such that a single offset current detection cell 5 is connected to a corresponding one of the word lines 2 and a corresponding one of the bit lines 3. In other words, in the present embodiment, the offset current detection cells 5 are provided within the cross-point cell array 201 such that a single offset current detection cell 5 is provided for each of the word lines 2 and a single offset current detection cell 5 is provided for each of the bit lines 3.

The structures of the memory cell 4 and the offset current detection cell 5 can be used with the structures of the memory cell 4 and the offset current detection cell 5 according to Embodiment 1 shown in FIG. 1.

By arranging the offset current detection cells 5 in this way, it is possible to detect the sneak current flowing when the LR state or the HR state is written into the write target cell 4a, as the current detected by the offset current detection cell 5 provided in the bit line 3 or the word line 2 which includes the write target cell (the memory cell to be written) 4a. With this, as compared to the case in Embodiment 1, the sneak current of the write target cell 4a can be detected with higher accuracy.

The nonvolatile semiconductor memory device 2000 according to the present embodiment, as shown in FIG. 13, includes: the word lines 2 formed in parallel to the first direction and in stripe shape; the bit lines 3 formed in stripe shape in the direction (the second direction) in which the bit lines 3 cross the word lines 2; and the cross-point cell array 201 formed at the cross-points, in a planar view, of the word lines 2 and the bit lines 3 and between the word lines 2 and the bit lines 3. Furthermore, the cross-point cell array 201 includes the memory cells 4 and the offset current detection cells 5. Furthermore, the offset current detection cell 5 is provided within the cross-point cell array 201 such that a single offset current detection cell 5 is connected to each of the word lines 2 and each of the bit lines 3. Although the offset current detection cells 5 in the cross-point cell array 201 of FIG. 13 are regularly arranged on, as the cross-points of the word lines 2 and the bit lines 3, a diagonal of the cross-point cell array 201 herein, the arrangement is not limited thereto, and as long as a single offset current detection cell is connected to each of the word lines 2 and each of the bit lines 3, the arrangement of the offset current detection cells is not limited to the arrangement on the diagonal of the cross-point cell array 201.

The word line selection circuit 10, the bit line selection circuit 11, the current sensing circuit A 21a, and the write control circuit A 22a, the offset current value holding circuit A 23a included in the nonvolatile semiconductor memory device 2000 according to the present embodiment may be the same as those described in Embodiment 1.

[Write Method]

A write method for use in the nonvolatile semiconductor memory device 2000 according to the present embodiment is almost the same as the write method for use in the nonvolatile semiconductor memory device 1000 according to Embodiment 1 of the present invention, and only the differences between Embodiment 2 and Embodiment 1 in the present invention are therefore described below.

A difference in the write method between the nonvolatile semiconductor memory devices 2000 according to Embodiment 2 and the nonvolatile semiconductor memory device 1000 according to Embodiment 1 is that the word line and the bit line which the word line selection circuit 10 and the bit line selection circuit 11 select, respectively, upon detecting of the offset electrical signal $S_{offsetLR}$, are different.

In the nonvolatile semiconductor memory device 1000 according to Embodiment 1, independently of the position of the write target cell 4a within the cross-point cell array 1, the same word line and the same bit line are always selected upon detecting of the offset electrical signal. In contrast, in the nonvolatile semiconductor memory device 2000 according to the present embodiment, the word line to which the write target cell 4a, for example, is connected is selected upon detecting of the offset electrical signal. Furthermore, the bit line which is connected to the offset current detection cell 5 provided at the selected word line is selected. It is to be noted that the same effects can be obtained even when the bit line to which the write target cell 4a is connected is selected and then the word line which is connected to the offset current detection cell 5 provided at the selected bit line is selected.

In other words, in the present embodiment, the current sensing circuit A 21a detects a sneak current from the memory cell 4 in one of the following methods.

The bit line selection circuit 11 selects the bit line provided with the write target memory cell and the offset current detection cell 5, as the bit line selected upon detecting of the sneak current in the current sensing circuit A 21a. With this, by applying a voltage between (i) the selected bit line and (ii) the word line connected to the offset current detection cell 5 connected to the selected bit line 3, the current sensing circuit A 21a detects the sneak current $I_{offsetLR}$. The sneak current $I_{offsetLR}$ has a value close to the value of the sneak current flowing when the LR state is written into the write target cell.

The sneak current flowing when the LR state or the HR state is written into the write target cell changes depending on the data stored in the memory cell 4 included in the cross-point cell array 201, and is influenced more by the data stored in the memory cell 4 provided at the bit line 3 and the word line 2 which are connected to the write target cell 4a than by the data stored in the other memory cells 4.

In the nonvolatile semiconductor memory device 2000 according to the present embodiment, since the write target cell 4a and the offset current detection cell 5 share one of the word line 2 and the bit line 3, $I_{offsetLR}$ detected by the offset current detection cell 5 has a value close to the value of the sneak current flowing when the LR state or the HR state is written into the write target cell. Therefore, the current flowing through the write target cell can be maintained at a constant value with higher accuracy.

It is to be noted that in the nonvolatile semiconductor memory device 2000 according to the above described present embodiment, when the LR state is written, as shown in FIG. 13, the write control circuit A 22a is connected to the word line 2, and the current sensing circuit A 21a is connected to the bit line 3. However, the structure of the nonvolatile semiconductor memory device 2000 is not limited to these.

For example, when the HR state is written, the structure of the nonvolatile semiconductor memory device 2000 on the detecting of the offset electrical signal $S_{offsetHR}$ may be the structure in which the write control circuit B (not illustrated) is connected to the bit line 3, the current sensing circuit B (not illustrated) is connected to the word line 2, and the offset current value holding circuit B (not illustrated) is included. In this case, the word line selection circuit 10 selects the word line provided with the write target memory cell and the offset current detection cell 5, as the word line selected upon detecting of the sneak current in the current sensing circuit B. With this, by applying a voltage between the selected word line and the bit line connected to the offset current detection cell 5 connected to the selected word line, the current sensing circuit B detects the sneak current $I_{offsetLR}$. The sneak current $I_{offsetHR}$ has a value close to the value of the sneak current flowing when the HR state is written into the write target cell.

Moreover, the structure is acceptable in which the current sensing circuit A/write control circuit B (not illustrated) having the function of the current sensing circuit and the function of the write control circuit is connected to the bit line 3, the current sensing circuit B/write control circuit A (not illustrated) having the function of the current sensing circuit and the function of the write control circuit is connected to the word line 2, and in which when one of them is used as the current sensing circuit, the other is used as the write control circuit.

(Variation of Embodiment 2)

[Device Structure]

FIG. 14 is a diagram showing an example of the structure of a nonvolatile semiconductor memory device 2000a according Variation of Embodiment 2 of the present invention.

A difference between the nonvolatile semiconductor memory device 2000a according to this variation and the nonvolatile semiconductor memory device 2000 according to Embodiment 2 is that the sneak current is detected with reference to two currents: a current detected by the offset current detection cell 5 provided at the word line 2 to which the write target cell (the memory cell to be written) 4a is connected; and a current detected by the offset current detection cell 5 provided at the bit line 3 to which the write target cell 4a is connected. With this, as compared to the case in Embodiment 2, an effect is obtained in which the sneak current flowing when the LR state or the HR state is written into the write target cell 4a can be detected with higher accuracy.

The cross-point cell array 201, the word line selection circuit 10, the bit line selection circuit 11, the current sensing circuit A 121, and the write control circuit A 122 may be the same as those of the nonvolatile semiconductor memory device 2000 according to Embodiment 2.

The nonvolatile semiconductor memory device 2000a in FIG. 14 further includes (i) an offset current value holding circuit A 123 composed of an offset current value holding circuit (A1) 123a and an offset current value holding circuit (A2) 123b and (ii) an offset current arithmetic circuit A 125. It is to be noted that the offset current value holding circuit (A1) 123a corresponds to the first offset current holding circuit according to the present invention, and the offset current value holding circuit (A2) 123b corresponds to the second offset current holding circuit according to the present invention.

The current sensing circuit A 121 outputs the offset electrical signal resulting from the conversion corresponding to the magnitude of the current flowing into from the bit line 3, to the offset current value holding circuit (A1) 123a or the offset current value holding circuit (A2) 123b. The offset electrical signal is stored in the offset current value holding circuit (A1) 123a or the offset current value holding circuit (A2) 123b. The offset current value holding circuit (A1) 123a and the offset current value holding circuit (A2) 123b have a function of outputting, as necessary, the stored offset electrical signal to the offset current arithmetic circuit A 125. The offset current arithmetic circuit A 125 has a function of performing operation on the average of two offset electrical signals outputted from the offset current value holding circuit (A1) 123a and the offset current value holding circuit (A2) 123b, and then outputting the operation result (average offset electrical signal) to the write control circuit A 122.

[LR Write Method]

Next, with reference to FIGS. 15 to 17, a write method for writing the LR state into the memory cell 4 in the nonvolatile semiconductor memory device 2000a according to the present variation will be described.

FIGS. 15 to 17 are each a diagram for explaining the write method for the nonvolatile semiconductor memory device 2000a according to the present variation. The following cites, as an example, the operation to write the LR state into the write target cell 4a and describes a sequence thereof.

Next, as shown in FIG. 15, the word line selection circuit 10, by selecting the word line WLi connected to the write target cell 4a from among the word lines 2, connects the write target cell 4a to the write control circuit A 122 while leaving other unselected word lines 2 in the disconnected state, for example. Next, the bit line selection circuit 11, by selecting the bit line BLj connected to the offset current detection cell 5 provided at the word line WLi, connects the bit line BLj to the current sensing circuit A 121 while leaving the other bit lines 3 in the disconnected state, for example. A voltage which turns off the switching element may be applied to the unselected word lines 2 and the unselected bit lines 3.

Next, by outputting a voltage from the write control circuit A 122, a current is caused to flow from the word line WLi in a direction of the bit line BLj via the offset current detection cell 5 and the current sensing circuit A 121 detects the current $I_{offsetR1}$ in the bit line BLj at that time. At this time, the voltage (first voltage) outputted from the write control circuit A 122 is set such that the potential of the bit line BLj is higher than the potential of the word line WLi by the voltage $V_{LR}$. The voltage $V_{LR}$ may be set on a per memory array cell basis, and does not have to be changed for each of the memory cells.

Next, the current sensing circuit A 121 outputs the offset electrical signal $S_{offsetR1}$ that corresponds to the magnitude of the current $I_{offsetR1}$, and the offset electrical signal $S_{offsetR1}$ is stored in the offset current value holding circuit (A1) 123a. The offset electrical signal outputted from the current sensing circuit A 121 may be an electrical signal that changes corresponding to the magnitude of a current inputted into the current sensing circuit A 121, and may be selected freely depending on which type of circuit is used for the offset current value holding circuit A 123. For example, the amplitude of current and voltage, or a pulse-shaped current or the pulse width and pulse density of voltage can be used.

Next, the voltage output of the write control circuit A 122 is stopped. Next, as shown in FIG. 16, the bit line selection circuit 11, by selecting the bit line BLn connected to the write target cell 4a from among the bit lines 3, connects the write target cell 4a to the current sensing circuit A 121 while leaving the other bit lines 3 in the disconnected state, for example. Next, the word line selection circuit 10, by selecting the word line WLm connected to the offset current detection cell 5 provided at the bit line BLn, connects the word line WLm to the write control circuit A 122, while leaving the other word lines 2 in the disconnected state, for example. A voltage which turns off the switching element may be applied to the unselected word lines 2 and the unselected bit lines 3.

Next, by outputting a voltage from the write control circuit A 122, a current is caused to flow from the word line WLm in a direction of the bit line BLn, and the current sensing circuit A 121 detects the current $I_{offsetLR2}$ in the bit line BLn at that time. At this time, the voltage outputted from the write control circuit A 122 is set such that the potential of the bit line BLn is higher than the potential of the word line WLm by the voltage $V_{LR}$. The $V_{LR}$ may be set on a memory cell array-by-memory cell array basis, and does not have to be changed for each of the memory cells.

Next, the current sensing circuit A 121 outputs the offset electrical signal $S_{offsetLR2}$ that corresponds to the magnitude of the current $I_{offsetLR}$, and the offset electrical signal $S_{offsetLR2}$ is stored in the offset current value holding circuit (A2) 123b.

Next, the voltage output of the write control circuit A 122 is stopped. Next, as shown in FIG. 17, the word line selection circuit 10, by selecting the word line WLi connected to the write target cell 4a from among the word lines 2, connects the write target cell 4a to the write control circuit A 122 while leaving other unselected word lines in the disconnected state, for example.

Next, the offset electrical signal $S_{offsetLR1}$ and the offset electrical signal $S_{offsetLR2}$ stored in the offset current value holding circuit (A1) 123a and the offset current value holding circuit (A2) 123b, respectively, are outputted to the offset current value arithmetic circuit A 125. The offset current arithmetic circuit A 125 has a function of generating an offset electrical signal $S_{netLR}$ by referring to the two signals ($S_{offsetLR1}$, $S_{offsetLR2}$).

As the relationship between $S_{netLR}$, and $S_{offsetLR1}$ and $S_{offsetLR2}$, $S_{netLR}=(S_{offsetLR1}+S_{offsetLR2})/2$ is desirable. The offset current arithmetic circuit A 125 outputs the electrical signal $S_{netLR}$ to the write control circuit A 122. The write control circuit A 122 adjusts and outputs the write electrical signal to the word line WLi such that the current ($I_{LR}$ ($I_{offsetLR1}+I_{offsetLR2}$) 2) is equal to the sum of (i) the current $I_{LR}$ necessary to write the LR state into the write target cell 4a and (ii) the sneak current (($I_{offsetLR1}+I_{offsetLR2}$)/2) calculated from the offset electrical signal $S_{netLR}$. At this time, the write control circuit A 122 operates as a constant current source.

In the nonvolatile semiconductor memory device 2000a, since the average of (i) $I_{offsetLR1}$ detected by the offset current detection cell 5 provided at the word line 2 which includes the write target cell 4a and (ii) $I_{offsetLR2}$ detected by the offset current detection cell 5 provided at the bit line 3 which includes the write target cell 4a has a value close to the value of the sneak current flowing when writing the LR state into the write target cell 4a, it is possible to maintain the current flowing through the memory cell 111 included in the write target cell at a constant value with higher accuracy,

[Flowchart of Write Operation of LR State]

FIG. 18 is a flowchart showing a sequence of writing the LR state into the write target cell 4a in the nonvolatile semiconductor memory device 2000a according to the present variation.

As described above, for writing the LR state into the write target cell 4a, it is necessary to detect in advance the sneak current by selecting the offset current detection cell 5 and to store the offset electrical signal $S_{offsetLR1}$ in the offset current value holding circuit (A1) 123a and store the offset electrical signal $S_{offsetLR2}$ in the offset current value holding circuit (A2) 123b. Since the offset electrical signals $S_{offsetLR1}$ and $S_{offsetLR}$, dynamically change depending on the data stored in the cross-point cell array 201, it is desirable that the offset electrical signals are detected for each of the write operations. However, when the size of the cross-point cell array 201 is sufficiently large and the change in sneak current by a single write operation is negligibly small, the step of detecting the offset electrical signals $S_{offsetLR1}$ and $S_{offsetLR2}$ may be skipped by using the same offset electrical signal in the write operations of the LR state.

First, upon request of the write operation of the LR state into the memory cell (the write target cell) 4a, the word line selection circuit 10 selects the word line WLi connected to the write target cell 4a (F211L: Process F), and the bit line selection circuit 11 selects the bit line BLj connected to the offset current detection cell 5 provided at the word line WLi (F212L: Process F).

Next, the voltage (offset current detection voltage) higher than the voltage of the bit line BLj by the voltage $V_{LR}$ is outputted from the write control circuit A 122 to the word line WLi, and the current sensing circuit A 121 detects the magnitude of the current flowing through the bit line BLj at this time (F213L: the first half of Process G).

Next, the current sensing circuit A 121 converts the detected magnitude of current into the offset electrical signal $S_{offsetLR1}$ (F214L: the second half of Process G) and then it is stored in the offset current value holding circuit (A1) 123a (F214L: Process H). Furthermore, the voltage output of the write control circuit A 122 is turned off (F215L).

Next, the bit line selection circuit 11 selects the bit line BLn connected to the write target cell 4a (F216L: Process I), and then the word line selection circuit 10 selects the word line WLm connected to the offset current detection cell 5 provided at the bit line BLn (F217L: Process I).

Next, the voltage (offset current detection voltage) higher than the voltage of the bit line BLn by the voltage $V_{LR}$ is outputted from the write control circuit A 122 to the word line WLm, and the current sensing circuit A 121 detects the magnitude of the current flowing through the bit line BLn at this time (F218L: the first half of Process 3). The detected magnitude of current is converted into the offset electrical signal $S_{offsetLR2}$ (F219L: the second half of Process 3) and it is stored at the offset current value holding circuit (A2) 123b (F219L: Process K). Furthermore, the voltage output of the write control circuit A 122 is turned off (F220L).

Next, the word line selection circuit 10 selects the word line WLi connected to the write target cell 4a (F221L), and the bit line selection circuit 11 selects the bit line BLn connected to the write target cell 4a (F222L). Next, the offset electrical signal $S_{offsetLR1}$ and the offset electrical signal $S_{offsetLR2}$ are outputted to the offset current arithmetic circuit A 125, the average offset electrical signal of the offset electrical signals each stored in the offset current value holding circuit (A1) 123a and the offset electrical signal stored in the offset current value holding circuit (A2) 123b is generated, and then it is transferred to the write control circuit A 122 (F223L). The write control circuit A 122 adjusts and outputs the write electrical signal to the word line WLm such that the current is equal to the sum of (i) the current $I_{LR}$ necessary to write the LR state into the write target cell 4a and (ii) the sneak current (($S_{offsetLR1}$ $S_{offsetLR2}$) 2) calculated from the offset electrical signals $S_{offsetLR1}$ and $S_{offsetLR2}$ (F224L: Processes L and M).

The write operation into the LR state is completed.

[HR Write Method]

An HR write method for writing the HR state into the memory cell according to the present variation can be realized by reversing the direction in which the current flows from the word line 2 to the bit line 3 in the method for writing the LR state into the memory cell, in other words, by switching the current flowing direction to the direction from the bit line 3 to the word line 2, and by replacing $V_{LR}$ with $V_{HR}$ and $I_{LR}$ with $I_{HR}$.

In the present variation, due to two offset current value holding circuits: the offset current value holding circuit (A1) 123a and the offset current value holding circuit (A2) 123b, two sneak currents can be detected by the offset current detection cell 5 connected to the bit line 3 and the word line 2 that are the same as the bit line 3 and the word line 2 connected to the write target cell 5. From the average offset electrical signal obtained by averaging the two detected sneak currents and converting the detected two sneak currents into an electrical signal, a write operation is performed on the memory cell 4 by compensating the electrical signal with the sneak current amount, with the result that it is possible to reduce the problem that the write operation is unstable. With this, an effect can be obtained in which the stability of the write operation is improved.

It is to be noted that also in the present embodiment, the structure of the nonvolatile semiconductor memory device 2000a, for example, is acceptable in which the current sensing circuit A/write control circuit B (not illustrated) having the function of the current sensing circuit and the function of the write control circuit is connected to the bit line 3, the current sensing circuit B/write control circuit A (not illustrated) having the function of the current sensing circuit and the function of the write control circuit is connected to the word line 2, and in which when one of them is used as the current sensing circuit, the other is used as the write control circuit.

Embodiment 3

Device Structure

FIG. 19 is a diagram showing an example of the structure of a nonvolatile semiconductor memory device 3000 according to Embodiment 3 of the present invention.

In the nonvolatile semiconductor memory device 3000 according to the present embodiment, particular bit lines are set as offset current detection bit lines 303, and the offset current detection cells 5a are provided at each of the offset current detection bit lines 303. Each of the offset current detection bit lines 303 is provided with the offset current detection cells 5a and the memory cells 4. The offset current detection cell 5a and the memory cell 4 are provided at each of the offset current detection bit lines 303, and the offset current detection cell 5a and the memory cells 4 provided at each of the offset current detection bit lines 303 are arranged such that a single offset current detection cell 5a is provided for each of the word lines 2. Furthermore, the total number of the offset current detection cells 5a provided at the offset current detection bit line 303 is the same for all the offset current detection bit lines 303.

The structures of the memory cell 4 and the offset current detection cell 5a may have the same structures as those described in Embodiment 1. Furthermore, the offset detection bit lines 303 each have the same structure as that of the other bit lines 3.

By providing the offset current detection cells 5a collectively in the specified offset current detection bit lines 303, it is possible to clearly separate (i) the bit lines (offset current detection bit lines 303) which are used to detect the current $I_{offsetLR}$ and the current $I_{offsetHR}$ from (ii) the bit lines 3 which are used to actually write the LR state and HR state into the memory cells 4, and it is therefore also possible to completely separate the switches which are selected by the bit line selection circuit 311 into (i) those for detecting the current $I_{offsetLR}$ and the current $I_{offsetHR}$ and (ii) those for actually writing into the memory cell 4.

In the case where the offset current detection cells 5 are arranged over the whole cross-point cell array 1 as described in Embodiment 2, the bit line selection circuit 311 needs to be designed such that a single bit line is selected from among all the bit lines 3 according to the write target cell 4a.

In this regard, with the structure in this embodiment, a single bit line is selected from among a small number of offset current detection bit lines 303, which produces an effect of facilitating the designing of a circuit (not shown) which selects a switch in the bit line selection circuit 311.

The nonvolatile semiconductor memory device 3000 according to Embodiment 3 of the present invention includes, as shown in FIG. 19: the word lines 2 formed in parallel to the first direction and in stripe; the bit lines 3 and offset current detection bit lines 303 formed in stripe in the direction (the second direction) in which the bit lines 3 and offset current detection bit lines 303 cross the word lines 2; and the cross-point cell array 301 formed at the cross-points, in a planar view, of the word lines 2, the bit lines 3, and the offset current detection bit lines 303, and between (i) the word lines 2 and (ii) the bit lines 3 and the offset current detection bit lines 303.

Furthermore, the cross-point cell array 301 includes a plurality of the memory cells 4 and a plurality of the offset current detection cells 5a. Moreover, the offset current detection cells 5a are arranged within the cross-point cell array 301 in such a manner that (i) each of the offset current detection cells 5a is connected to one of the offset current detection bit lines 303 and (ii) the offset current detection cells 5a are connected one-to-one with the word lines 2.

It is to be noted that although the offset current detection bit lines 303 are collectively provided next to the bit lines 3 in the nonvolatile semiconductor memory device 3000 shown in FIG. 19, the arrangement of the offset detection bit lines 303 is not limited thereto, and the offset detection bit lines 303 may be dispersed so that one or more offset current detection bit lines 303 are provided between one and another of the bit lines 3. Furthermore, although the offset current detection cells 5a are arranged so as to alternate with the memory cells 4 along the offset current detection bit lines 303, the arrangement of the offset current detection cells 5a is not limited thereto and may be other arrangement as long as it meets the above conditions (i) and (ii). Furthermore, the case where the number of offset current detection bit lines 303 is two is shown. Although this is desirable in that the percentage of the memory cells in the cross-point cell array 301 is highest, the number of offset current detection bit lines 303 may be two or more when there is a demand for a higher current detection sensitivity as will be described later.

The nonvolatile semiconductor memory device 3000 shown in FIG. 19 further includes a word line selection circuit 310 and a bit line selection circuit 311. The word line selection circuit 310 is connected to the word lines 2 and selects one of the word lines 2 to connect only the selected one of the word lines to the write control circuit 322 while leaving the other word lines in the disconnected state. The bit line selection circuit 311 is connected to the bit lines 3 and selects one of the bit lines 3 to connect only the selected one to the current sensing circuit 321 while leaving the other bit lines 3 in the disconnected state. The unselected word lines 2 and bit lines 3 may be given with a voltage that turns off the switching element.

The write control circuit 322 serves as a variable voltage source which generates a constant potential in a direction in which a current is caused to flow from the word line 2 to the bit line 3 (or the offset current detection bit lines 303) as necessary (to be described later), or as a variable pulse current source for causing a pulse current in which a peak current is constant from the word line 2 to the bit line 3 (or the offset current detection bit lines 303).

The current sensing circuit 321 outputs the electrical signal that corresponds to the magnitude of the current flowing into from the bit lines 3 (or the offset current detection bit lines 303) to the offset current value holding circuit 323 and stores the electrical signal in the offset current value holding circuit 323. The offset current value holding circuit 323 has a function of generating the signal that corresponds to double the stored signal and outputting it to the write control circuit 322.

[LR Write Method]

Next, with reference to FIGS. 20 and 21, a write method for writing the LR state into the memory cell 4 in the nonvolatile semiconductor memory device according to the present embodiment will be described.

FIGS. 20 and 21 are each a diagram for explaining the write method in a low resistance state for the nonvolatile semiconductor memory device 3000a according to the present embodiment.

First, an example of the structure of the nonvolatile semiconductor memory device 3000a for use in the LR write will be described. The structure of the nonvolatile semiconductor memory device 3000a has the same structure as the structure of the nonvolatile semiconductor memory device 3000 shown in FIG. 19.

In other words, as shown in FIGS. 20 and 21, the nonvolatile semiconductor memory device 3000a, as similarly to the nonvolatile semiconductor memory device 3000 shown in FIG. 19, includes the cross-point cell array 301, the word lines 2, the bit lines 3, the offset current detection bit lines 303, and the word line selection circuit 310, and the bit line selection circuit 311.

Moreover, the nonvolatile semiconductor memory device 3000a includes: the write control circuit A 322a which is connected to the selected word line 2 via the word line selection circuit 310 and outputs a write electrical signal to the word line 2 selected by the word line selection circuit 310; the current sensing circuit A 321a which is connected to the bit lines 3 (or the offset current detection bit lines 303) via the bit line selection circuit 311, detects the sneak current flowing through the bit line 3 selected by the bit line selection circuit 311 (or the offset current detection bit lines 303), and converts it into the offset electrical signal that is an electrical signal that corresponds to the magnitude of the sneak current; and the offset current value holding circuit A 323a which stores the offset electrical signal.

The write control circuit A 322a serves as a variable voltage source which generates a constant potential in a direction in which a current is caused to flow from the word line 2 to the bit line 3 (or the offset current detection bit lines 303) as necessary (to be described later), or as a variable pulse current source for causing a pulse current in which a peak current is constant from the word line 2 to the bit line 3 (or the offset current detection bit lines 303).

The current sensing circuit A 321a outputs the electrical signal that corresponds to the magnitude of the current flowing into from the bit lines 3 (or the offset current detection bit lines 303) to the offset current value holding circuit A 323a and stores the electrical signal in the offset current value holding circuit A 323a. The offset current value holding circuit A 323a has a function of generating the signal that corresponds to double the stored signal and outputting it to the write control circuit A 322a.

The following cites, as an example, the operation of writing the LR state into the write target cell 4a and describes a sequence thereof.

Next, as shown in FIG. 20, the word line selection circuit 310, by selecting the word line WLi connected to the write target cell 4a from among the word lines 2, connects the write target cell 4a to the write control circuit A 322a while leaving other word lines 2 in the disconnected state, for example. Next, the bit line selection circuit 311, by selecting the bit line BLj connected to the offset current detection cell 5a provided at the word line WLi from among the offset current detection bit lines 303, connects the offset current detection cell 5 to the current sensing circuit A 321a while leaving the other bit lines 3 in the disconnected state, for example. The unselected word lines 2 and bit lines 3 may be given with a voltage that turns off the switching element.

Next, by outputting a voltage from the write control circuit A 322a, a current is caused to flow from the word line WLi in a direction of the bit line BLj via the offset current detection cell 5 and the current sensing circuit A 321a detects the current $I_{offsetLR}$ in the bit line BLj at that time. At this time, the voltage outputted from the write control circuit A 322a is set such that the potential of the bit line BLj is higher than the potential of the word line WLi by the voltage $V_{LR}$. The $V_{LR}$ may be set on a memory cell array-by-memory cell array basis, and does not have to be changed for each of the memory cells.

Next, the current sensing circuit A 321a outputs the offset electrical signal $S_{offsetLR}$ that corresponds to the magnitude of the current $I_{offsetLR}$, and the offset electrical signal $S_{offsetLR}$ is stored in the offset current value holding circuit A 323a. The offset electrical signal $S_{offsetLR}$ outputted from the current sensing circuit A 321a may be an electrical signal that changes corresponding to the magnitude of current inputted into the current sensing circuit A 321a, and may be selected freely depending on which type of circuit is used for the offset current value holding circuit A 323a. For example, the amplitude of current or voltage, or the pulse width or pulse density of the pulsed current or voltage may be used.

Next, the voltage output of the write target control circuit A 322a is stopped. Next, as shown in FIG. 21, the bit line selection circuit 311, by selecting the bit line BLk connected to the write target cell 4a from among the bit lines 3, connects the write target cell 4a to the current sensing circuit A 321a while leaving the other bit lines 3 in the disconnected state, for example. At this time, the word line WLi connected to the write target cell 4a is already selected and connected to the write control circuit A 322a.

Next, the offset current value holding circuit A 323a generates the signal ($S_{offsetLR} \times 2$) that corresponds to double the electrical signal stored in the offset current value holding circuit A 323a, and outputs it to the write control circuit A 322a. The write control circuit A 322a outputs, to the word line WLi, the current ($I_{LR}+I_{offsetLR} \times 2$) equal to the sum of (i) the current $I_{LR}$ necessary to write the LR state into the write target cell 4a and (ii) the sneak current ($I_{offsetLR} \times 2$) calculated from the offset electrical signal ($S_{offsetLR} \times 2$). At this time, the write control circuit A 322a operates as a constant current source.

In the nonvolatile semiconductor memory device 3000a according to the present embodiment, to the offset current detection bit line 303, the offset current detection cells 5a the number of which is half the number of memory cells connected along the bit line are provided while the memory cells 4 each having the same structure as that of the memory cell 4 are provided for the remaining. No data is written into the memory cells 4 connected to this offset current detection bit line 303, and it is sufficient that they have "0" or "1" written. In other words, in the present embodiment, the current $I_{offsetLR}$ detected by the current sensing circuit A 321a when the offset current detection cell 5a is selected is approximately half the sneak current flowing when writing the LR state into the write target cell 4a ($I_{offsetLR} \approx$ sneak current/2). Since the offset current value holding circuit A 323a outputs, to the write control circuit A 322a, the signal double the offset electrical signal $S_{offsetLR}$ that corresponds to the magnitude of the current $I_{offsetLR}$, the output current of the write control circuit A 322a is controlled to ($I_{LR}+I_{offsetLR} \times 2$). Since ($I_{offsetLR} \times 2$) of the output current is approximately equal to the sneak current flowing when actually writing into the write target cell 4a, the current approximately equal to $I_{LR}$ flows through the write target memory cell 4a without the influence of the data stored in the cross-point cell array 301 and it is possible to perform a stable write operation.

[Flowchart of Write Operation of LR State]

FIG. 22 is a flowchart showing a sequence of writing the LR state into the write target cell 4a in the nonvolatile semiconductor memory device 3000a according to the present embodiment.

As described above, for writing the LR state into the write target cell 4a, it is necessary to detect in advance the sneak current by selecting the offset current detection cell 5 and to store the offset electrical signal $S_{offsetLR}$ in the offset current value holding circuit A 323a. Since the offset electrical signal $S_{offsetLR}$ dynamically changes depending on the data stored in the cross-point cell array 301, it is desirable that the offset electrical signal $S_{offsetLR}$ is detected for each of the write operations. However, when the size of the cross-point cell array 301 is sufficiently large and the change in sneak current is negligibly small, the step of detecting the offset electrical signal $S_{offsetLR}$ may be skipped by using the same offset electrical signal $S_{offsetLR}$ in the write operations of the LR state.

First, upon request of the write operation of the LR state into the memory cell (write target cell) 4a, the word line selection circuit 310 selects the word line WLi connected to the write target cell 4a for detecting the offset electrical signal $S_{offsetLR}$ (F311L: Process A).

Next, the bit line selection circuit 311 selects the bit line BLj connected to the offset current detection cell 5a provided at the word line WLi (F312L: Process A). Here, the order of F311L and F312L may be reversed.

Next, the voltage higher than the voltage of the bit line BLj by the voltage $V_{LR}$ is outputted from the write control circuit A 322a to the word line WLi, and the current sensing circuit A 321a detects the magnitude of the current flowing through the bit line BLj at this time (F313L: the first half of Process B).

Next, the current sensing circuit A 321a converts the detected magnitude of current into the offset electrical signal $S_{offsetLR}$ (F314L: the second half of Process B) and then it is stored in the offset current value holding circuit A 323a (F314L: Process C). Furthermore, after the voltage output is turned off for the write control circuit A 322a (F315L), the bit line selection circuit 311 selects the bit line BLk connected to the write target cell 4a (F316L).

Next, the offset current value holding circuit A 323a outputs the signal ($S_{offsetLR} \times 2$) which is double the offset electrical signal $S_{offsetLR}$ to the write control circuit A 322a (F318L: Process D). The write control circuit A 322a adjusts and outputs the write electrical signal to the word line WLi such that the current outputted from the write control circuit A 322a is the current ($I_{SR}+I_{offsetLR} \times 2$) equal to the sum of (i) the current $I_{LR}$ necessary to write the LR state into the write target cell 4a and (ii) the sneak current ($I_{offsetLR} \times 2$) calculated from the offset electrical signal ($S_{offsetLR} \times 2$). (F317L: Process L).

The write operation of the LR state is completed.

[HR Write Method]

An HR method for writing the HR state into the memory cell according to the present variation can be realized by reversing the current flowing direction from the word line 2 to the bit line 3 in the LR method for writing the LR state into the memory cell, in other words, by switching the current flowing direction to the direction from the bit line 3 to the word line 2, and by replacing $V_{LR}$ with $V_{HR}$ and $I_{LR}$ with $I_{HR}$.

Although the above present embodiment describes an operation of the nonvolatile semiconductor memory devices 3000 and 3000a with two offset current detection bit lines 303 to each of which the offset current detection cells 5a the number of which is half the number of memory cells provided along the bit lines are connected, the present invention is not limited thereto.

In a more extended expression, where the number of the offset current detection bit lines 303 is N and the number of the word lines 2 included in the cross-point cell array 301 is M, the number of the offset current detection cells 5a provided at the offset current detection bit lines 303 may be (M/N). In this case, in the nonvolatile semiconductor memory device 3000a shown in FIG. 20, the signal outputted from the offset current value holding circuit A 323a to the write control circuit A 322a is (M/(M−(M/N))) times the offset electrical signal stored in the offset current value holding circuit A 323a. With this, the write control circuit A 322a adjusts and outputs the write electrical signal to the word line WLi such that the current outputted from the write control circuit A 322a is the current ($I_{LR}+I_{offsetLR} \times (M-(M/N))$) equal to the sum of (i) the current $I_{LR}$ necessary to write the LR state into the write target cell 4a and (ii) the sneak current ($I_{offsetLR} \times (M-(M/N))$) calculated from the offset electrical signal ($S_{offsetLR} \times (M/M-(M/N))$).

It is to be noted that in the example of FIG. 20 in the above described Embodiment 3, since the number M of word lines is 6 and the number N of offset current detection bit lines is 2, the number of the offset current detection cells 5a is (M/N)=3 and the signal outputted from the offset current value holding circuit A 323a to the write control circuit A 322a is double, that is to say, (M/(M−M/N))=2, the offset electrical signal stored in the offset current value holding circuit A 323a. With this, the write control circuit A 322a outputs, to the word line WLi, the current ($I_{LR}$  $I_{offsetLR} \times (M/(M-(M/N)))=(I_{LR}+I_{offsetLR} \times 2)$) equal to the sum of (i) the current $I_{LR}$ necessary to write the LR state into the write target cell 4a and (ii) the sneak current ($I_{offsetLR} \times (M/(M-(M/N)))=(I_{offsetLR} \times 2)$ calculated from the offset electrical signal ($S_{offsetLR} \times (M/(M-(M/N)))$) ($S_{offsetLR} \times 2$).

When the number of the offset current detection bit lines 303 increases and the number of the offset current detection cells 5a provided per offset current detection bit line 303 decreases, the difference is smaller between (i) the current obtained by multiplying (M/(M−(M/N))) times the current detected by the offset current detection cell 5a and (ii) the sneak current flowing when the LR state and the HR state are actually written, with the result that it is possible to perform a more stable write operation.

When the number of the offset current detection bit lines increases and the number of the offset current detection cells 5a provided per offset current detection bit line decreases, the difference is smaller between (i) the current obtained by multiplying (M/(M−(M/N))) times the current detected by the offset current detection cell 5a and (ii) the sneak current flowing when the LR state and the HR state are actually written, with the result that it is possible to perform a more stable write operation.

Furthermore, although in the above described Embodiment 3, an example of the case where the offset current detection cells 5a are connected only to the particular offset current detection bit lines 303, the same or the like effects can be obtained even when particular word lines 2 are set as offset current detection word lines, and the offset current detection cells 5a are arranged within the cross-point cell array 301 in a manner that (i) each of the offset current detection cells 5a is connected to any of the offset current detection word lines and (ii) the offset current detection cells 5a are connected one-to-one with the bit lines 3.

In the present embodiment, when the offset current detection cell is selected, the bit line (or the word line) to be selected by the bit line selection circuit (word line selection circuit) can be limited to the offset current detection bit line (or the offset current detection word line), which produces an effect of facilitating the designing of a circuit which selects a switch in the bit line selection circuit (or the word line selection circuit).

Although a nonvolatile semiconductor memory device and a write method therefor according to the present invention have been described based on Embodiments 1 to 3 and the variation, the present invention is not limited to these embodiments and variation. The present invention includes, without departing from the principles and spirit thereof, an embodiment obtained by making various modifications that those skilled in the art could think of, to these embodiments and variation, or an embodiment obtained by a given combination of constituents in these embodiments and variation.

For example, the nonvolatile semiconductor memory device according to the present invention does not necessarily have to include the word line selection circuit and the bit line selection circuit, and may include at least a cross-point cell array. The cross-point cell array may be a structure in which (i) a memory cell including a memory element which operates as a memory and (ii) an offset current detection cell having a resistance value higher than the resistance value of the memory element in a high resistance state when the memory element operates as a memory are included.

Moreover, the nonvolatile semiconductor memory device according to the present invention does not necessarily have to hold a current sensing circuit and a write control circuit, separately, and may be a structure in which a circuit both having the current sensing circuit and the write control circuit is included. In other words, the described embodiments described a structure in which the current sensing circuit and the write control circuit used corresponding to the bit lines and the current sensing circuit and the write control circuit used corresponding to the word lines are provided. However, the current sensing circuit and the write control circuit used common to the word lines and the bit lines may be included.

Moreover, although a circuit for writing into the memory cell and a circuit which performs the initial breakdown are not explicitly described in the nonvolatile semiconductor memory device according to each of the above embodiments and variation, it goes without saying that such circuits may be provided.

INDUSTRIAL APPLICABILITY

The nonvolatile semiconductor memory device according to the present invention can solve the problem that the current flowing through the memory cell during a write operation is not constant due to the sneak current, which used to be an impediment to providing a nonvolatile semiconductor memory device with a cross-point structure that makes miniaturization and capacity increase possible, but is difficult to take a measure with a conventional device structure. The present invention is useful as a nonvolatile semiconductor memory device, for example, in various electronic devices such as digital home appliances, memory cards, mobile phones, and personal computers.

REFERENCE SIGNS LIST 1, 201, 301 Cross-point cell array
2 Word line
3 Bit line
4 Memory cell
4a Write target cell
5, 5a, 51, 52, 53, 54 Offset current detection cell
10, 310 Word line selection circuit
11, 311 Bit line selection circuit
21, 321 Current sensing circuit
21a, 121, 321a Current sensing circuit A
22, 322 Write control circuit
22a, 122, 322a Write control circuit A
23, 323 Offset current value holding circuit
23a, 123, 323a Offset current value holding circuit A
23b Offset current value holding circuit B
25 Current sensing circuit A/write control circuit B
26 Current sensing circuit B/write control circuit A
100, 501 interlayer dielectric
110 First via
111 Memory element
112 Second via
123a Offset current value holding circuit A1
123b Offset current value holding circuit A2
125 Offset current arithmetic circuit A
303 Offset current detection bit line
511 First electrode
512 Second electrode
513 Third electrode
521 Low density oxide layer
522 High density oxide layer
530 Semiconductor layer
570 Variable resistance element
571 Diode
572 Memory element
1000, 1000a, 1000c, 2000, 2000a, 3000, 3000a Nonvolatile semiconductor memory device

The invention claimed is:

1. A nonvolatile semiconductor memory device comprising:
   word lines formed in parallel in a first plane;
   bit lines formed in parallel in a second plane and three-dimensionally crossing the word lines, the second plane being parallel to the first plane;
   a cross-point cell array including cells each provided at a corresponding one of three-dimensional cross-points of the word lines and the bit lines;
   a word line selection circuit that selects a particular one of the word lines;
   a bit line selection circuit that selects a particular one of the bit lines;
   a write control circuit that is connected to the word lines via the word line selection circuit or to the bit lines via the bit line selection circuit and outputs a write electrical signal to the word line selected by the word line selection circuit or to the bit line selected by the bit line selection circuit; and
   a current sensing circuit that is connected to the bit lines via the bit line selection circuit or to the word lines via the word line selection circuit, the current sensing circuit detecting a current flowing through the bit line selected by the bit line selection circuit or the word line selected by the word line selection circuit and converting the current into an electrical signal that corresponds to a magnitude of the current,
   wherein the cells include:
   a memory cell including a memory element that operates as a memory by reversibly changing in resistance value between at least two states based on an electrical signal applied between a corresponding one of the word lines and a corresponding one of the bit lines; and
   an offset current detection cell having a resistance value that is, irrespective of the electrical signal applied between the corresponding one of the word lines and the corresponding one of the bit lines, higher than the resistance value of the memory element in a high resistance state in which the memory element operates as the memory, and wherein when (i) a current flowing when writing predetermined data into the memory cell by applying a first voltage having a predetermined polarity and a predetermined amplitude between the word line and the bit line connected to the memory cell is a first write current and (ii) a current flowing when the first voltage is applied between the word line and the bit line that are connected to the offset current detection cell is a sneak current, the write control circuit adjusts the write electrical signal for causing a second write current to flow through the memory cell, the second write current being a sum of the first write current and the sneak current.

2. The nonvolatile semiconductor memory device according to claim 1, wherein the sneak current is a sum of a current flowing through a plurality of the memory cells except for the offset current detection cell.

3. The nonvolatile semiconductor memory device according to claim 1, wherein the current sensing circuit converts the sneak current into an offset electrical signal, and the nonvolatile semiconductor memory device further comprises an offset current value holding circuit for storing the offset electrical signal resulting from the conversion by the current sensing circuit.

4. The nonvolatile semiconductor memory device according to claim 3, wherein the write control circuit includes:

a write control circuit A for outputting a first write electrical signal as the write electrical signal to the word line selected by the word line selection circuit; and a write control circuit B for outputting a second write electrical signal as the write electrical signal to the bit line selected by the bit line selection circuit.

5. The nonvolatile semiconductor memory device according to claim 3, wherein the current sensing circuit includes:

a current sensing circuit A that detects a sneak current flowing out from the bit line selected by the bit line selection circuit, and converts the detected sneak current, as the offset electrical signal, into a first offset electrical signal that is an electrical signal that corresponds to a magnitude of the sneak current; and a current sensing circuit B that detects a sneak current flowing out from the word line selected by the word line selection circuit, and converts the detected sneak current, as the offset electrical signal, into a second offset electrical signal that is an electrical signal that corresponds to a magnitude of the sneak current.

6. The nonvolatile semiconductor memory device according to claim 5, wherein the offset current value holding circuit includes:

an offset current value holding circuit A for storing the first offset electrical signal resulting from the conversion by the current sensing circuit A; and an offset current value holding circuit B for storing the second offset electrical signal resulting from the conversion by the current sensing circuit B.

7. The nonvolatile semiconductor memory device according to claim 1, wherein the offset current detection cell includes offset current detection cells arranged in the cross-point cell array in a one-to-one correspondence with the word lines and in a one-to-one correspondence with the bit lines, and the offset current detection cell selected for detecting the current is the offset current detection cell provided at the word line or the bit line that is connected to a write target memory cell selected from the cross-point cell array.

8. The nonvolatile semiconductor memory device according to claim 3, wherein the offset current value holding circuit includes a first offset current value holding circuit and a second offset current value holding circuit for storing offset electrical signals different from each other, each of which is the offset electrical signal resulting from the conversion of the current sensing circuit, the nonvolatile semiconductor memory device further comprises an offset current arithmetic circuit that generates, by referring to the first offset electrical signal and the second offset electrical signal, an average offset electrical signal that corresponds to an average of the first offset electrical signal and the second offset electrical signal, the first offset electrical signal being stored in the first offset current value holding circuit, the second offset electrical signal being stored in the second offset current value holding circuit, and the write electrical signal is adjusted corresponding to the average offset electrical signal.

9. The nonvolatile semiconductor memory device according to claim 8, wherein the offset current value holding circuit comprises:

an offset current value holding circuit A for storing the first offset electrical signal resulting from the conversion by the current sensing circuit A; and an offset current value holding circuit B for storing the second offset electrical signal resulting from the conversion by the current sensing circuit B, the offset current arithmetic circuit comprises:

an offset current arithmetic circuit A that generates, by referring to the first offset electrical signal and the second offset electrical signal, an average offset electrical signal that corresponds to an average of the first offset electrical signal and the second offset electrical signal, the first offset electrical signal being stored in the first offset current value holding circuit, the second offset electrical signal being stored in the second offset current value holding circuit, the first offset current value holding circuit and the second offset current value holding circuit being of the offset current value holding circuit A; and an offset current arithmetic circuit B that generates, by referring to the first offset electrical signal and the second offset electrical signal, an average offset electrical signal that corresponds to an average of the first offset electrical signal and the second offset electrical signal, the first offset electrical signal being stored in the first offset current value holding circuit, the second offset electrical signal being stored in the second offset current value holding circuit, the first offset current value holding circuit and the second offset current value holding circuit being of the offset current value holding circuit B.

10. The nonvolatile semiconductor memory device according to claim 4, wherein the bit lines include bit lines each provided only with the memory cells, and a plurality of offset current detection bit lines each provided with the memory cells and the offset current detection cell, the offset current detection cell includes the offset current detection cells arranged in the cross-point cell array, the offset current detection cells being provided equal in number among all the offset current detection bit lines and being provided one in number in each of the word lines, and the offset current detection cell selected for detecting the current is the offset current detection cell provided at the word line connected to a write target memory cell selected from the cross-point cell array.

11. The nonvolatile semiconductor memory device according to claim 4, wherein the word lines include word lines each provided only with the memory cells, and a plurality of offset current detection bit lines each provided with the memory cells and the offset current detection cell, the offset current detection cell includes offset current detection cells arranged in the cross-point cell array, the offset current detection cells being provided equal in number among all the offset current detection bit lines and being provided one in number in each of the word lines, and the offset current detection cell selected for detecting the current is the offset current detection cell provided at the bit line connected to a write target memory cell selected from the cross-point cell array.

12. The nonvolatile semiconductor memory device according to claim 4, wherein where the write control circuit A (i) sets, by selecting the offset current detection cell and outputting a first voltage from the write control circuit A, a potential of a word line connected to the offset current detection cell to be higher than a potential of a bit line connected to the offset current detection cell, (ii) determines, as $I_{offsetLR}$, a current flowing through the bit line connected to the offset current detection cell, and (iii) determines, as $I_{LR}$, a current necessary to flow through the memory element in a direction from the word line to the bit line for changing a resistance value of the memory element included in the write target memory cell, the write control circuit A adjusts, for changing the resistance value of the memory element included in the write target memory cell, the write electrical signal for allowing a current outputted from the write control circuit A to be $(I_{LR}+I_{offsetLR})$.

13. The nonvolatile semiconductor memory device according to claim 4, wherein where the write control circuit B (i) sets, by selecting the offset current detection cell and outputting a second voltage from the write control circuit B, a potential of a bit line connected to the offset current detection cell to be higher than a potential of a word line connected to the offset current detection cell, (ii) determines, as $I_{offsetHR}$, a current flowing out from the word line connected to the offset current detection cell, and (iii) determines, as $I_{HR}$, a current necessary to flow through the memory element in a direction from the bit line to the word line for changing a resistance value of the memory element included in the write target memory cell, the write control circuit B adjusts, for changing the resistance value of the memory element included in the write target memory cell, the write electrical signal for allowing a current outputted from the write control circuit B to be $(I_{HR}+I_{offsetHR})$.

14. The nonvolatile semiconductor memory device according to claim 4, wherein where the write control circuit A (i) sets, by selecting the offset current detection cell connected to a first bit line and outputting a first voltage from the write control circuit A, a potential of a first word line connected to the offset current detection cell connected to the first bit line to be higher than a potential of the first bit line, (ii) determines, as $I_{offsetLR1}$, a current flowing out from the first bit line, (iii) sets, by selecting the offset current detection cell connected to a second bit line and outputting the first voltage from the write control circuit A, a potential of a second word line connected to the offset current detection cell connected to the second bit line to be higher than a potential of the second bit line, (iv) determines, as $I_{offsetLR2}$, a current flowing out from the second bit line, and (v) determines, as $I_{LR}$, a current necessary to flow through the memory element cell in a direction from the word line to the bit line for changing a resistance value of the memory element included in the write target memory cell, the write control circuit A adjusts, for changing the resistance value of the memory cell included in the write target memory cell, the write electrical signal for allowing a current outputted from the write control circuit A to be $(I_{LR}+(I_{offsetLR1}+I_{offsetLR2})/2)$.

15. The nonvolatile semiconductor memory device according to claim 4, wherein where the write control circuit B (i) sets, by selecting the offset current detection cell connected to a first word line and outputting a second voltage from the write control cell B, a potential of a first bit line connected to the offset current detection cell connected to the first word line to be higher than a potential of the first word line, (ii) determines, as $I_{offsetHR1}$, a current flowing out from the first word line, (iii) sets, by selecting the offset current detection cell connected to a second word line and outputting the second voltage from the write control cell B, a potential of a second bit line connected to the offset current detection cell connected to the second word line to be higher than a potential of the second word line, (iv) determines, as $I_{offsetHR2}$, a current flowing out from the second word line, and (v) determines, as $I_{HR}$, a current necessary to flow through the memory element in a direction from the bit line to the word line for changing a resistance value of the memory element included in the write target memory cell, the write control circuit B adjusts, for changing the resistance value of the memory element included in the write target memory cell, the write electrical signal for allowing a current outputted from the write control circuit B to be $(I_{HR}+(I_{offsetHR1}+I_{offsetHR2})/2)$.

16. The nonvolatile semiconductor memory device according to claim 10, wherein where the write control circuit A (i) sets, by selecting the offset current detection cell and outputting a first voltage from the write control circuit A, a potential of a word line connected to the offset current detection cell to be higher than a potential of the offset current detection bit line connected to the offset current detection cell, (ii) determines, as $I_{offsetLR}$, a current flowing out from the offset current detection bit line connected to the offset current detection cell, and (iii) determines, as $I_{LR}$, a current necessary to flow through the memory element in a direction from the word line to the bit line for changing a resistance value of the memory element included in the memory cell, the write control circuit A adjusts, for changing the resistance value of the memory element included in the memory cell, the write electrical signal for allowing a current outputted from the write control circuit A to be $(I_{LR}+I_{offsetLR} \times M/(M-M/N)))$, the N being a total number of the offset current detection bit lines, the M being a total number of cells connected to a single one of the offset current detection bit lines.

17. The nonvolatile semiconductor memory device according to claim 10,
wherein where the write control circuit B (i) sets, by selecting the offset current detection cell and outputting a second voltage from the write control circuit B, a potential of an offset current detection bit line connected to the offset current detection cell to be higher than a potential of the word line connected to the offset current detection cell, (ii) determines, as $I_{offsetHR}$, a current flowing out from the word line connected to the offset current detection cell, and (iii) determines, as $I_{HR}$, a current necessary to flow through the memory element in a direction from the bit line to the word line for changing a resistance value of the memory element included in the memory cell,
the write control circuit B adjusts, for changing the resistance value of the memory element included in the memory cell, the write electrical signal for allowing a current outputted from the write control circuit B to be $(I_{HR}+I_{offsetHR} \times M/(M-(M/N)))$, the N being a total number of the offset current detection bit lines, the M being a total number of cells provided at a single one of the offset current detection bit lines.

18. The nonvolatile semiconductor memory device according to claim 11,
wherein where the write control circuit A (i) sets, by selecting the offset current detection cell and outputting a first voltage from the write control circuit A, a potential of the offset current detection word line connected to the offset current detection cell to be higher than a potential of the bit line connected to the offset current detection cell, (ii) determines, as $I_{offsetLR}$, a current flowing out from the offset current detection bit line connected to the offset current detection cell, and (iii) determines, as $I_{LR}$, a current necessary to flow through the memory element in a direction from the word line to the bit line for changing a resistance value of the memory element included in the memory cell,
the write control circuit A adjusts, for changing the resistance value of the memory element included in the memory cell, the write electrical signal for allowing a current outputted from the write control circuit A to be $(I_{LR}+I_{offsetLR} \times M/(M-M/N)))$, the N being a total number of the offset current detection word lines, the M being a total number of cells provided at a single one of the offset current detection word lines.

19. The nonvolatile semiconductor memory device according to claim 11,
wherein where the write control circuit B (i) sets, by selecting the offset current detection cell and outputting a second voltage from the write control circuit B, a potential of a bit line connected to the offset current detection cell to be higher than a potential of the offset current detection word line connected to the offset current detection cell, (ii) determines, as $I_{offsetHR}$, a current flowing out from the word line connected to the offset current detection cell, and (iii) determines, as $I_{HR}$, a current necessary to flow through the memory element in a direction from the bit line to the word line for changing a resistance value of the memory element included in the memory cell,
the write control circuit B adjusts, for changing the resistance value of the memory element included in the memory cell, the write electrical signal for allowing a current outputted from the write control circuit B to be $(I_{HR}+I_{offsetHR} \times M/(M-(M/N)))$, the N being a total number of the offset current detection word lines, the M being a total number of cells provided at a single one of the offset current detection word lines.

20. The nonvolatile semiconductor memory device according to claim 12,
wherein a voltage between the selected bit line and the selected word line is a voltage less than or equal to a voltage necessary to change the memory element from a high resistance state to a low resistance state in a current-voltage property of the memory element.

21. The nonvolatile semiconductor memory device according to claim 13,
wherein a voltage between the selected word line and the selected bit line is a voltage greater than or equal to a voltage necessary to change the memory element from a low resistance state to a high resistance state in a current-voltage property of the memory element.

22. The nonvolatile semiconductor memory device according to claim 1,
wherein the memory cell comprises the memory element, a first via for electrically connecting the memory element with the word line, and a second via for electrically connecting the memory element with the bit line, and
the offset current detection cell has a structure in which at least one of the first via and the second via is removed from the memory cell.

23. The nonvolatile semiconductor memory device according to claim 1,
wherein the memory cell comprises the memory element, a first via for electrically connecting the memory element with the word line, and a second via for electrically connecting the memory element with the bit line, and
the offset current detection cell has a structure in which the memory element is removed from the memory cell, or a structure in which at least one of the first via and the second via, and the memory element are excluded from the memory cell.

24. The nonvolatile semiconductor memory device according to claim 1,
wherein the memory element includes a variable resistance memory element which has a layered structure including a first electrode, a variable resistance layer, and a second electrode,
the first electrode comprises any of tantalum nitride (TaN), titanium nitride (TiN), and tungsten (W),
the second electrode comprises any of platinum (Pt), iridium (Ir), and palladium (Pd), or an alloy including Pt, Ir, or Pd,
the variable resistance layer includes a high density oxide layer and a low density oxide layer that comprise at least one of an oxygen-deficient tantalum oxide film, an oxygen-deficient iron oxide film, an oxygen-deficient hafnium oxide film, and an oxygen-deficient zirconium oxide,
the high density oxide layer is less than the low density oxide layer in degree of oxygen deficiency,
the memory cell is a cell treated, after manufacture, with initial breakdown for causing the memory element to operate as the memory, and
the offset current detection cell is a cell which has the same structure as the memory cell and has not been treated with the initial breakdown after manufacture.

25. A write method for a nonvolatile semiconductor memory device, the write method comprising:
- a process F of selecting a first word line connected to a write target memory cell, and a first bit line connected to a first offset current detection cell provided at the first word line;
- a process G of applying a constant voltage between the selected first word line and the selected first bit line, detecting a first sneak current flowing out from the selected first word line or the selected first bit line by a current sensing circuit A, and converting, by the current sensing circuit A, the detected first sneak current into a first offset electrical signal that is an electrical signal that corresponds to a magnitude of the first sneak current;
- a process H of storing the first offset electrical signal in a first offset current value holding circuit;
- a process I of selecting a second bit line connected to the write target memory cell, and a second word line connected to a second offset current detection cell provided at the second bit line;
- a process J of applying, between the selected second word line and the selected second bit line, a voltage same as the voltage applied between the first word line and the first bit line selected in the process G, detecting, by a current sensing circuit A, a second sneak current flowing out from the second word line or the second bit line, and converting, by the current sensing circuit A, the detected second sneak current into a second offset electrical signal that is an electrical signal that corresponds to a magnitude of the second sneak current;
- a process K of storing the second offset electrical signal in a second offset current value holding circuit;
- a process L of generating, by referring to the first offset electrical signal and the second offset electrical signal, an average offset electrical signal that corresponds to an average of the first offset electrical signal stored in the first offset current value holding circuit and the second offset electrical signal stored in the second offset current value holding circuit;
- a process M of outputting, to a write control circuit A, a write electrical signal generated according to the average offset electrical signal; and
- a process N of adjusting, by the write control circuit A, the write electrical signal according to the average offset electrical signal.

* * * * *